(12) United States Patent
Ise et al.

(10) Patent No.: US 7,632,579 B2
(45) Date of Patent: Dec. 15, 2009

(54) LIGHT EMITTING ELEMENT AND AZOLE COMPOUND

(75) Inventors: Toshihiro Ise, Kanagawa (JP); Tatsuya Igarashi, Kanagawa (JP); Yousuke Miyashita, Kanagawa (JP); Hidetoshi Fujimura, Kanagawa (JP); Masayuki Mishima, Kanagawa (JP); Hisashi Okada, Kanagawa (JP); Qiu Xuepeng, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 103 days.

(21) Appl. No.: 11/188,660

(22) Filed: Jul. 26, 2005

(65) Prior Publication Data
US 2005/0260452 A1 Nov. 24, 2005

Related U.S. Application Data

(63) Continuation of application No. 09/905,946, filed on Jul. 17, 2001, now Pat. No. 6,962,755.

(30) Foreign Application Priority Data
Jul. 17, 2000 (JP) .............................. 2000-216339

(51) Int. Cl.
*H01L 51/54* (2006.01)
(52) U.S. Cl. ........................ 428/690; 428/917; 313/504; 313/506; 257/E51.044
(58) Field of Classification Search ....................... None
See application file for complete search history.

(56) References Cited

U.S. PATENT DOCUMENTS

| | | | |
|---|---|---|---|
| 5,391,681 A | 2/1995 | Mühlebach et al. | |
| 5,645,948 A | 7/1997 | Shi et al. | |
| 6,084,250 A | 7/2000 | Jüstel et al. | |
| 6,184,618 B1 | 2/2001 | Jüstel et al. | |
| 6,458,475 B1 * | 10/2002 | Adachi et al. | 428/690 |
| 6,670,645 B2 | 12/2003 | Grushin et al. | |
| 6,911,271 B1 * | 6/2005 | Lamansky et al. | 428/690 |
| 6,962,755 B2 * | 11/2005 | Ise et al. | 428/690 |
| 2002/0024293 A1 | 2/2002 | Igarashi et al. | |
| 2002/0121638 A1 | 9/2002 | Grushin et al. | |
| 2002/0182441 A1 | 12/2002 | Lamansky et al. | |
| 2002/0197511 A1 | 12/2002 | D'Andrade et al. | |

FOREIGN PATENT DOCUMENTS

| | | |
|---|---|---|
| EP | 0 387 715 A2 | 9/1990 |
| EP | 0 825 804 A2 | 2/1998 |
| WO | WO 99/20081 A2 | 4/1999 |
| WO | WO 00/57676 A1 | 9/2000 |
| WO | WO 00/70655 A2 | 11/2000 |
| WO | WO 01/41512 A1 | 6/2001 |

OTHER PUBLICATIONS

Maria D S M et al. "Aromatic propellenes. Part 10. Conformational study of hexa(imidazol-1-yl)benzene and hexakis (2-methylimidazol-1-yl)benzene by means of NMR and AM1 calculations" *Journal of Molecular Structure*, vol. 478, 1999, pp. 285-294, XP002194812.

Cheng L F et al. "Photoemission study of a new electroluminescent material: trimer of N-arylbenzimidazoles (TPBI)" Displays, vol. 21, 2000, pp. 51-54 XP002194813.

M.A. Baldo, "Very high-efficiency green organic light-emitting devices based on electrophosphorescenee" Applied Physics Letters, vol. 75, No. 1, Jul. 5, 1999.

Mauro Maestri, et al. "Photochemistry and Luminescence ofCyclometallated Complexes" Advances in Photochemistry, vol. 17, 1992, pp. 1-68.

Peter I. Djurovich, et al., "Ir(III) Cyclometalated Complexes as Efficient Phosphoresent Emitters in Polymer Blend and Organic LED's" Polymer Preprints 2000, 41 (1), 770-771.

W. Kowalsky, et al. "Organic Light Emitting Diodes", publication dated Apr. 21, 1996 by XXP0000634526; pp. 450-453.

Viktor Milata et al., "2,4,6-Tris(azol-1y1)-1,3,5-Triazines: A New class of Multidentate Ligands", Heterocycles 55(5), May 1, 2001, pp. 905-924.

ZCAPLUS 1998: 699652; abstract for Pilar Comago et al., "Aromatic propellenes, Part 9. synthesis and conformational study of hexakis(benzimidazol-1-yl)benzene", ACH-Models in Chemistry 135(4), 1998, pp. 475-483.

Chihaya Adachi et al, "Endothermic energy transfer: A mechanism for generating very efficient high- energy phosphorscent emission in organic materials", Applied Physics Letters 79(13), Sep. 24, 2001, pp. 2082-2084.

\* cited by examiner

*Primary Examiner*—Marie R. Yamnitzky
(74) *Attorney, Agent, or Firm*—Sughrue Mion, PLLC

(57) ABSTRACT

A light emitting element comprising at least a light emitting layer containing a light emitting material and a host material and having a light emission maximum wavelength of 500 nm or less wherein the minimum excitation triplet energy level of the host material is higher than the minimum excitation triplet energy level of the light emitting material.

52 Claims, No Drawings

LIGHT EMITTING ELEMENT AND AZOLE COMPOUND

This is a continuation of application Ser. No. 09/905,946 filed Jul. 17, 2001, now U.S. Pat. No. 6,962,755; the entire disclosure of the prior application is hereby incorporated by reference.

BACKGROUND OF THE INVENTION

1. Field of the Invention

The present invention relates to a light emitting element and an azole compound used therefore, and, more particularly, to a light emitting element which can be utilized in a wide range of fields such as back lights, flat panel displays, illuminating light sources, display elements, electrophotographs, organic semiconductor lasers, recording light sources, exposure light sources, read light sources, beacons, signboards, interiors and optical communication devices.

2. Description of Related Art

Among various light emitting elements which are being studied and developed today, organic electroluminescence (EL) elements have been animatedly studied and developed in recent years because these organic electroluminescence elements enable high luminance emission to be obtained even when driven at low voltages. An organic EL element is generally structured of a light emitting layer and a pair of counter electrodes between which the light emitting layer is sandwiched, and makes use of emission from an exciton produced by recombination of an electron injected from a cathode with a hole injected from an anode in the light emitting layer.

As organic EL elements which emit high illuminance light at low voltages at present, those having a multilayer structure as revealed by Tang et al. (Applied Physics Letters, vol. 51, page 913, 1987) are known. This element can emit high illuminance green light by lamination of a material which doubles as an electron transporting material and a light emitting material with a hole transporting material, wherein the illuminance reaches several thousands cd/m² at a d.c. voltage of 6 to 7 V. However, further improvement in the illuminance and development of more highly efficient light emitting elements are desired, taking practical elements into consideration.

Recently, a light emitting element using an orthometalated complex of iridium (Ir(ppy)₃: tris-orthoiridiated complex with 2-phenylpyridine) as a light emitting material has been reported as a light emitting element which can emit with higher efficiency (Applied Physics Letters, vol. 75, page 4, 1999). The external quantum efficiency of this light emitting element is 8.3%, which exceeds 5%, which has been said to be the limit of levels of external quantum efficiency. The above orthometalated complex of iridium is limited to a green color light emitting element. Therefore, it is necessary to also develop elements which emit other color lights with high efficiency when the elements are applied in full color displays or white light emitting elements.

On the other hand, among organic light emitting elements, those which have attained high illuminance emission are elements with multilayered structure of organic materials by vacuum deposition. Production of elements by using a coating method is preferable in view of simplification of production steps, processability and increase in area. However, elements produced by a conventional coating method are inferior to elements produced by a deposition system in emission illuminance and luminance efficiency, giving rise to important problems concerning high illuminance and high luminance efficiency in view of the simplification of production steps, processability, area increase and the like.

SUMMARY OF THE INVENTION

The present invention has been made in view of the above various problems and it is an object of the present invention to provide a light emitting element which can emit light in the blue region with high luminance efficiency, and a light emitting element which can emit light of white of high color purity with high luminance efficiency.

In order to solve the above problems, the present invention provides a light emitting element comprising at least a light emitting layer containing a light emitting material and a host material and having a light emission maximum wavelength of 500 nm or less wherein the minimum excitation triplet energy level of the above host material is higher than the minimum excitation triplet energy level of the above light emitting material.

In the light emitting element of the present invention, for example, the above light emitting layer is held between a pair of electrodes and an electric field is applied to the electrodes whereby electrons are injected from a cathode and holes are injected from an anode. These electrons and holes are recombined with each other in the light emitting layer to create triplet excitons. When an exciton returns to the ground state, excess energy is emitted as light in the blue region. In the above light emitting element, the above light emitting layer is composed of a light emitting material (guest material) and a host material having a minimum excitation triplet energy level ($T_1$) higher than the $T_1$ of the light emitting material. This makes it possible to transfer the energy of the above triplet exciton to the $T_1$ level of the light emitting material efficiently, with the result that blue light can be emitted with high luminance efficiency.

The minimum excitation triplet energy level of the host material is preferably from 1.05 times to 1.38 times the minimum excitation triplet energy level of the light emitting material. Further, the minimum excitation triplet energy level of said host material is preferably from 68 kcal/mol (284.9 kJ/mol) to 90 kcal/mol (377.1 kJ/mol).

The host material is preferably a compound represented by the following general formula (I):

   General formula (I)

wherein $L^1$ represents a bivalent or more coupling group; $Q^1$ represents an aromatic hydrocarbon ring or an aromatic hetero ring; and $n^1$ represents a number of 2 or more, plural $Q^1$ may be the same or may be different from each other.

Also, the above object can be achieved by provision of a light emitting element comprising at least a light emitting layer containing a light emitting material and a host material and a layer which is disposed adjacent to the light emitting layer and contains an organic material wherein the minimum excitation triplet energy level of the above organic material is higher than the minimum excitation triplet energy level of each of materials which constitute the light emitting layer.

In the above light emitting element, for example, the above light emitting layer and the layer disposed adjacent to the light emitting layer are held between a pair of electrodes and an electric field is applied to the electrodes whereby electrons are injected from a cathode and holes are injected from an anode. These electrons and holes are recombined with each other in the light emitting layer to create triplet excitons. When the exciton returns to the ground state, excess energy is emitted as light in the blue region. In the above light emitting element, the layer disposed adjacent to the above light emitting layer is composed of an organic material having a minimum excitation triplet energy level ($T_1$) higher than the $T_1$ of each of the light emitting material and the host material. This makes it possible to prevent transfer of the energy of the above triplet exciton which is generated in the light emitting layer to the organic material which constitutes the layer disposed adjacent to the light emitting layer, with the result that blue light can be emitted with high luminance efficiency.

The minimum excitation triplet energy level of the organic material contained in the layer which is disposed adjacent to the light emitting layer is from 1.05 times to 1.38 times the minimum excitation triplet energy level of the light emitting material. Further, the minimum excitation triplet energy level of the organic material is 68 kcal/mol (284.9 kJ/mol) or more and 90 kcal/mol (377.1 kJ/mol) or less.

The organic material contained in the layer which is disposed adjacent to the light emitting layer is preferably a compound represented by the following general formula (II):

$L^2\text{-}(Q^2)_{n^2}$  General formula (II)

wherein $L^2$ represents a bivalent or more coupling group; $Q^2$ represents an aromatic hydrocarbon ring or an aromatic hetero ring; and $n^2$ represents a number of 2 or more, plural $Q^2$ may be the same or may be different from each other.

The azole compound represented by the following general formula (A) is preferably used as the organic material.

General formula (A)

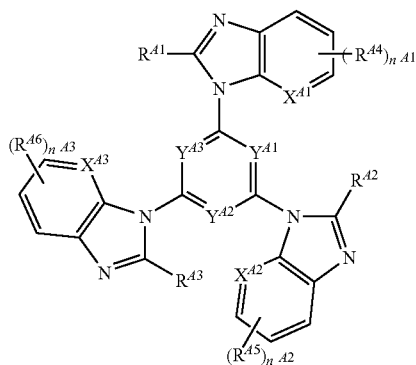

In the general formula (A), $R^{A1}$, $R^{A2}$, and $R^{A3}$ each represent a hydrogen atom or an aliphatic hydrocarbon group; $R^{A4}$, $R^{A5}$, and $R^{A6}$ each represent a substituent; $n^{A1}$, $n^{A2}$, and $n^{A3}$ each represents an integer of 0 to 3; $X^{A1}$, $X^{A2}$, and $X^{A3}$ each represent a nitrogen atom or C—$R^X$ ($R^X$ represents a hydrogen atom or a substituent); and $Y^{A1}$, $Y^{A2}$, and $Y^{A3}$ each represent a nitrogen atom or C—$R^{YX}$ ($R^{YX}$ represents a hydrogen atom or a substituent).

DETAILED DESCRIPTION OF THE PREFERRED EMBODIMENTS

The present invention will be hereinafter explained in detail.

A light emitting element according to the present invention comprises at least a light emitting layer containing a light emitting material. In EL elements, a light emitting layer is generally held between a pair of electrodes which are an anode and a cathode. Also, besides the light emitting layer, a hole injecting layer, a hole transporting layer, an electron injecting layer, an electron transporting layer, a protective layer and the like may be disposed between the pair of electrodes, and these layers may be provided with other functions respectively. The light emitting element of the present invention is preferably an organic light emitting element. The organic light emitting element referred to herein means an element in which a material which emits light is an organic compound.

The light emitting element of the present invention has a light emission maximum wavelength λmax of 500 nm or less, specifically this light emitting element is a blue light emitting element. The above λmax is preferably 495 nm or less and more preferably 490 nm or less in view of color purity.

However, the light emitting element of the present invention may emit light in any of regions other than the blue region, such as the ultraviolet region, green region, red region, and infrared region.

The light emitting element of the present invention preferably has a high luminance efficiency. External quantum efficiency of the light emitting element is 5% or more, preferably 7% or more, more preferably 10% or more, still more preferably 18% or more. Here, the external quantum efficiency means a value calculated from the following formula. Methods of calculating an external quantum efficiency include a method of calculating from the emission illuminance, emission spectrum, relative luminance efficiency curve and current density and a method of calculating the current density and the total number of emitted photons.

External quantum efficiency (%)=(Total number of emitted photons/Number of electrons injected into a light emitting element)×100

The light emitting element of the present invention is a light emitting element having a light emission maximum wavelength of 500 nm or less, in which the light emitting layer contains a host material and a light emitting material (guest material) and the $T_1$ level of the host material is higher than the $T_1$ level of the light emitting material.

The light emitting element according to the present invention preferably comprises a layer disposed adjacent to the light emitting layer, and the $T_1$ level of an organic material contained in the layer adjacent to the light emitting layer is higher than the $T_1$ level of each of the materials which constitute the light emitting layer. Examples of the layer adjacent to the light emitting layer include a hole injecting layer, hole transporting layer, electron injecting layer, electron transporting layer, hole blocking layer, and electron blocking layer. Examples of the organic material which is used in each layer include a hole injecting material, hole transporting material, electron injecting material, electron transporting material, hole blocking material and electron blocking material. In a case where two layers are disposed adjacent to the light emitting layer, both these layers are preferably formed of an organic material having a $T_1$ level higher than the $T_1$ level of the light emitting material.

Generally, the luminance efficiency of a light emitting element can be expressed by a product of an injection efficiency of a hole and an electron, a recombination efficiency of a hole and an electron, a generation efficiency of an exciton, an efficiency of transfer of excitation energy generated by the recombination to the light emitting material, and a luminous quantum efficiency of the light emitting material. When a material which emits light from a triplet exciton, is used as the light emitting material, the probability at which the exciton is generated by the recombination, is higher than that of a singlet exciton, thereby resulting in improvement of the luminance efficiency. Here, so long as the energy of a triplet exciton generated by the recombination can be efficiently transferred to the $T_1$ level of the light emitting material, the luminance efficiency further improves. In the light emitting element of the present invention, the $T_1$ level of the host material is made higher than the $T_1$ level of the light emitting material, thereby enabling efficient transfer of the energy of the triplet exciton to the $T_1$ level of the light emitting material, with the result that light is emitted with high luminance efficiency. In the light emitting element of the present invention, the $T_1$ level of the organic material constituting the layer disposed adjacent to the light emitting layer is made higher than the $T_1$ level of the light emitting material to thereby prevent the energy of the triplet exciton from transferring to the organic material constituting the layer adjacent to the light emitting layer, with the result that light is emitted with high luminance efficiency.

The $T_1$ level of each of the host material and the organic material contained in the layer which is disposed adjacent to the light emitting layer is preferably 1.05 times to 1.38 times the $T_1$ level of the light emitting material. Also, the $T_1$ level of each of the host material and the organic material is preferably from 68 kcal/mol (284.9 kJ/mol) to 90 kcal/mol (377.1 kJ/mol), more preferably from 69 kcal/mol (289.1 kJ/mol) to 85 kcal/mol (356.2 kJ/mol) and still more preferably 70 kcal/mol (293.3 kJ/mol) to 80 kcal/mol (335.2 kJ/mol).

When the light emitting element of the present invention has a layer which is formed of an organic material and disposed adjacent to the light emitting layer, preferably, the $T_1$ level of the organic material is also higher than the $T_1$ level of the light emitting material. A more preferable embodiment of the light emitting element of the present invention is a light emitting element in which the $T_1$ level of any organic material contained in any layer is higher than the $T_1$ level of the light emitting material.

The host material is preferably a compound represented by the following general formula (I), and the organic material which constitutes the layer adjacent to the light emitting layer is preferably a compound represented by the following general formula (II).

   General formula (I)

In the general formula (I), $L^1$ represents a bivalent or more coupling group, $Q^1$ represents an aromatic hydrocarbon ring or an aromatic hetero ring, and $n^1$ represent a number of 2 or more. Plural $Q^1$ may be the same or may be different from one another.

   General formula (II)

In the general formula (II), $L^2$ represents a bivalent or more coupling group, $Q^2$ represents an aromatic hydrocarbon ring or an aromatic hetero ring, and $n^2$ represent a number of 2 or more. Plural $Q^2$ may be the same or may be different from one another.

Next, the general formula (I) will be described. In the general formula (II), $L^2$, $Q^2$, and $n^2$ each has the same meaning as $L^1$, $Q^1$, and $n^1$ in the general formula (I), and a duplicate description thereof will be omitted.

$L^1$ represents a bivalent or more coupling group, preferably a coupling group comprised of carbon, silicon, nitrogen, boron, oxygen, sulfur, metal, and metal ion, more preferably a carbon atom, a nitrogen atom, a silicon atom, a boron atom, an oxygen atom, a sulfur atom, an aromatic hydrocarbon ring, and an aromatic hetero ring, and still more preferably a carbon atom, a silicon atom, an aromatic hydrocarbon ring, and an aromatic hetero ring. Specific examples of the coupling group represented by $L^1$ include the following.

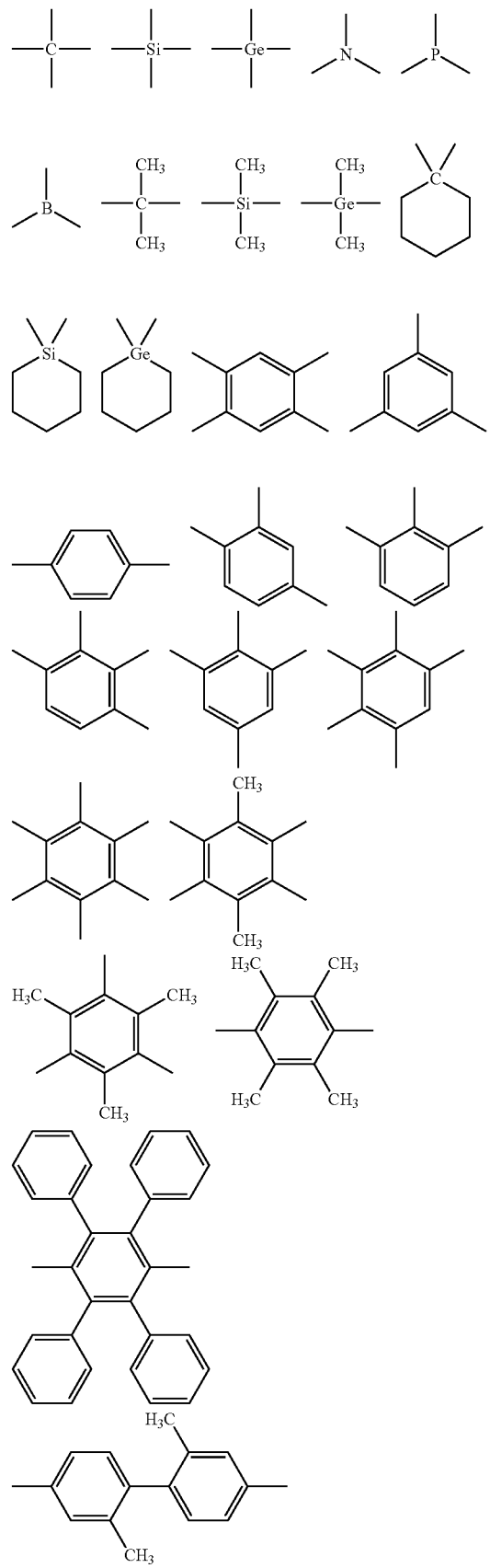

-continued
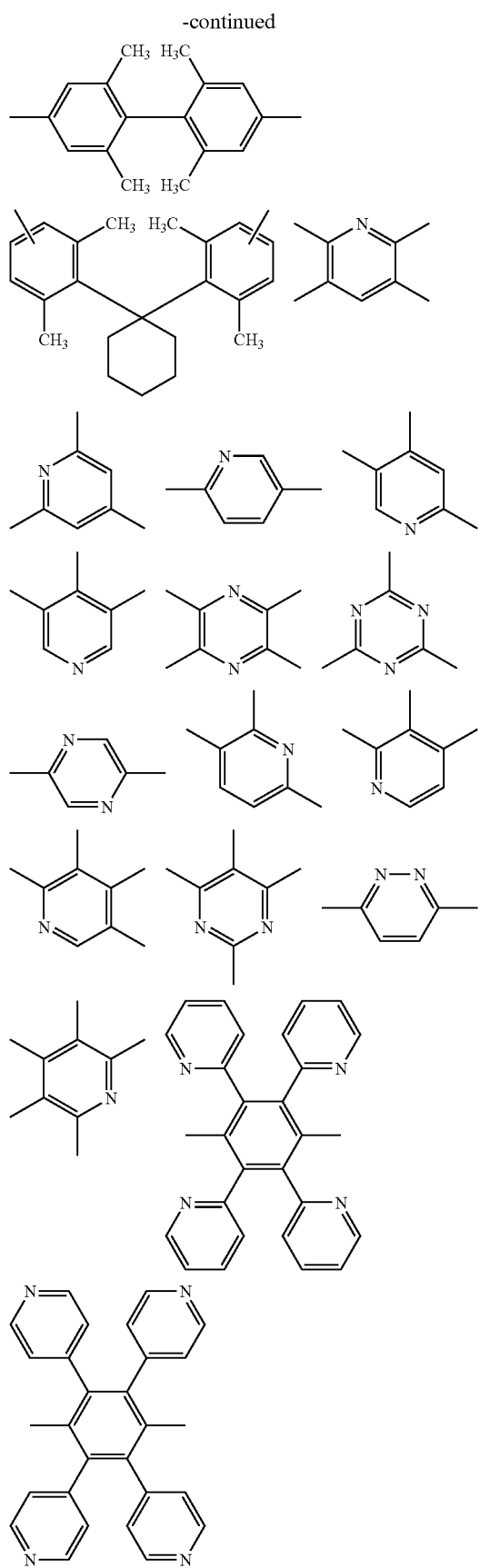
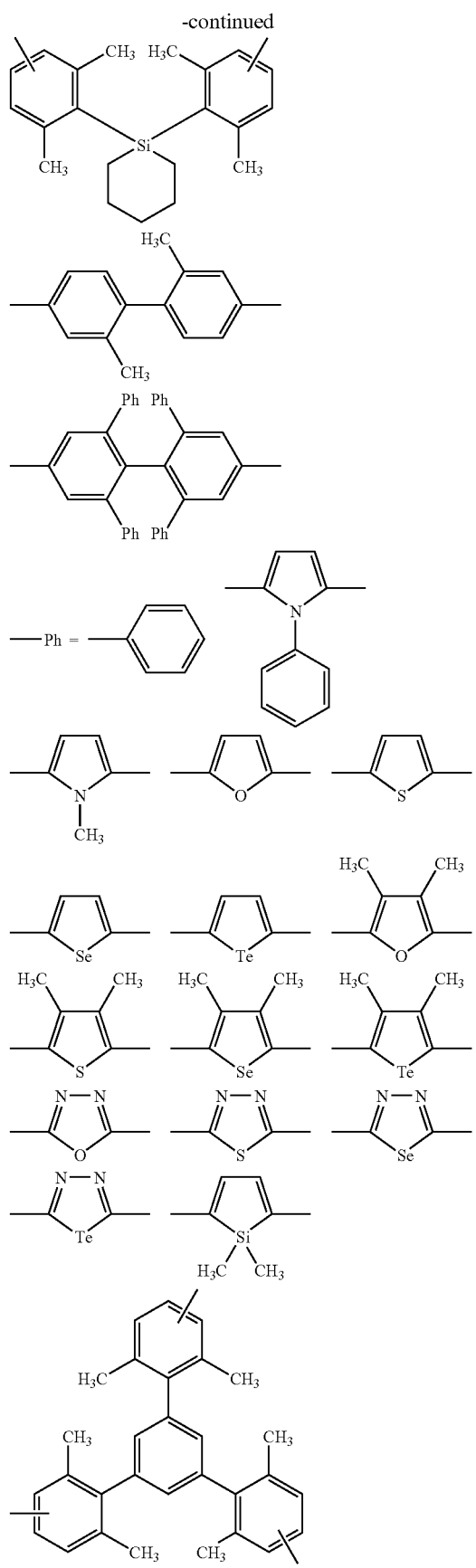

-continued

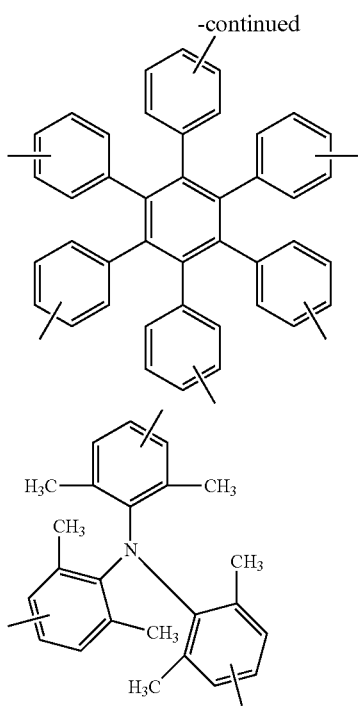

Al Zn Cu Fe Ir Ni Cd Au Pt Pd Os Re Ru Rh W Eu Sm Dy

In the general formula (I), $L^1$ may have a substituent. Examples of the substituent include an alkyl group (preferably having from 1 to 20 carbon atoms, more preferably having from 1 to 12 carbon atoms, and particularly preferably having from 1 to 8 carbon atoms, such as methyl, ethyl, n-propyl, isopropyl, n-butyl, sec-butyl, tert-butyl, n-octyl, cyclopropyl, cyclopentyl, cyclohexyl, trifluoromethyl, and trichloromethyl), an alkenyl group (preferably having from 2 to 20 carbon atoms, more preferably having from 2 to 6 carbon atoms, and particularly preferably having 2 carbon atoms, such as vinyl and the like), an alkynyl group (preferably having from 2 to 20 carbon atoms, more preferably having from 2 to 6 carbon atoms, and particularly preferably having 2 carbon atoms, such as ethynyl and the like), an aryl group (preferably having from 6 to 10 carbon atoms, and particularly preferably having 6 carbon atoms, such as phenyl and the like), an amino group (preferably having from 0 to 36 carbon atoms, more preferably having from 0 to 20 carbon atoms, and particularly preferably having from 0 to 12 carbon atoms, such as amino, methylamino, dimethylamino, ethylamino, diethylamino, phenylamino, diphenylamino, dibenzylamino, thienylamino, dithienylamino, pyridylamino, and dipyridylamino), an alkoxy group (preferably having from 1 to 20 carbon atoms, more preferably having from 1 to 12 carbon atoms, and particularly preferably having from 1 to 8 carbon atoms, such as methoxy, ethoxy, isopropoxy, n-butoxy, and t-butoxy), an aryloxy group (preferably having from 6 to 10 carbon atoms, and particularly preferably having 6 carbon atoms, such as phenoxy and the like), a heterocyclic oxy group (preferably having from 1 to 10 carbon atoms, more preferably having from 2 to 8 carbon atoms, and particularly preferably having from 4 to 5 carbon atoms, such as thienyloxy and pyridyloxy), a siloxy group (preferably having from 3 to 52 carbon atoms, more preferably having from 3 to 39 carbon atoms, still more preferably having from 3 to 33 carbon atoms, and particularly preferably having 3 to 27 carbon atoms, such as trimethylsiloxy, triethylsiloxy, and tri t-butylsiloxy), an acyl group (preferably having from 1 to 20 carbon atoms, more preferably having from 1 to 16 carbon atoms, and particularly preferably having from 1 to 12 carbon atoms, such as acetyl, benzoyl, formyl, pivaloyl, thenoyl and nicotinoyl), an alkoxycarbonyl group (preferably having from 2 to 20 carbon atoms, more preferably having from 2 to 16 carbon atoms, and particularly preferably having from 2 to 12 carbon atoms, such as methoxycarbonyl and ethoxycarbonyl), an aryloxycarbonyl group (preferably having from 7 to 20 carbon atoms, more preferably having from 7 to 16 carbon atoms, and particularly preferably having 7 carbon atoms, such as phenoxycarbonyl), a heterocyclic oxycarbonyl group (preferably having from 2 to 20 carbon atoms, more preferably having from 2 to 12 carbon atoms, and particularly preferably having from 5 to 6 carbon atoms, such as thienyloxycarbonyl and pyridyloxycarbonyl), an acyloxy group (preferably having from 2 to 20 carbon atoms, more preferably from 2 to 16 carbon atoms, and particularly preferably having from 2 to 12 carbon atoms, such as acetoxy, ethylcarbonyloxy, benzoyloxy, pivaloyloxy, thenoyloxy and nicotinoyloxy), an acylamino group (preferably having from 2 to 20 carbon atoms, more preferably having from 2 to 16 carbon atoms, and particularly preferably having from 2 to 10 carbon atoms, such as acetylamino, benzoylamino, thenoylamino and nicotinoylamino), an alkoxycarbonylamino group (preferably having from 2 to 20 carbon atoms, more preferably having from 2 to 16 carbon atoms, and particularly preferably having from 2 to 12 carbon atoms, such as methoxycarbonylamino), an aryloxycarbonylamino group (preferably having from 7 to 20 carbon atoms, more preferably having from 7 to 16 carbon atoms, and particularly preferably having from 7 to 12 carbon atoms, such as phenoxycarbonyl), a heterocyclic oxycarbonylamino group (preferably having from 6 to 21 carbon atoms, more preferably having from 2 to 15 carbon atoms, and particularly preferably having 5 to 11 carbon atoms, such as thienyloxycarbonylamino), a sulfonylamino group (preferably having from 1 to 20 carbon atoms, more preferably having from 1 to 16 carbon atoms, and particularly preferably having from 1 to 12 carbon atoms, such as methanesulfonylamino, benzenesulfonylamino and thiophenesulfonylamino), a sulfamoyl group (preferably having from 0 to 20 carbon atoms, more preferably having from 0 to 16 carbon atoms, and particularly preferably having from 0 to 12 carbon atoms, such as sulfamoyl, methylsulfamoyl, dimethylsulfamoyl, phenylsulfamoyl and thienylsulfamoyl), a carbamoyl group (preferably having from 1 to 20 carbon atoms, more preferably having from 1 to 16 carbon atoms, and particularly preferably having from 1 to 12 carbon atoms, such as carbamoyl, methylcarbamoyl, diethylcarbamoyl and phenylcarbamoyl), an alkylthio group (preferably having from 1 to 20 carbon atoms, more preferably having from 1 to 16 carbon atoms, and particularly preferably having from 1 to 12 carbon atoms, such as methylthio, ethylthio and n-butylthio), an arylthio group (preferably having from 6 to 26 carbon atoms, more preferably having from 6 to 20 carbon atoms, and particularly preferably having from 6 to 12 carbon atoms, such as phenylthio), a heterocyclic thio group (preferably having from 1 to 25 carbon atoms, more preferably having from 2 to 19 carbon atoms, and particularly preferably having from 5 to 11 carbon atoms, such as thienylthio and pyridylthio), a sulfonyl group (preferably having from 1 to 20 carbon atoms, more preferably having from 1 to 16 carbon atoms, and particularly preferably having from 1 to 12 carbon atoms, such as tosyl and mesyl), a sulfinyl group (preferably having from 1 to 20 carbon atoms, more preferably having from 1 to 16 carbon atoms, and particularly preferably having from 1 to 12 carbon atoms, such as methanesulfinyl and benzenesulfinyl), an ureido group (preferably having from 1 to 20 carbon atoms, more preferably having from 1 to 16 carbon atoms, and particularly preferably having from 1 to 12 carbon atoms, such as ureido, methylureido and phenylureido), a phosphoamide group (preferably having from 1 to 20 carbon atoms, more preferably having from 1 to 16 carbon atoms, particularly preferably having from 1 to 12 carbon atoms, such as diethylphosphoamide and phenylphosphoamide), a hydroxyl group, a mercapto group, a halogen atom (such as a fluorine atom, a chlorine atom, a bromine atom and an iodine atom), a cyano group, a sulfo group, a carboxyl group, a nitro group, a hydroxamic acid group, a sulfino group, a hydrazino group, an imino group, a heterocyclic group (preferably having from 1 to 20 carbon atoms, more preferably having from 1 to 16 carbon atoms, and particularly preferably having from 1 to 12 carbon atoms, examples of the hetero atom including a nitrogen atom, an oxygen atom and a sulfur atom, and examples of the heterocyclic group including imidazolyl, pyridyl, piperidyl, morphorino, furyl, oxazolyl, thiazolyl, thienyl, benzoxazolyl, benzothiazolyl, benzimidazolyl, purinyl, pyrazinyl, pyrimidinyl, pyridazinyl, triazinyl, thiadiazolyl, oxadiazolyl, and selenienyl, the position of substitution may be arbitrarily set), and a silyl group (preferably having from 3 to 40 carbon atoms, more preferably having from 3 to 30 carbon atoms, and particularly preferably having from 3 to 20 carbon atoms, such as trimethylsilyl and triphenylsilyl). These substituents may further be substituted or may be condensed to other rings. Further, if there are two or more of substituents, these substituents may be the same or different from each other, or may be combined with each other to form a cyclic structure. The substituent is preferably an alkyl group, an aryl group, an acyl group, an alkoxy group, an aryloxy group, an alkylthio group, an arylthio group, an alkoxycarbonyl group, an aryloxycarbonyl group, a halogen atom, a hydroxy group, and a heterocyclic group, more preferably an alkyl group, an aryl group, a halogen atom, and a heterocyclic group, and still more preferably an alkyl group and a halogen group.

$Q^1$ in the general formula (I) represents an aromatic hydrocarbon ring or an aromatic hetero ring. An example of the aromatic hydrocarbon ring represented by $Q^1$ is a benzene ring. Examples of the aromatic hetero ring represented by $Q^1$ include a pyridine ring, a pyrazine ring, a pyrimidine ring, a pyridazine ring, a triazine ring, an oxazole ring, a thiazole ring, an imidazole ring, an oxadiazole ring, a thiadiazole ring, a triazole ring, a tetrazole ring, a furan ring, a thiophene ring, a pyrrole ring, an indole ring, a benzimidazole, and an imidazopyridine ring. $Q^1$ is preferably a benzene ring, a pyridine ring, a pyrimidine ring, a pyrazine ring, a triazine ring, a thiadiazole ring, an oxadiazole ring, an imidazole ring, an indole ring, a benzimidazole ring and an imidazopyridine ring, more preferably a benzene ring, a pyridine ring, a triazine ring, a thiadiazole ring, an oxazole ring, a thiazole ring, an imidazole ring, a benzimidazole ring, and an imidazopyridine ring, and still more preferably a benzene ring, a pyridine ring, a benzimidazole ring and an imidazopyridine ring.

The aromatic hydrocarbon ring or aromatic hetero ring represented by $Q^1$ may have a substituent. As the substituent, any of the examples of the substituent of $L^1$ can be applied. The substituent of $Q^1$ is preferably a alkyl group, an aryl group, a halogen atom, and a heterocyclic group, and more preferably an alkyl group and a halogen atom.

$n^1$ in the general formula (I) represents a number of 2 or more, preferably 2 to 15, more preferably 2 to 6, and still more preferably 3 to 6.

Among the compounds represented by the general formula (I), compounds represented by the following general formulae (A-I), (B-I), (C-I), and (D-I) are preferred.

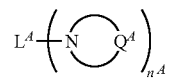

General formula (A-I)

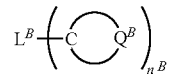

General formula (B-I)

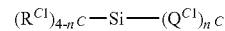

General formula (C-I)

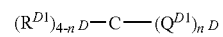

General formula (D-I)

$L^A$ in the general formula (A-I) represents a bivalent or more coupling group. As the coupling group represented by $L^A$, any of the specific examples of the coupling group $L^1$ in the general formula (I) can be applied. $L^A$ is preferably a bivalent or more aromatic hydrocarbon ring and a bivalent or more aromatic hetero ring, more preferably 1,3,5-benzenetriyl group, 2,4,6-pyridinetriyl group, 2,4,6-pyrimidinetriyl group, and 2,4,6-triazinetriyl group, still more preferably 1,3,5-benzenetriyl group and 2,4,6-triazinetriyl group, and particularly preferably 2,4,6-triazinetriyl group.

$Q^A$ represents a group of atoms necessary for forming a nitrogen-containing aromatic hetero ring, and may have a monocyclic structure or a condensed ring structure. The nitrogen-containing aromatic hetero ring formed by $Q^A$ is preferably a 5- to 8-membered nitrogen-containing aromatic hetero ring, and still more preferably a 5- to 6-membered nitrogen-containing aromatic hetero ring.

Examples of the nitrogen-containing aromatic hetero ring formed by $Q^A$ include a pyrrole ring, an imidazole ring, a triazole ring, a tetrazole ring, an oxadiazole ring, thiadiazole ring, an oxatriazole ring, a thiatriazole ring, an indole ring, a benzimidazole ring, a benzotriazole ring, an imidazopyridine ring, an imidazopyrimidine ring, and an imidazopyridazine ring, preferably a pyrrole ring, an imidazole ring, a benzimidazole ring, and an imidazopyridine ring, more preferably a benzimidazole ring and an imidazopyridine ring, and still more preferably a benzimidazole ring.

Plural $Q^A$ may be the same or may be different from each other.

Further, $L^A$ and $Q^A$ in the general formula (A-I) each may have a substituent. As the substituent, for example, any of the examples of the substituent of $L^1$ in the general formula (I) can be applied.

$n^A$ represents a number of 2 or more, preferably 2 to 6, more preferably 2 to 3, and still more preferably 3.

Among the compounds represented by the general formula (A-I), the compound represented by the following general formula (A-II) is more preferable.

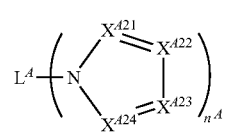

General formula (A-II)

$L^A$ and $n^A$ in the general formula (A-II) each have the same meaning as those in the general formula (A-I), and a preferred embodiment thereof is also the same. $X^{A21}$, $X^{A22}$, $X^{A23}$, and $X^{A24}$ in the general formula (A-II) each represent a nitrogen atom or C—R (R represents a hydrogen atom or a substituent), and if possible, may be combined with each other to form a ring structure. As the substituent represented by R, for example, any of the examples of the substituent of $L^1$ in the general formula (I) can be applied. R is preferably a hydrogen atom, an aliphatic hydrocarbon group, a silyl group, and a ring structure formed by combination thereof, more preferably a hydrogen atom, an aliphatic hydrocarbon group, and a ring structure formed by combination thereof, and still more preferably a hydrogen atom, an alkyl group (preferably having from 1 to 16 carbon atoms, more preferably having from 1 to 12 carbon atoms, and still more preferably having from 1 to 6 carbon atoms), and a ring structure formed by combination thereof (preferably a 5- to 7-membered ring, more preferably a 5- or 6-membered ring, still more preferably a 6-membered aromatic ring, and particularly preferably a benzene ring or a pyridine ring).

$X^{A21}$ is preferably C—R. R is more preferably a hydrogen atom or an alkyl group, still more preferably a hydrogen atom or an unsubstituted alkyl group, and particularly preferably a hydrogen atom or a methyl group.

$X^{A22}$ is preferably a nitrogen atom.

$X^{A23}$ and $X^{A24}$ are each preferably C—R, and more preferably a ring structure formed by combination of $X^{A23}$ and $X^{A24}$ via R (preferably a 5- to 7-membered ring, more preferably a 5- or 6-membered ring, still more preferably a 6-membered ring, further more preferably a 6-membered aromatic ring, and particularly preferably a benzene ring or a pyridine ring).

When there are plural R, they may be the same or may be different from each other.

Among the compounds represented by the general formula (A-I), the compound represented by the following general formula (A-III) is still more preferable.

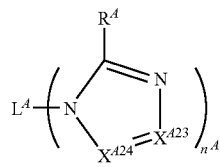

General formula (A-III)

$L^A$ and $n^A$ in the general formula (A-III) each have the same meaning as those in the general formula (A-I), and a preferred embodiment thereof is also the same. $X^{A23}$ and $X^{A24}$ in the general formula (A-III) each have the same meaning as those in the general formula (A-II), and a preferred embodiment thereof is also the same.

$R^A$ represents a hydrogen atom or a substituent. As the substituent represented by $R^A$, for example, any of the examples of the substituent of $L^1$ in the general formula (I) can be applied. $R^A$ is preferably a hydrogen atom or an aliphatic hydrocarbon group, more preferably a hydrogen atom or an alkyl group, still more preferably a hydrogen atom or an alkyl group having 1 to 16 carbon atoms, particularly preferably a hydrogen atom or an alkyl group having 1 to 6 carbon atoms, and most preferably a hydrogen atom or a methyl group.

Among the compounds represented by the general formula (A-I), the compound represented by the following general formula (A-IV) is still more preferable.

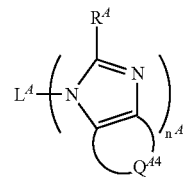

General formula (A-IV)

$L^A$ and $n^A$ in the general formula (A-IV) each have the same meaning as those in the general formula (A-I), and a preferred embodiment thereof is also the same. $R^A$ in the general formula (A-IV) has the same meaning as that in the general formula (A-III), and a preferred embodiment thereof is also the same. $Q^{44}$ represents a group of atoms for forming an aromatic hydrocarbon ring or an aromatic hetero ring. Examples of the aromatic ring formed by $Q^{44}$ include a benzene ring, a pyridine ring, a pyrimidine ring, a pyridazine ring, and a triazine ring, and preferably a benzene ring and a pyridine ring.

Among the compounds represented by the general formula (A-I), the compound represented by the following general formula (A-V) is still more preferable.

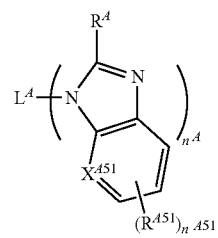

General formula (A-V)

$L^A$ and $n^A$ in the general formula (A-V) each have the same meaning as those in the general formula (A-I), and a preferred embodiment thereof is also the same. $R^A$ in the general formula (A-V) has the same meaning as that in the general formula (A-III), and a preferred embodiment thereof is also the same. $X^{A51}$ represents a nitrogen atom or C—$R^X$ ($R^X$ represents a hydrogen atom or a substituent). As the substituent represented by $R^X$, for example, any of the examples of $L^1$ in the general formula (I) can be applied. $R^X$ is preferably a hydrogen atom, an aliphatic hydrocarbon group, and a halogen atom, more preferably a hydrogen atom, an alkyl group (preferably having from 1 to 16 carbon atoms, more preferably having from 1 to 12 carbon atoms, and still more preferably having from 1 to 6 carbon atoms), and an aryl group (preferably having from 6 to 20 carbon atoms, more preferably having from 6 to 16 carbon atoms, and still more preferably having from 6 to 12 carbon atoms), still more preferably a hydrogen atom and an alkyl group, and particularly preferably a hydrogen atom.

$X^{A51}$ is preferably a nitrogen atom or CH, and particularly preferably CH.

$R^{A51}$ represents a substituent. As the substituent represented by $R^{A51}$, for example, any of the examples of $L^1$ in the general formula (I) can be applied. $R^{A51}$ is preferably an aliphatic hydrocarbon group (preferably having from 1 to 20 carbon atoms, more preferably having from 1 to 16 carbon atoms, and still more preferably having from 1 to 12 carbon atoms), an aryl group (preferably having from 6 to 20 carbon atoms, more preferably having from 6 to 16 carbon atoms, and still more preferably having from 6 to 12 carbon atoms), a halogen atom, and a cyano group, more preferably an alkyl group (preferably having from 1 to 16 carbon atoms, more preferably having from 1 to 12 carbon atoms, and still more preferably having from 1 to 6 carbon atoms), and an aryl group (preferably having from 6 to 20 carbon atoms, more preferably having from 6 to 16 carbon atoms, and still more preferably having from 6 to 12 carbon atoms), and still more preferably an alkyl group.

$n^{A51}$ represents an integer of 0 to 3, preferably 0 to 2, more preferably 0 or 1, and particularly preferably 0.

Among the compounds represented by the general formula (A-I), the compound represented by the following general formula (A) is still more preferable. An azole compound represented by the general formula (A) is particularly preferably used as an organic material which constitutes a layer adjacent to the light emitting layer.

General formula (A)

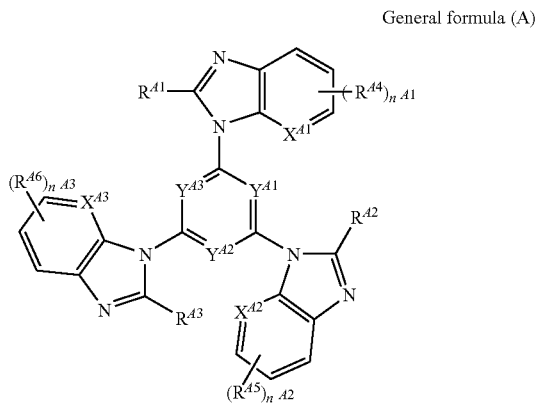

$R^{A1}$, $R^{A2}$ and $R^{A3}$ in the general formula (A) each have the same meaning as $R^A$ in the general formula (A-III), and a preferred embodiment thereof is also the same. That is, $R^{A1}$, $R^{A2}$ and $R^{A3}$ are each preferably a hydrogen atom or an aliphatic hydrocarbon group. $R^{A4}$, $R^{A5}$ and $R^{A6}$ in the general formula (A) each have the same meaning as $R^{A51}$ in the general formula (A-V) that is, each represent a substituent, and a preferred embodiment thereof is also the same. $n^{A1}$, $n^{A2}$ and $n^{A3}$ in the general formula (A) each have the same meaning as $n^{A51}$ in the general formula (A-V), that is, each represent an integer of 0 to 3, and a preferred embodiment thereof is also the same.

$X^{A1}$, $X^{A2}$ and $X^{A3}$ in the general formula (A) each have the same meaning as $X^{A51}$ in the general formula (A-V), that is, each represent a nitrogen atom or C—$R^X$ ($R^X$ represents a hydrogen atom or a substituent), and a preferred embodiment thereof is also the same.

$Y^{A1}$, $Y^{A2}$ and $Y^{A3}$ in the general formula (A) each represent a nitrogen atom or C—$R^{YX}$ ($R^{YX}$ represents a hydrogen atom or a substituent). As the substituent represented by $R^{YX}$, for example, any of the examples of the substituent of $L^1$ in the general formula (I) can be applied. $R^{YX}$ is preferably a hydrogen atom, an alkyl group (preferably having from 1 to 16 carbon atoms, more preferably having from 1 to 12 carbon atoms, and still more preferably having from 1 to 6 carbon atoms), and an aryl group (preferably having from 6 to 16 carbon atoms, more preferably having from 6 to 12 carbon atoms, and still more preferably having from 6 to 10 carbon atoms), more preferably a hydrogen atom, a methyl group, and a phenyl group, and particularly preferably a hydrogen atom.

It is preferable that $Y^{A1}$, $Y^{A2}$ and $Y^{A3}$ are all nitrogen atoms or CH.

Among the compounds represented by the general formula (A-I), the compound represented by the following general formula (A-a) is particularly preferable.

General formula (A-a)

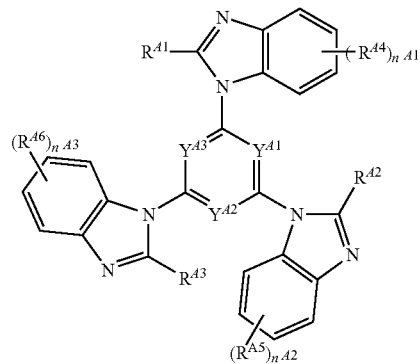

$R^{A1}$, $R^{A2}$ and $R^{A3}$ in the general formula (A-a) each have the same meaning as that of $R^A$ in the general formula (A-III), and a preferred embodiment thereof is also the same. $R^{A4}$, $R^{A5}$ and $R^{A6}$ in the general formula (A-a) each have the same meaning as that of $R^{A51}$ in the general formula (A-V), and a preferred embodiment thereof is also the same. $n^{A1}$, $n^{A2}$ and $n^{A3}$ in the general formula (A-a) each have the same meaning as that of $n^{A51}$ in the general formula (A-V), and a preferred embodiment thereof is also the same. $Y^{A1}$, $Y^{A2}$ and $Y^{A3}$ in the general formula (A-a) each have the same meaning as those in the general formula (A), and a preferred embodiment thereof is also the same.

Among the compounds represented by the general formula (A-I), the compound represented by the following general formula (A-b) or (A-c) is preferred.

General formula (A-b)

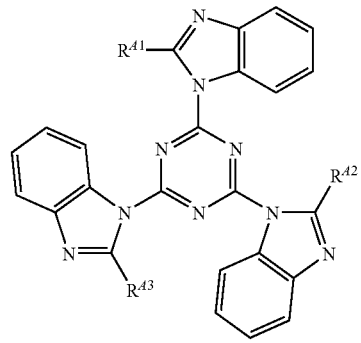

-continued

General formula (A-c)

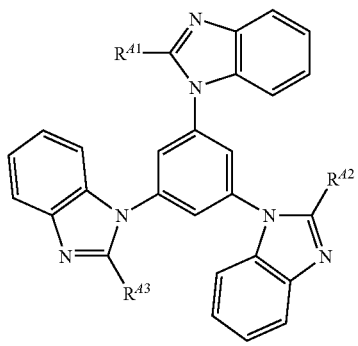

$R^A$, $R^{A2}$ and $R^{A3}$ in the general formulae (A-b) and (A-c) each have the same meaning as $R^A$ in the general formula (A-III), and a preferred embodiment is also the same.

Next, the compound represented by the general formula (B-I) will be described. $L^B$ in the general formula (B-I) represents a bivalent or more coupling group. As the coupling group represented by $L^B$, any of the examples of the coupling group $L^1$ in the general formula (I) can be applied. $L^B$ is preferably a bivalent or more aromatic hydrocarbon ring and a bivalent or more aromatic hetero ring, and more preferably 1,3,5-benzenetriyl group and 2,4,6-triazinetriyl group.

$Q^B$ in the general formula (B-I) represents atoms necessary for forming an aromatic hetero ring by bonding with C. The aromatic hetero ring formed by $Q^B$ is preferably a 5- to 8-membered aromatic hetero ring, more preferably a 5- to 6-membered aromatic hetero ring, and particularly preferably a 5- to 6-membered nitrogen-containing aromatic hetero ring.

Examples of the aromatic hetero ring formed by $Q^B$ include an imidazole ring, an oxazole ring, a thiazole ring, a selenazole ring, a tellurazole ring, a triazole ring, a tetrazole ring, an oxadiazole ring, a thiadiazole ring, an oxatriazole ring, a thiatriazole ring, a pyrimidine ring, a pyridazine ring, a pyrazine ring, a triazine ring, and a tetrazine ring, preferably an imidazole ring, an oxazole ring, a thiazole ring, and a triazine ring, more preferably an imidazole ring, an oxazole ring, and a triazine ring, and still more preferably an imidazole ring and a triazine ring. The aromatic hetero ring formed by $Q^B$ may also form a condensed ring with other ring, or may have a substituent. As the substituent, for example, any of the examples of the substituent of the group represented by $L^1$ in the general formula (I). The substituent of $Q^B$ is preferably an alkyl group, an aryl group, an amino group, an alkoxy group, an aryloxy group, an acyl group, an alkoxycarbonyl group, an aryloxycarbonyl group, an acyloxy group, an acylamino group, a sulfonylamino group, a sulfamoyl group, a carbamoyl group, an alkylthio group, an arylthio group, a sulfonyl group, a halogen atom, a cyano group, and a heterocyclic group, more preferably an alkyl group, an aryl group, an alkoxy group, an aryloxy group, a halogen atom, a cyano group, and a heterocyclic group, still more preferably an alkyl group, an aryl group, an alkoxy group, an aryloxy group, and an aromatic heterocyclic group, and particularly preferably an alkyl group, an aryl group, an alkoxy group, and an aromatic heterocyclic group.

$n^B$ in the general formula represents an integer of 2 or more, preferably 2 to 8, more preferably 2 to 6, still more preferably 2 to 4, particularly preferably 2 to 3, and most preferably 3.

Among the compounds represented by the general formula (B-I), the compound represented by the following general formula (B-II) is still more preferable.

General formula (B-II)

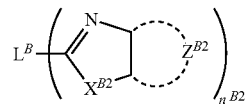

$L^B$ in the general formula (B-II) has the same meaning as $L^B$ in the general formula (B-I), and a preferred embodiment thereof is also the same. $X^{B2}$ in the general formula (B-II) represents —O—, —S— or =N—$R^{B2}$. $R^{B2}$ represents a hydrogen atom, an aliphatic hydrocarbon group, an aromatic hydrocarbon group, and an aromatic heterocyclic group. The aliphatic hydrocarbon group represented by $R^{B2}$ is a normal chain, branching, or cyclic alkyl group (preferably having from 1 to 20 carbon atoms, more preferably having from 1 to 12 carbon atoms, and particularly preferably having from 1 to 8 carbon atoms, such as methyl, ethyl, isopropyl, tert-butyl, n-octyl, n-decyl, n-hexadecyl, cyclopropyl, cyclopentyl, and cyclohexyl), an alkenyl group (preferably having from 2 to 20 carbon atoms, more preferably having from 2 to 12 carbon atoms, and particularly preferably having from 2 to 8 carbon atoms, such as vinyl, allyl, 2-butenyl, and 3-pentenyl), an alkynyl group (preferably having from 2 to 20 carbon atoms, more preferably having from 2 to 12 carbon atoms, and particularly preferably having from 2 to 8 carbon atoms, such as propargyl and 3-penthynyl), and more preferably an alkyl group.

The aryl group represented by $R^{B2}$ is a monocyclic or condensed-ring aryl group, that is, an aryl group preferably having from 6 to 30 carbon atoms, more preferably having from 6 to 20 carbon atoms, and still more preferably having from 6 to 12 carbon atoms. Examples of the aryl group include phenyl, 2-methylphenyl, 3-methylphenyl, 4-methylphenyl, 2-methoxyphenyl, 3-trifluoromethylphenyl, pentafluorophenyl, 1-naphthyl, and 2-naphthyl.

The heterocyclic group represented by $R^{B2}$ is a monocyclic or condensed-ring heterocyclic group (preferably having from 1 to 20 carbon atoms, more preferably having form 1 to 12 carbon atoms, and still more preferably having from 2 to 10 carbon atoms), preferably an aromatic heterocyclic group including at least one of a nitrogen atom, an oxygen atom, a sulfur atom, and selenium atom. Specific examples of the heterocyclic group represented by $R^{B2}$ include pyrrolidine, piperidine, piperazine, morpholine, thiophene, selenophene, furan, pyrrole, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthylidine, quinoxaline, quinazoline, cinnoline, pteridine, acridine, phenanthroline, phenazine, tetrazole, benzimidazole, benzoxazole, benzothiazole, benzotriazole, tetrazaindene, carbazole, and azepin, preferably furan, thiophene, pyridine, pyrazine, pyrimidine, pyridazine, triazine, quinoline, phthalazine, naphthylidine, quinoxaline, and quinazoline, more preferably furan, thiophene, pyridine, and quinoline, and still more preferably quinoline.

The aliphatic hydrocarbon group, aryl group, and heterocyclic group represented by $R^{B2}$ each may have a substituent. As the substituent, any of the examples of the substituent of the group represented by $L^1$ in the general formula (I) can be applied, and a preferred substituent is also the same. $R^{B2}$ is preferably an alkyl group, an aryl group, and an aromatic heterocyclic group, more preferably an aryl group and an aromatic heterocyclic group, and still more preferably an aryl group. $X^{B2}$ is preferably —O— or =N—$R^{B2}$, more preferably =N—$R^{B2}$, and particularly preferably N—$Ar^{B2}$ ($Ar^{B2}$ is an aryl group (preferably having from 6 to 30 carbon atoms, more preferably from 6 to 20 carbon atoms, and still more preferably 6 to 12 carbon atoms) and an aromatic heterocyclic group (preferably having from 1 to 20 carbon atoms, more preferably having from 1 to 12 carbon atoms, and still more preferably having from 2 to 10 carbon atoms)), and preferably an aryl group).

$Z^{B2}$ represents a group of atoms necessary for forming the aromatic ring. The aromatic ring formed by $Z^{B2}$ may be any one of the aromatic hydrocarbon ring and the aromatic hetero ring. Examples of the aromatic ring includes a benzene ring, a pyridine ring, a pyrazine ring, a pyrimidine ring, a pyridazine ring, a triazine ring, a pyrrole ring, a furan ring, a thiophene ring, a selenophene ring, tellurophene ring, an imidazole ring, a thiazole ring, a selenazole ring, a tellurazole ring, a thiadiazole ring, an oxadiazole ring, and a pyrazole ring, preferably a benzene ring, a pyridine ring, a pyrazine ring, a pyrimidine ring, and a pyridazine ring, more preferably a benzene ring, a pyridine ring, and a pyrazine ring, still more preferably a benzene ring and a pyridine ring, and particularly preferably a pyridine ring.

The aromatic ring formed by $Z^{B2}$ may also form a condensed ring with other ring, or may have a substituent. As the substituent, for example, any of the examples of the substituent of the group represented by $L^1$ in the general formula (I) can be applied. The substituent of the aromatic ring formed by $Z^{B2}$ is preferably an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a sulfonyl group, a halogen atom, a cyano group, and a heterocyclic group, more preferably an alkyl group, an aryl group, an alkoxy group, an aryloxy group, a halogen atom, a cyano group, and a heterocyclic group, still more preferably an alkyl group, an aryl group, an alkoxy group, an aryloxy group, and an aromatic heterocyclic group, and particularly preferably an alkyl group, an aryl group, an alkoxy group, and an aromatic heterocyclic group.

Among the compounds represented by the general formula (B-II), the compound represented by the following general formula (B-III) is still more preferable.

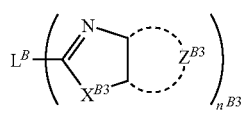

General formula (B-III)

$L^B$ in the general formula (B-III) has the same meaning as that in the general formula (B-I), and a preferred embodiment thereof is also the same. $X^{B3}$ and $n^{B3}$ in the general formula (B-III) respectively have the same meanings as $X^{B2}$ and $n^{B2}$ in the general formula (B-II), and a preferred embodiment thereof is also the same. $Z^{B3}$ represents a group of atoms necessary for forming the aromatic hetero ring. The aromatic hetero ring formed by $Z^{B3}$ is preferably a 5- or 6-membered aromatic hetero ring, more preferably a 5- or 6-membered nitrogen-containing aromatic hetero ring, and still more preferably a 6-membered nitrogen-containing aromatic hetero ring.

Examples of the aromatic hetero ring formed by $Z^{B3}$ include furan, thiophene, pyran, pyrrole, imidazole, pyrazole, pyridine, pyrazine, pyrimidine, pyridazine, triazine, thiazole, oxazole, isothiazole, isoxazole, thiadiazole, oxadiazole, triazole, selenazole, and tellurazole, preferably pyridine, pyrazine, pyrimidine, and pyridazine, more preferably pyridine and pyrazine, and still more preferably pyridine.

The aromatic hetero ring formed by $Z^{B3}$ may also form a condensed ring with other ring, or may have a substituent. As the substituent, any of the examples of the substituents of the group represented by $L^1$ in the general formula (I) can be applied, and a preferred embodiment thereof is also the same.

Among the compounds represented by the general formula (B-II), the compound represented by the following general formula (B-IV) is still more preferable.

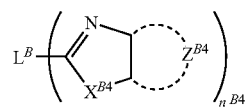

General formula (B-IV)

$L^B$ in the general formula (B-IV) has the same meaning as that in the general formula (B-I), and a preferred embodiment thereof is also the same. $X^{B4}$ and $n^{B4}$ in the general formula (B-IV) respectively have the same meanings as $X^{B2}$ and $n^{B2}$ in the general formula (B-II), and a preferred embodiment thereof is also the same. $Z^{B4}$ represents a group of atoms required for forming a nitrogen-containing aromatic hetero ring. The nitrogen-containing aromatic hetero ring formed by $Z^{B4}$ is preferably a 5- or 6-membered nitrogen-containing aromatic hetero ring, and more preferably a 6-membered nitrogen-containing aromatic hetero ring.

Examples of the nitrogen-containing aromatic hetero ring formed by $Z^{B4}$ include pyrrole, imidazole, pyrazole, pyridine, pyrazine, pyrimidine, pyridazine, triazine, thiazole, oxazole, isothiazole, isoxazole, thiadiazole, oxadiazole, triazole, selenazole, and tellurazole, preferably pyridine, pyrazine, pyrimidine, and pyridazine, more preferably pyridine and pyrazine, and still more preferably pyridine.

The aromatic hetero ring formed by $Z^{B4}$ may also form a condensed ring with other ring, or may have a substituent. As the substituent, any of the examples of the substituents of the group represented by $L^1$ in the general formula (I) can be applied, and a preferred embodiment thereof is also the same.

Among the compound represented by the general formula (B-II), the compound represented by the following general formula (B-V) is still more preferable.

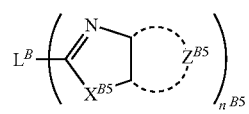

General formula (B-V)

$L^B$ in the general formula (B-V) has the same meaning as that in the general formula (B-I), and a preferred embodiment thereof is also the same. $X^{B5}$ and $n^{B5}$ in the general formula (B-V) respectively have the same meanings as $X^{B2}$ and $n^{B2}$ in the general formula (B-II), and a preferred embodiment thereof is also the same. $Z^{B5}$ represents a group of atoms necessary for forming the 6-membered nitrogen-containing aromatic hetero ring.

Examples of the 6-membered nitrogen-containing aromatic hetero ring formed by $Z^{B5}$ include pyridine, pyrazine, pyrimidine, pyridazine, and triazine, preferably pyridine, pyrazine, pyrimidine, and pyridazine, more preferably pyridine and pyrazine, and still more preferably pyridine.

The 6-membered nitrogen-containing aromatic hetero ring formed by $Z^{B5}$ may also form a condensed ring with other ring, or may have a substituent. As the substituent, any of the examples of the substituents of the group represented by $L^1$ in the general formula (I) can be applied, and a preferred embodiment thereof is also the same.

Among the compounds represented by the general formula (B-II), the compound represented by the following general formula (B-VI) is still more preferable.

General formula (B-VI)

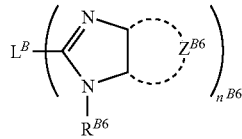

$L^B$ in the general formula (B-VI) has the same meaning as that in the general formula (B-I), and a preferred embodiment thereof is also the same. $X^{B6}$ and $n^{B6}$ in the general formula (B-VI) respectively have the same meanings as $X^{B2}$ and $n^{B2}$ in the general formula (B-II), and a preferred embodiment thereof is also the same. $Z^{B6}$ in the general formula (B-VI) has the same meaning as $Z^{B5}$ in the general formula (B-V), and a preferred embodiment thereof is also the same. $R^{B6}$ in the general formula (B-VI) has the same meaning as $R^{B2}$ in the general formula (B-II), and a preferred embodiment thereof is also the same.

Among the compound represented by the general formula (B-II), the compound represented by the following general formula (V-VII) is still more preferable.

General formula (B-VII)

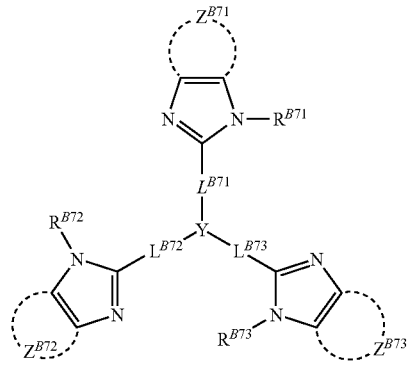

$R^{B71}$, $R^{B72}$ and $R^{B73}$ in the general formula (B-VII) each have the same meaning as $R^{B2}$ in the general formula (B-II) and a preferred embodiment thereof is also the same. $Z^{B71}$, $Z^{B72}$, and $Z^{B73}$ in the general formula (B-VII) each have the same meaning as $Z^{B5}$ in the general formula (B-V), and a preferred embodiment thereof is also the same. $L^{B71}$, $L^{B72}$, and $L^{B73}$ in the general formula (B-VII) each represent a coupling group, and may be each any of the examples of $L^1$ in the general formula (I) $L^{B71}$, $L^{B72}$, and $L^{B73}$ in the general formula (B-VII) are each a coupling group comprised of, preferably single bond, bivalent aromatic hydrocarbon ring group, bivalent aromatic heterocyclic group, and a combination thereof, and more preferably single bond. $L^{B71}$, $L^{B72}$, and $L^{B73}$ may each have a substituent. As the substituent, any of substituents of the group represented by $L^1$ in the general formula (I), and a preferred embodiment thereof is also the same.

Y in the general formula (B-VII) represents a nitrogen atom, 1,3,5-benzenetriyl group, or 2,4,6-triazinetriyl group. 1,3,5-benzenetriyl group may have a substituent at the position of 2,4,6. As the substituent, for example, an alkyl group, an aromatic hydrocarbon ring group, and a halogen atom can be applied.

Among the compounds represented by the general formula (B-II), the compound represented by the following general formula (B-VIII) is particularly preferable.

General formula (B-VIII)

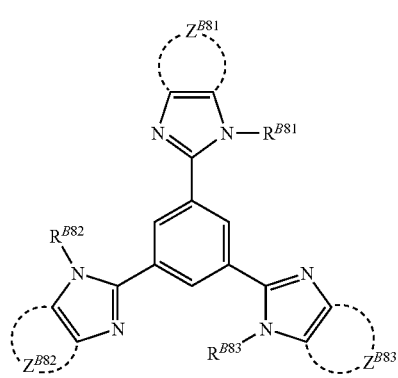

$R^{B81}$, $R^{B82}$, and $R^{B83}$ in the general formula (B-VIII) each have the same meaning as $R^{B2}$ in the general formula (B-II) and a preferred embodiment thereof is also the same. $Z^{B81}$, $Z^{B82}$, and $Z^{B83}$ in the general formula (B-VIII) each have the same meaning as $Z^{B5}$ in the general formula (B-V), and a preferred embodiment thereof is also the same.

Among the compounds represented by the general formula (B-II), the compound represented by the following general formula (B-IX) is most preferable.

General formula (B-IX)

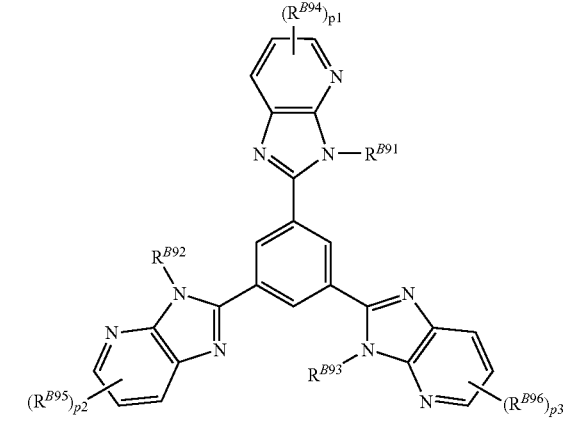

$R^{B91}$, $R^{B92}$, and $R^{B93}$ in the general formula (B-IX) each have the same meaning as $R^{B2}$ in the general formula (B-II) and a preferred embodiment thereof is also the same. $R^{B94}$, $R^{B95}$, and $R^{B96}$ in the general formula (B-IX) each represent a substituent. As the substituent, any of substituents of the group represented by $L^1$ in the general formula (I) can be applied, and a preferred embodiment thereof is also the same. Further, if possible, the substituents may be coupled to form a ring. p1, p2, and p3 in the general formula (B-IX) each represent an integer of 0 to 3, preferably 0 to 2, more preferably 0 or 1, and still more preferably 0.

Next, the compound represented by the general formula (C-I) will be described. $Q^{C1}$ represents an aromatic hydrocarbon ring or an aromatic hetero ring. Examples of the aromatic hydrocarbon ring represented by $Q^{C1}$ are a benzene ring and a naphthalene ring. Examples of the aromatic hetero ring represented by $Q^{C1}$ are a pyridine ring, a pyrazine ring, a pyrimidine ring, a pyridazine ring, a triazine ring, an oxazole ring, a thiazole ring, an imidazole ring, an oxadiazole ring, a thiadiazole ring, a triazole ring, a tetrazole ring, a furan ring, a thiophene ring, and pyrrole ring. $Q^{C1}$ is preferably a benzene ring, a pyridine, ring, a pyrazine ring, a triazine ring, a thiadiazole ring, and an oxadiazole ring, more preferably a benzene ring, a pyridine ring, a triazine ring, and a thiadiazole ring, and still more preferably a benzene ring and a triazine ring. The aromatic hydrocarbon ring or aromatic hetero ring represented by $Q^{C1}$ may be condensed with other ring, or may have a substituent. As the substituent, any of substituents of the group represented by $L^1$ in the general formula (I) can be applied, and a preferred embodiment thereof is also the same.

$R^{C1}$ represents a hydrogen atom or an aliphatic hydrocarbon group. $R^{C1}$ is preferably an aliphatic hydrocarbon group, and more preferably an alkyl group and an alkenyl group. $n^C$ represents an integer of 2 to 4, preferably 3 or 4, and more preferably 4. At this time, if $n^C$ is 2, $Q^{C1}$ of the same kind may be bonded to Si, or $Q^{C1}$ of different two kinds may be bonded to Si.

Among the compounds represented by the general formula (C-I), the compound represented by the following general formula (C-II) is more preferable.

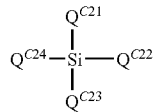

General formula (C-II)

$Q^{C21}$, $Q^{C22}$, $Q^{C23}$, and $Q^{C24}$ in the general formula (C-II) each have the same meaning as $Q^{C1}$ in the general formula (C-I) and a preferred embodiment thereof is also the same. $Q^{C21}$, $Q^{C22}$, $Q^{C23}$, and $Q^{C24}$ in the general formula (C-II) may be the same or may be different from one another.

Next, the compound represented by the general formula (D-I) will be described. $Q^{D1}$ represents an aromatic hydrocarbon ring or an aromatic hetero ring. An example of the aromatic hydrocarbon ring represented by $Q^{D1}$ is a benzene ring. Examples of the aromatic hetero ring represented by $Q^{D1}$ are a pyridine ring, a pyrazine ring, a pyrimidine ring, a pyridazine ring, a triazine ring, an oxazole ring, a thiazole ring, an imidazole ring, an oxadiazole ring, a thiadiazole ring, a triazole ring, a tetrazole ring, a furan ring, a thiophene ring, and pyrrole ring. $Q^{D1}$ is preferably a benzene ring, a pyridine, ring, a pyrazine ring, a triazine ring, a thiadiazole ring, and an oxadiazole ring, more preferably a benzene ring, a pyridine ring, a triazine ring, and a thiadiazole ring, and still more preferably a benzene ring and a triazine ring. The aromatic hydrocarbon ring or aromatic hetero ring represented by $Q^{D1}$ may be condensed with other ring, or may have a substituent. As the substituent, any of substituents of the group represented by $L^1$ in the general formula (I) can be applied, and a preferred embodiment thereof is also the same.

$R^{D1}$ represents a hydrogen atom or an aliphatic hydrocarbon group. $R^{D1}$ is preferably an aliphatic hydrocarbon group, and more preferably an alkyl group and an alkenyl group. $n^D$ represents an integer of 2 to 4, preferably 3 or 4, and more preferably 4. At this time, if $n^D$ is 2, $Q^{D1}$ of the same kind may be bonded to C, or $Q^{D1}$ of the different two kinds may be bonded to C.

Among the compounds represented by the general formula (D-I), the compound represented by the following general formula (D-II) is more preferable.

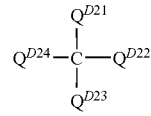

General formula (D-II)

$Q^{D21}$, $Q^{D22}$, $Q^{D23}$ and $Q^{D24}$ in the general formula (D-II) each have the same meaning as $Q^{D1}$ in the general formula (D-I) and a preferred embodiment thereof is also the same. $Q^{D21}$, $Q^{D22}$, $Q^{D23}$, and $Q^{D24}$ in the general formula (D-II) may be the same or may be different from one another.

The host material used in the present invention and the organic material contained in the layer which is disposed adjacent to the light emitting layer each may be a polymer (having a weight average molecular weight of preferably 1000 to 5000000, more preferably 2000 to 2000000, and still more preferably 10000 to 1000000) with a skeleton represented by the general formula (I) or the general formula (II) being connected to a polymer main chain, or a high molecular weight compound (having a weight average molecular weight of preferably 1000 to 5000000, more preferably 2000 to 2000000, and still more preferably 10000 to 1000000) having, as the main chain, a skeleton represented by the general formula (I) or the general formula (II). The polymer may be a homopolymer or a copolymer having other skeleton connected thereto. The copolymer may be a random copolymer or a block copolymer. The host material used in the present invention and the organic material contained in the layer which is disposed adjacent to the light emitting layer are each preferably a low molecular weight compound or a polymer with the skeleton represented by the general formula (I) or the general formula (II) being connected to a polymer main chain, and more preferably a low molecular weight compound. The host material used in the present invention and the organic material contained in the layer which is disposed adjacent to the light emitting layer may be compounds in which the skeleton represented by the general formula (I) or the general formula (II) is connected to a metal to form a complex.

Specific examples of the compound represented by the general formula (I) or the general formula (II) are described below, but the present invention is not limited to the same. Exemplified compounds A-1 to A-33 are specific examples of the general formula (A-I), exemplified compounds B-1 to B-62 are specific examples of the general formula (B-I), exemplified compounds C-1 to C-72 are specific examples of the general formula (C-I), exemplified compounds D-1 to D-75 are specific examples of the general formula (D-I), and exemplified compounds E-1 to E-5 are other specific examples.
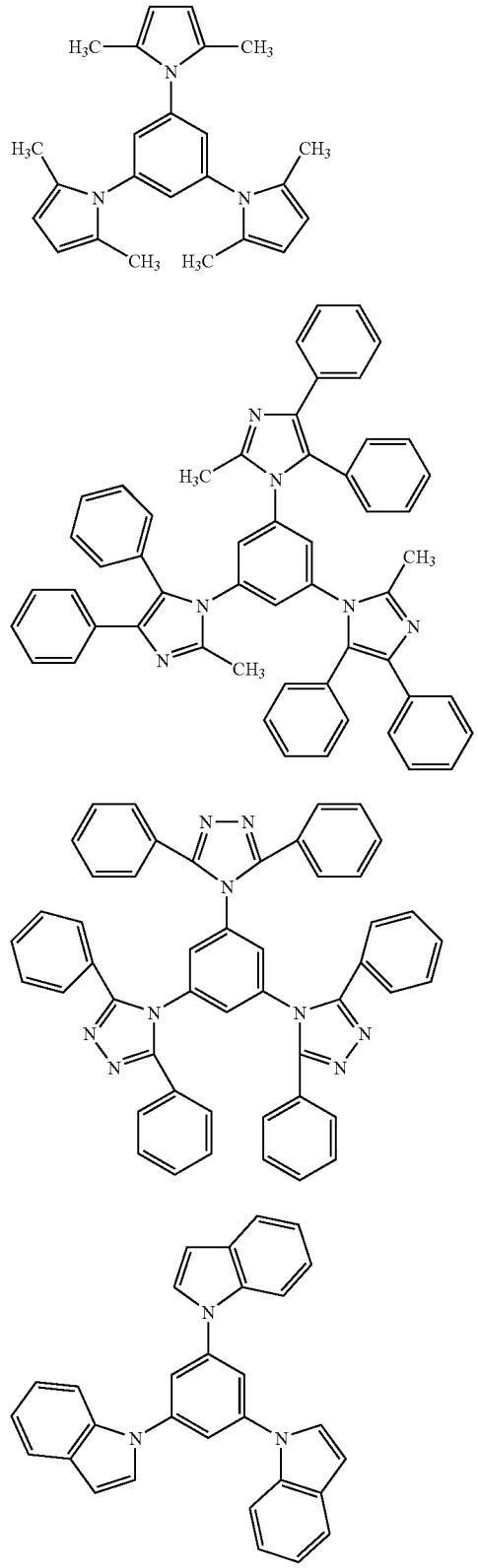
A-1
A-2
A-3
A-4
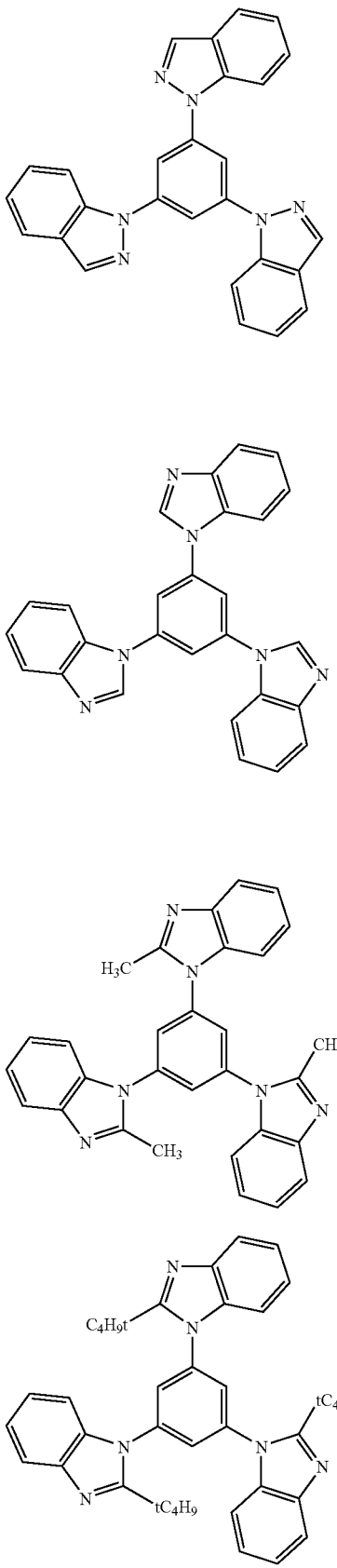
A-5
A-6
A-7
A-8

-continued
A-9
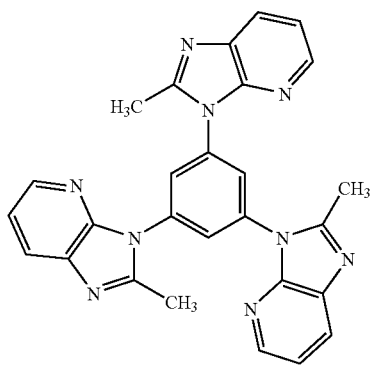
A-10
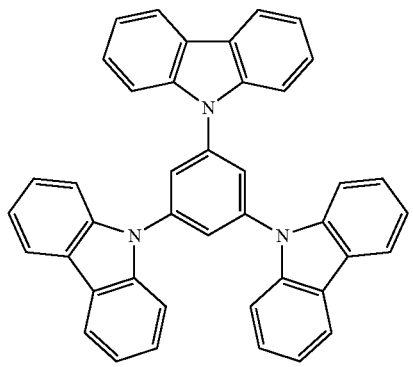
A-11
A-12
-continued
A-13
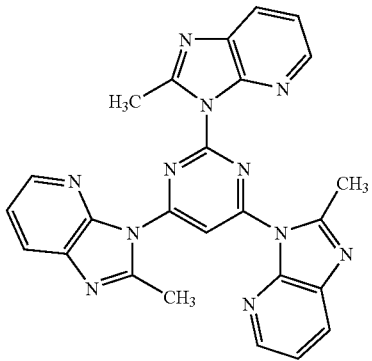
A-14
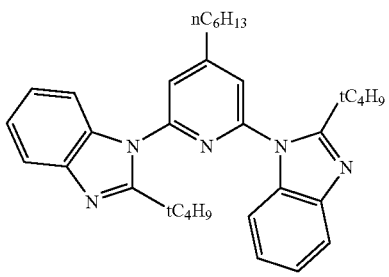
A-15
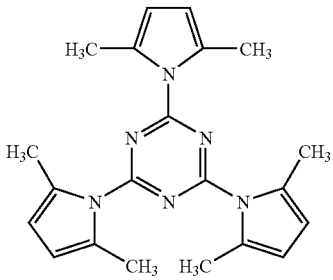
A-16
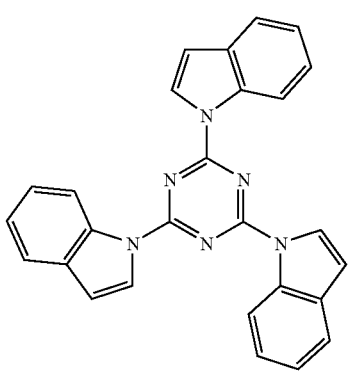

-continued
A-17
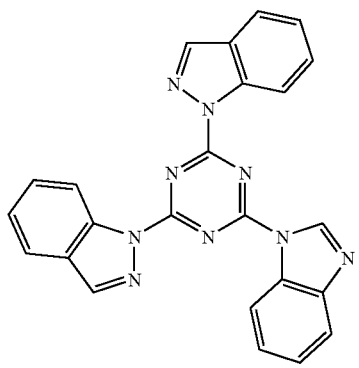
A-18
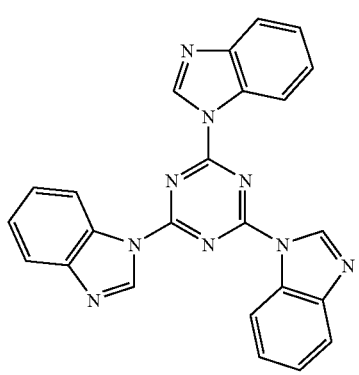
A-19
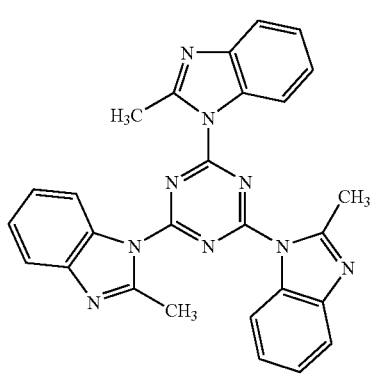
A-20
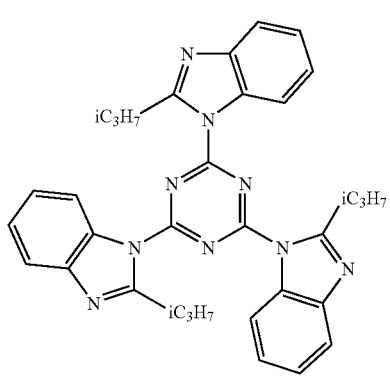
-continued
A-21
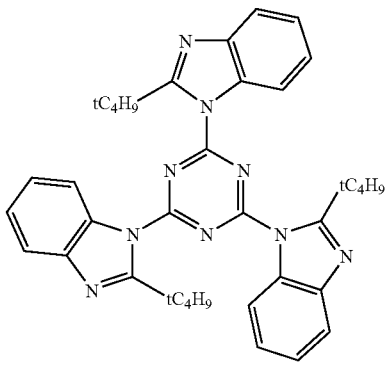
A-22
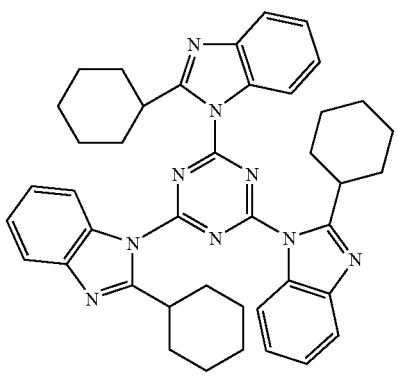
A-23
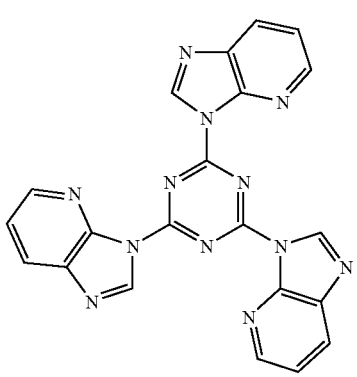
A-24

A-25
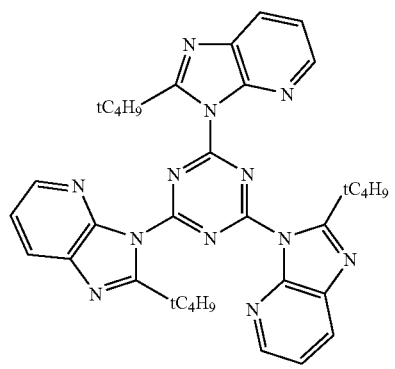
A-26
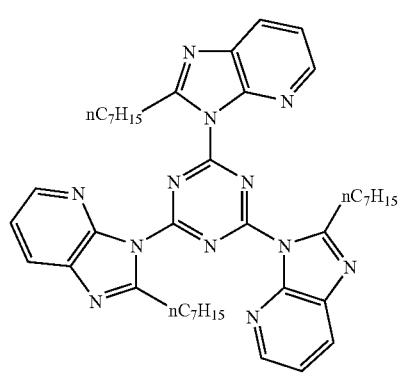
A-27
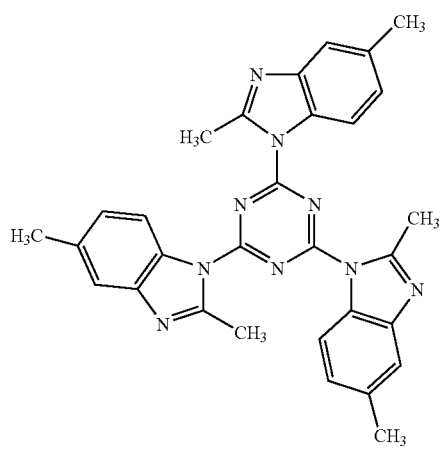
A-28
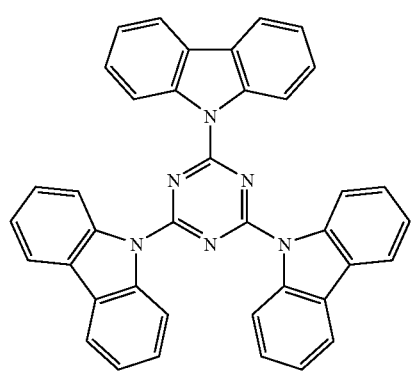
A-29
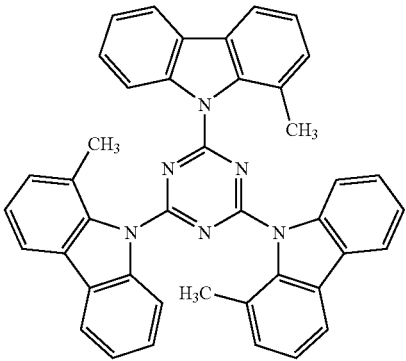
A-30
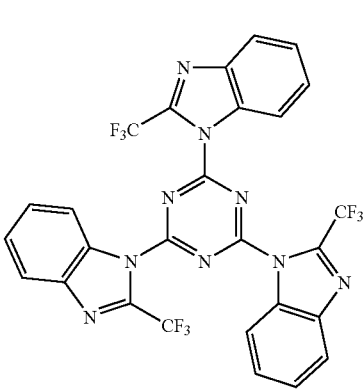
A-31
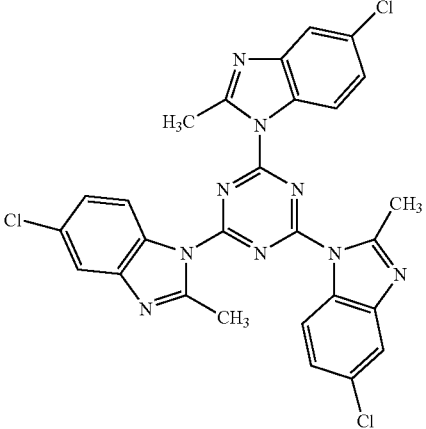
A-32
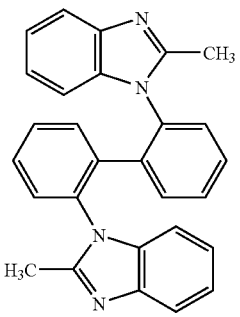

-continued
A-33
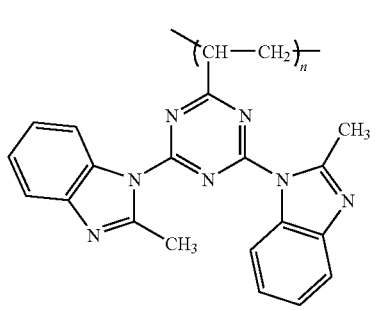
Weight average molecular weight: 14100
(converted into polystyerene)
B-1
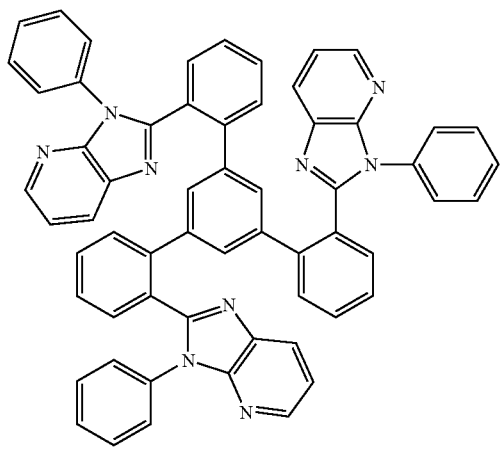
B-2
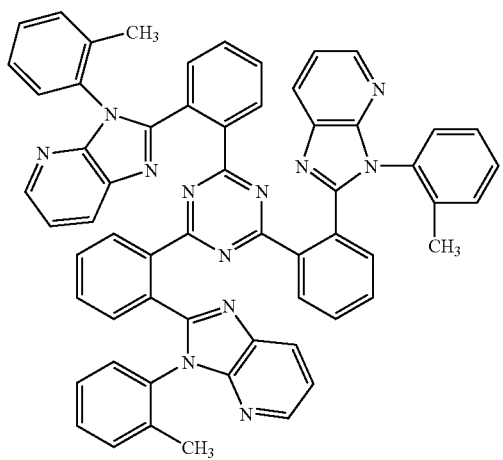
-continued
B-3
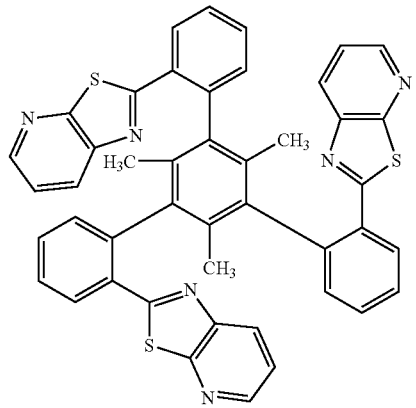
B-4
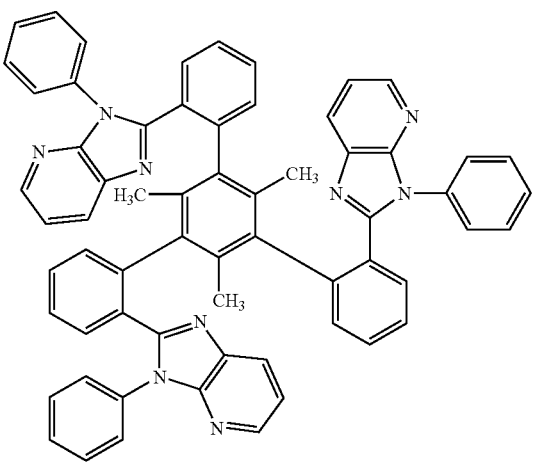
B-5
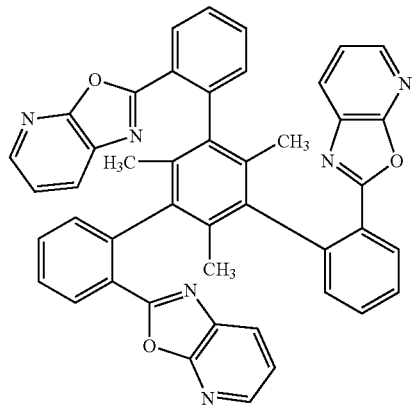

-continued
B-6
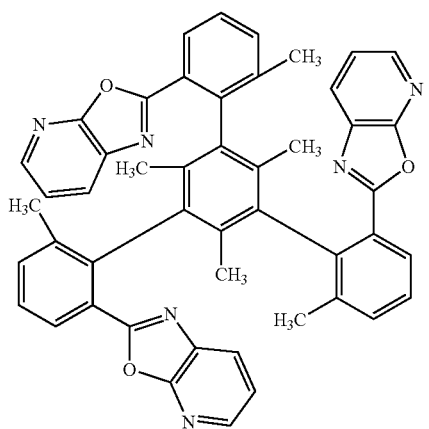
B-7
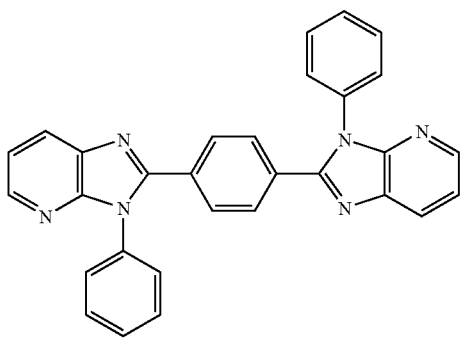
B-8
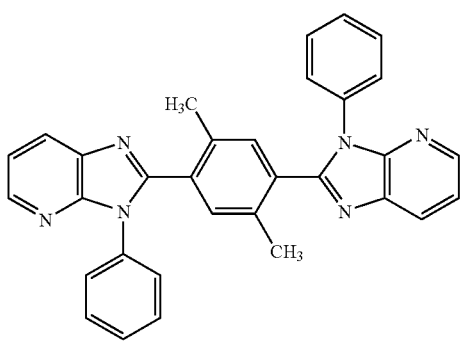
B-9
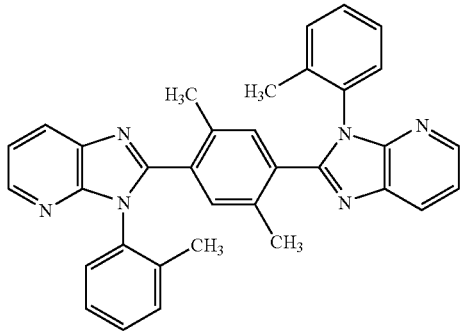
-continued
B-10
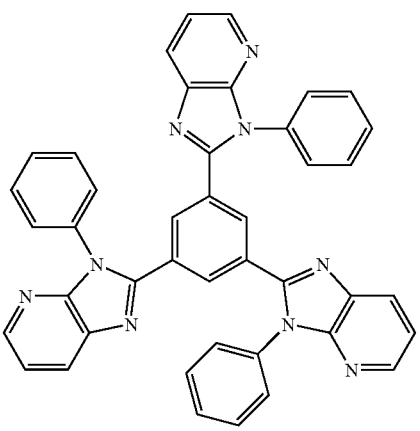
B-11
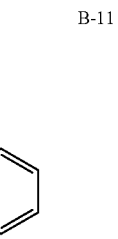
B-12
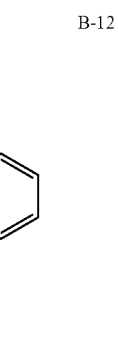
B-13
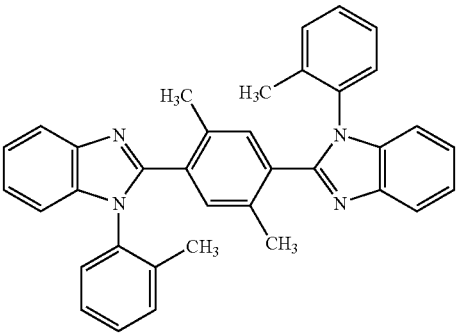

-continued
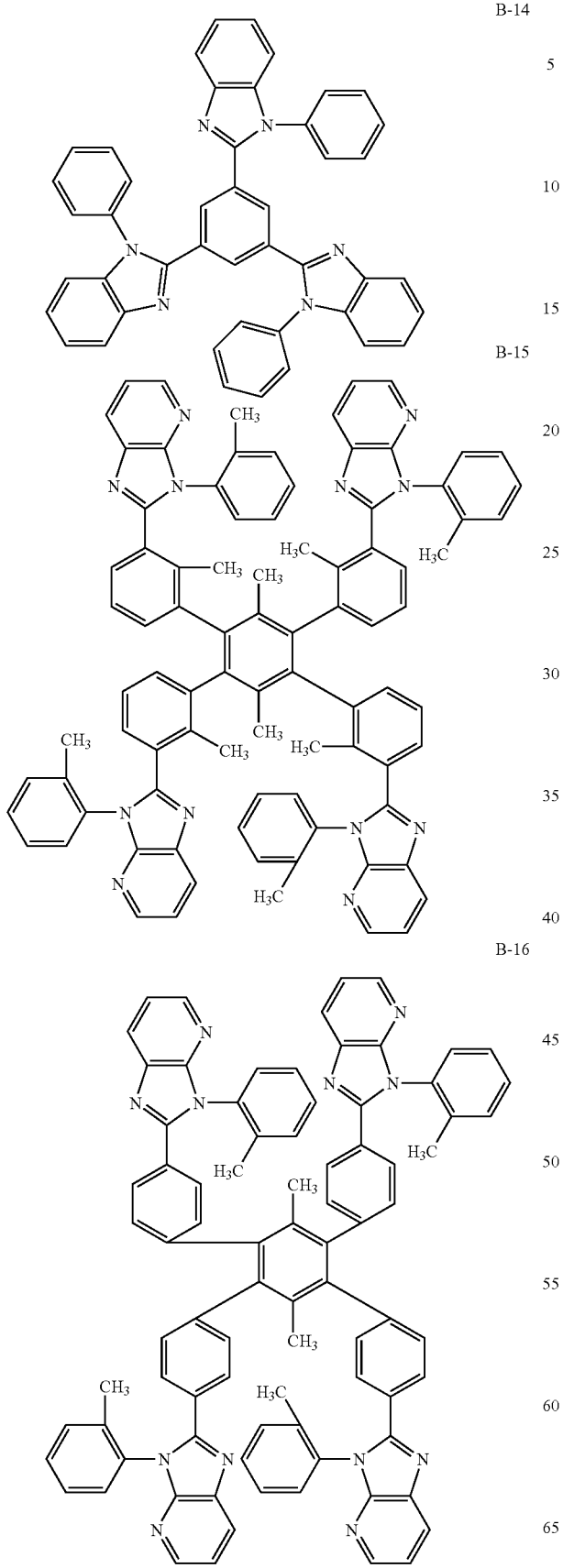
B-14
B-15
B-16
-continued
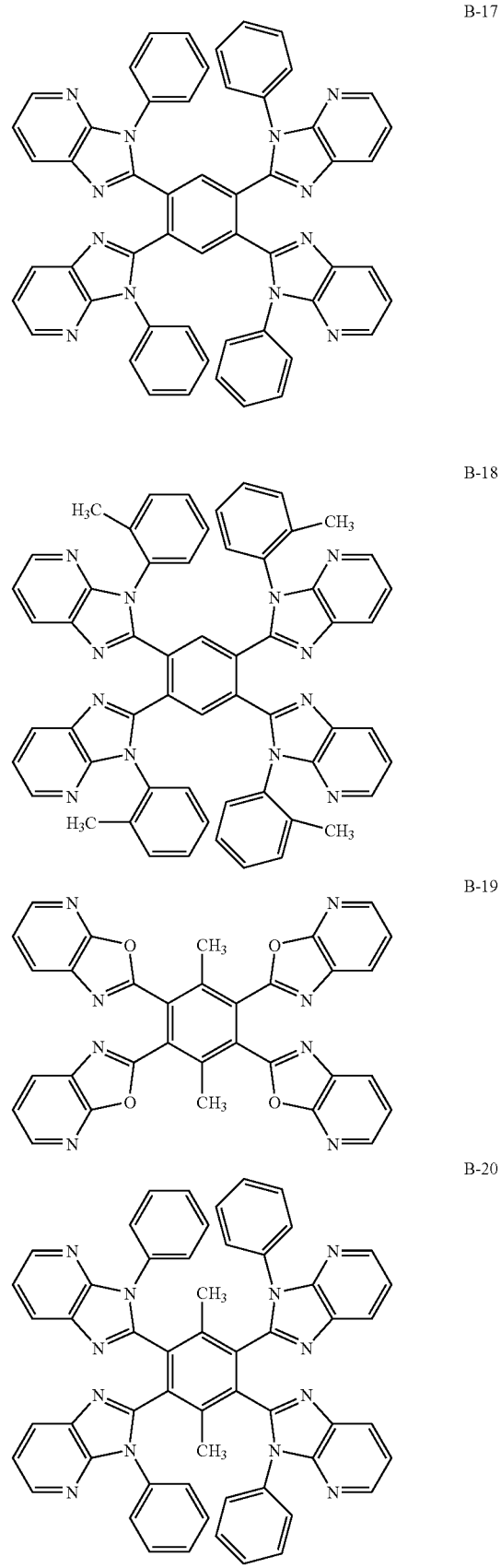
B-17
B-18
B-19
B-20

-continued
B-21
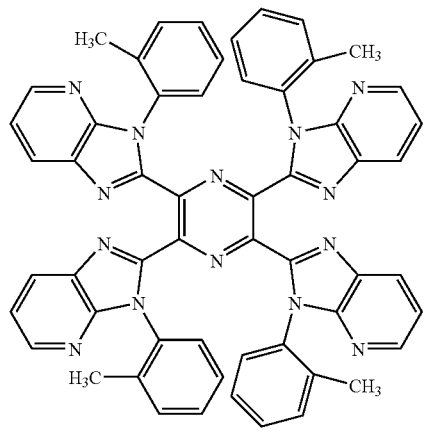
B-22
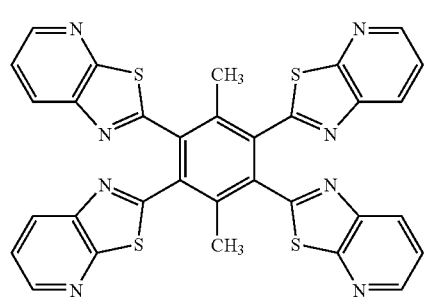
B-23
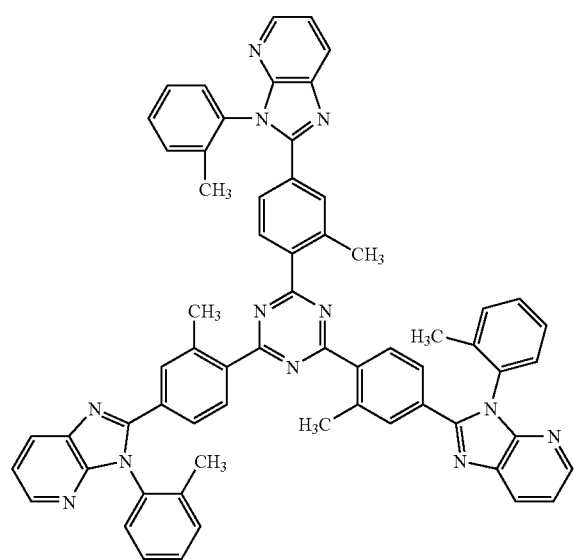
-continued
B-24
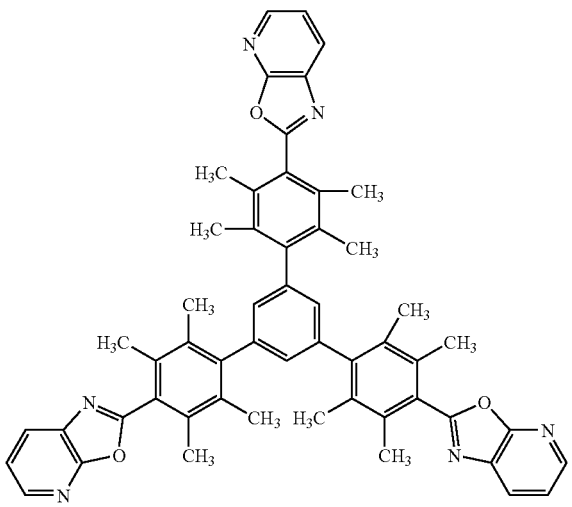
B-25
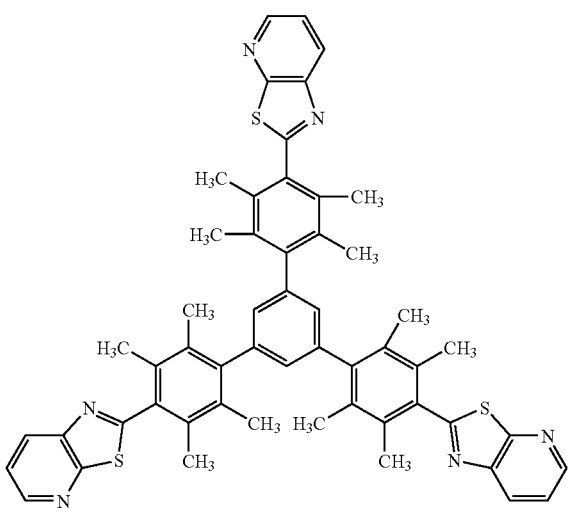
B-26
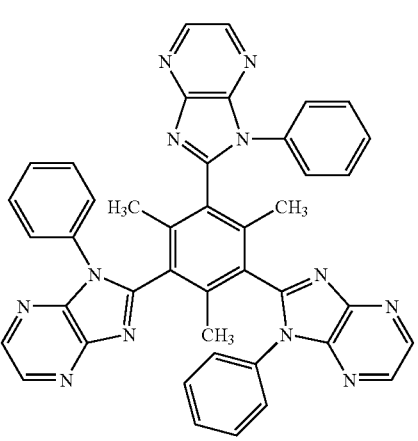

-continued
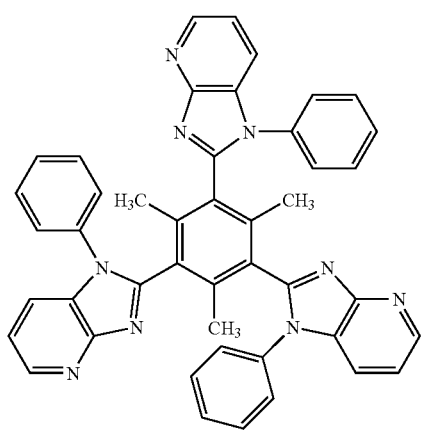
B-27
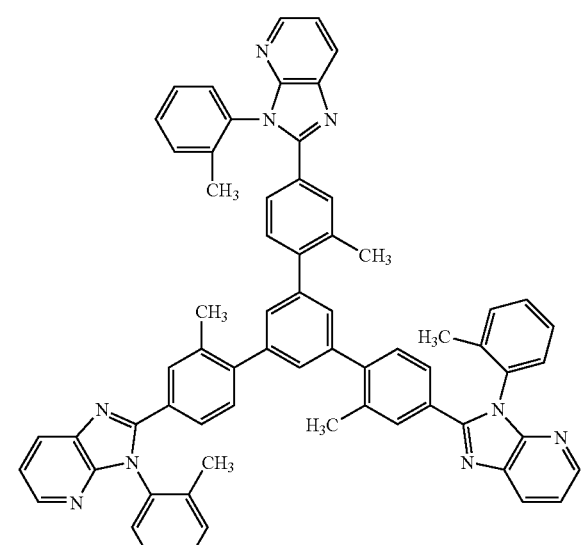
B-30
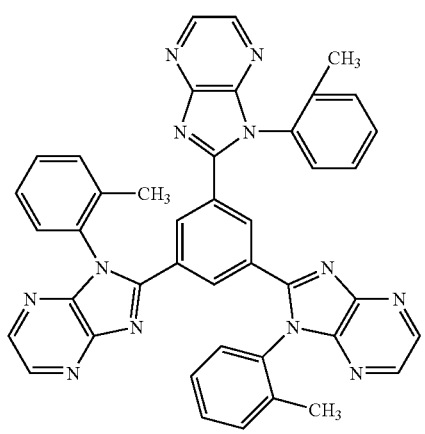
B-28
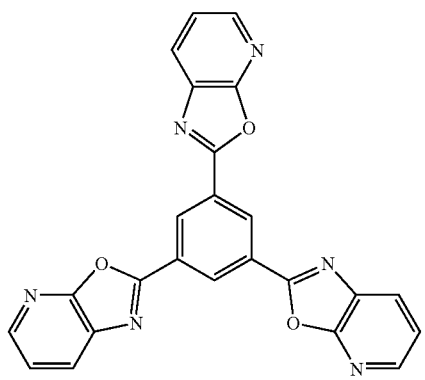
B-31
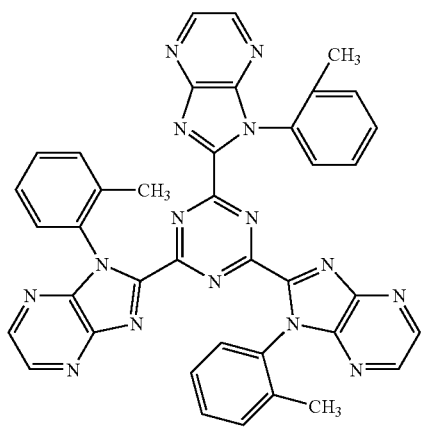
B-29
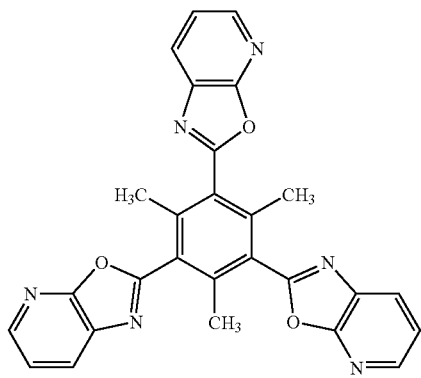
B-32

-continued
B-33
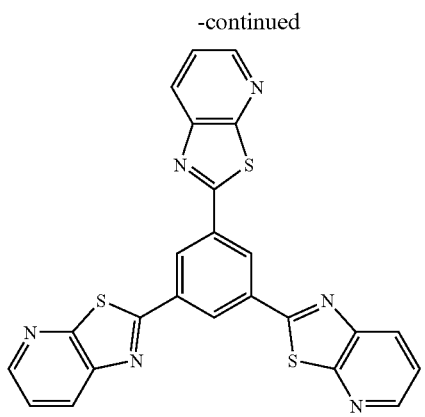
B-34
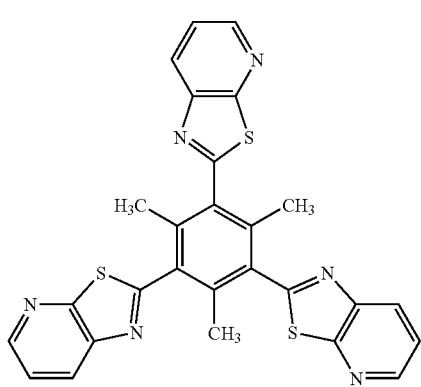
B-35
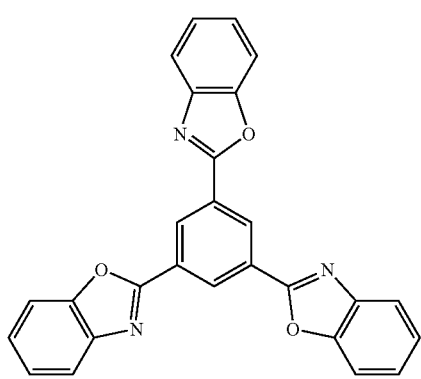
B-36
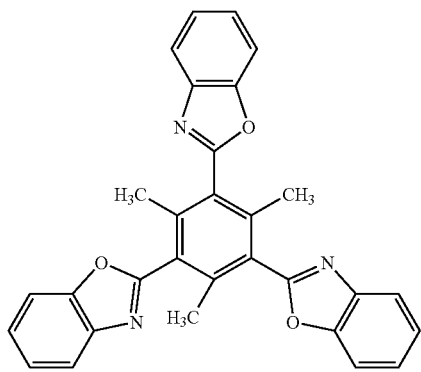
-continued
B-37
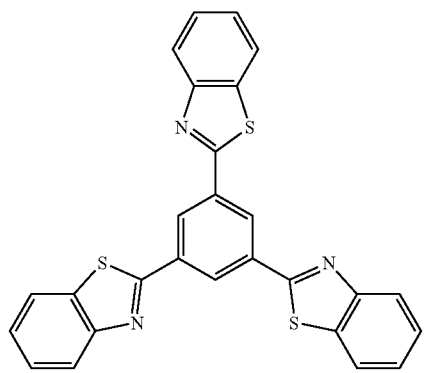
B-38
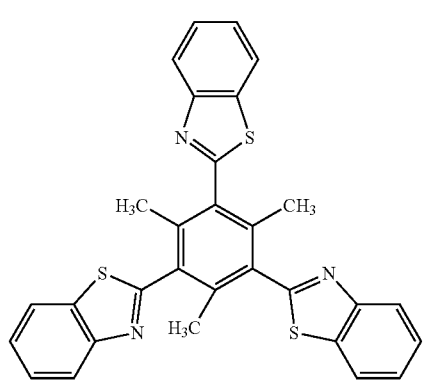
B-39
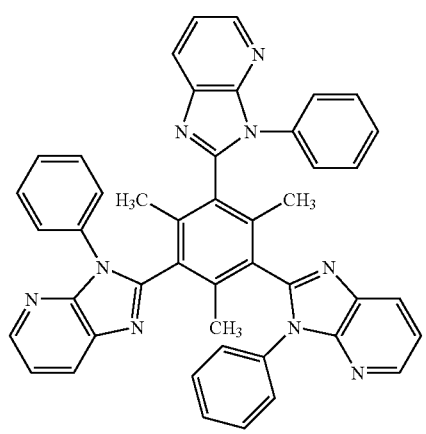
B-40

-continued
B-41
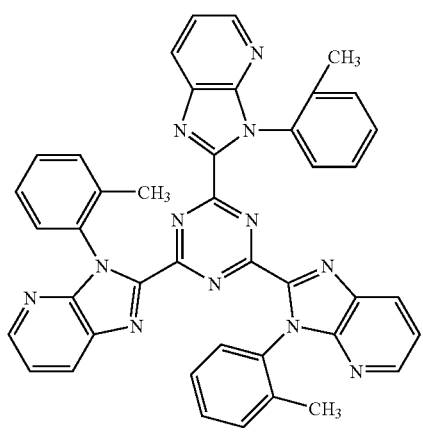
B-42
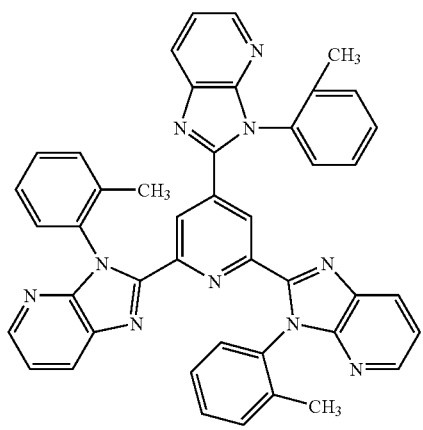
B-43
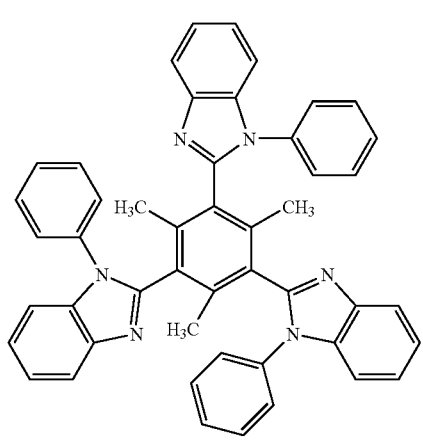
-continued
B-44
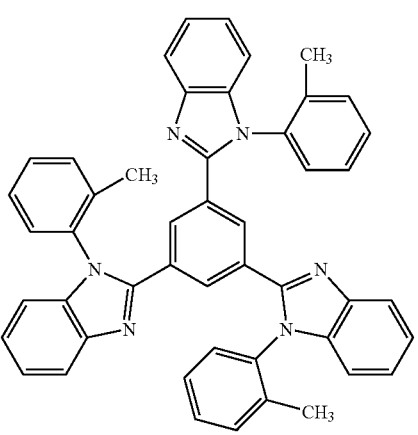
B-45
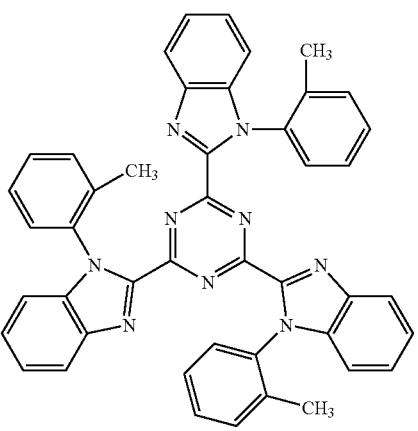
B-46
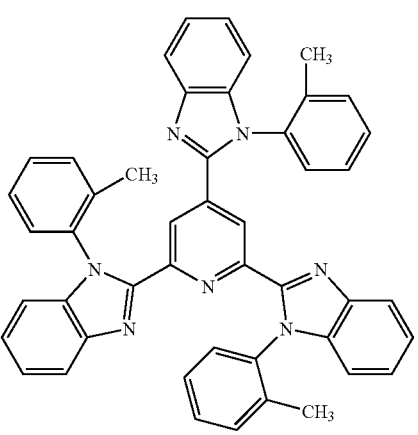

-continued
B-47
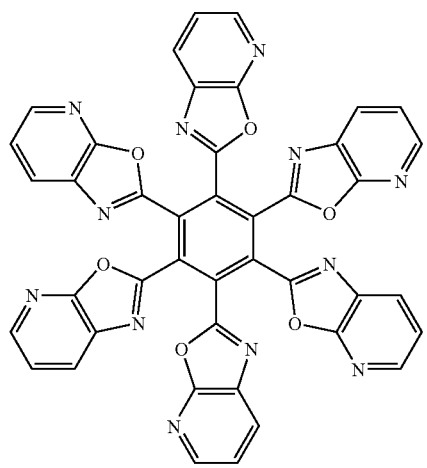
B-48
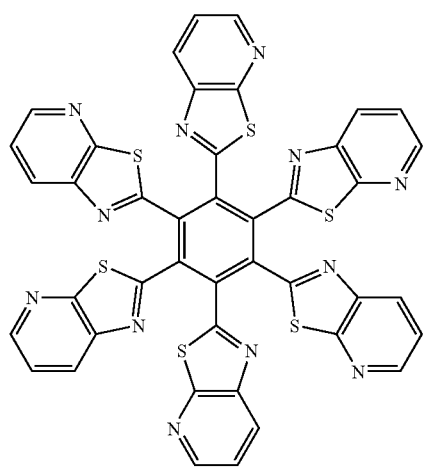
B-49
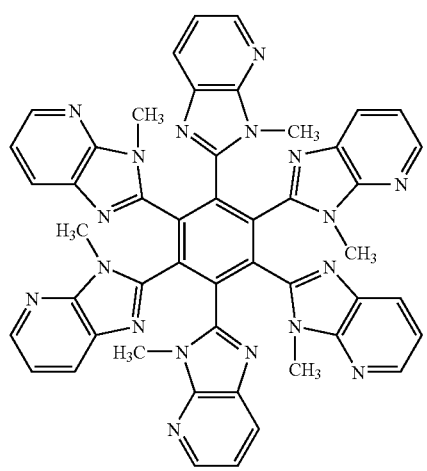
-continued
B-50
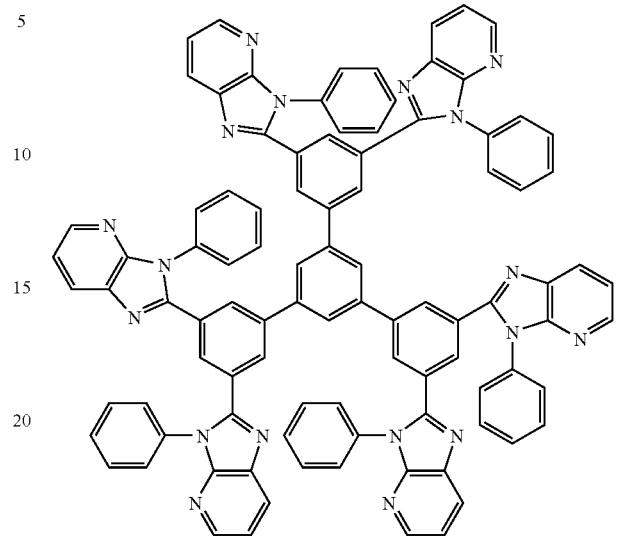
B-51
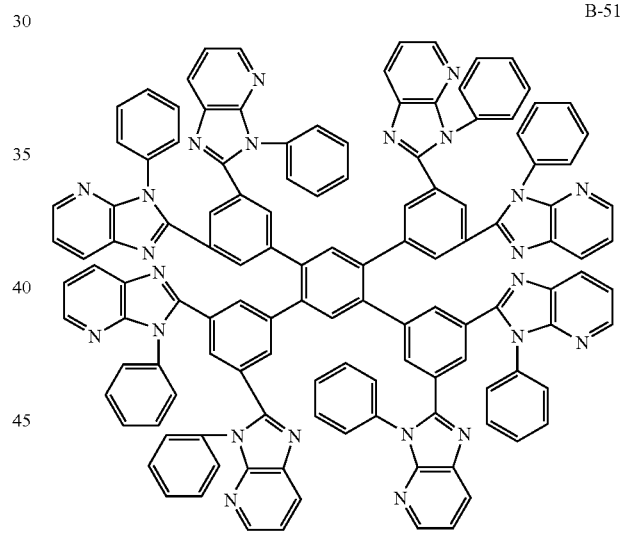
B-52
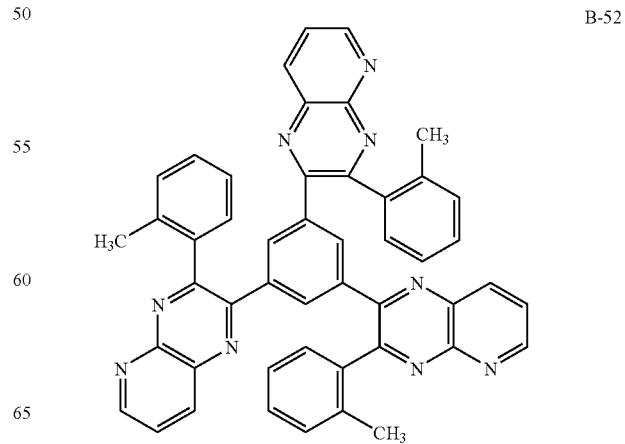

-continued
B-53
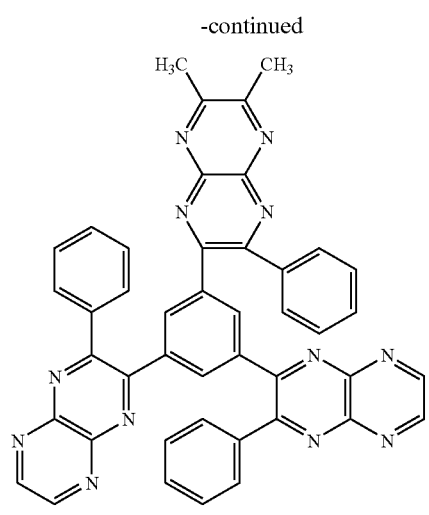
B-54
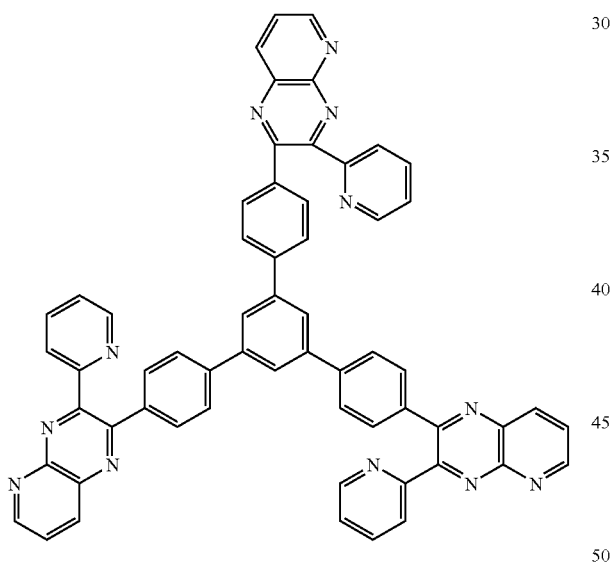
B-55
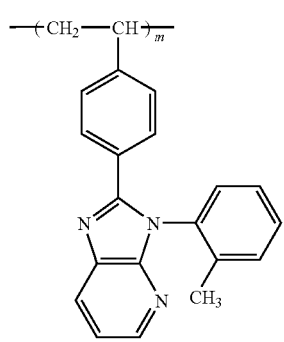
Weight average molecular weight: 21,000 (converted into polystyrene)
B-56
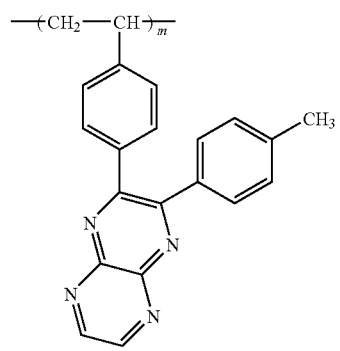
Weight average molecular weight: 14,000 (converted into polystyrene)
B-57
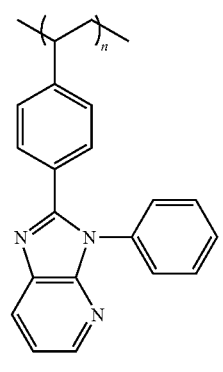
Mw: 84,000
B-58
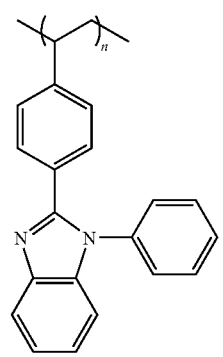
Mw: 100,000

B-59
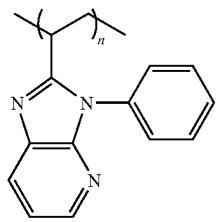
Mw: 71,000
(converted into polystyrene)
B-61
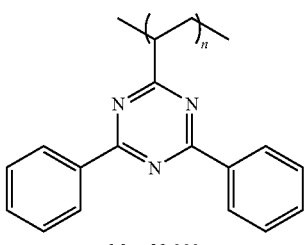
Mw: 32,000
(converted into polystyrene)
B-60
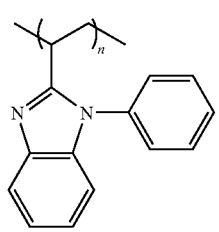
Mw: 14,000
(converted into polystyrene)
B-62
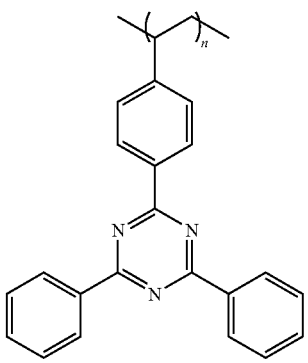
Mw: 110,000
(converted into polystyrene)
C-1
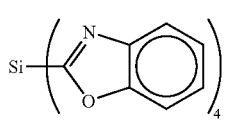
C-2
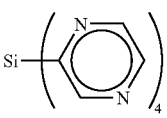
C-3
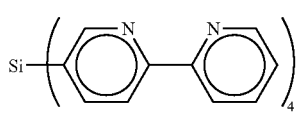
C-4
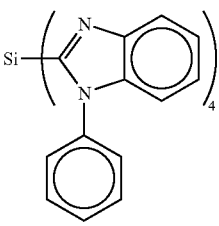
C-5
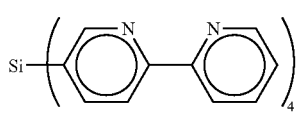
C-6
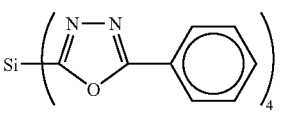

-continued
C-7
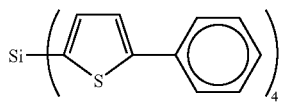
C-8
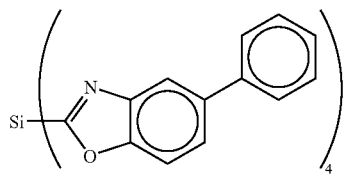
C-9
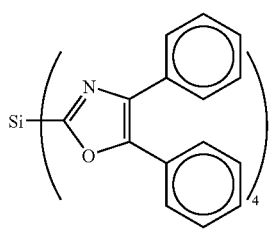
C-10
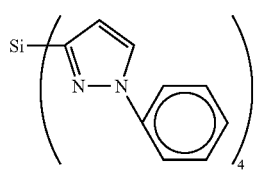
C-11
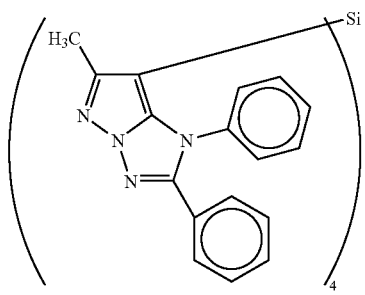
C-12
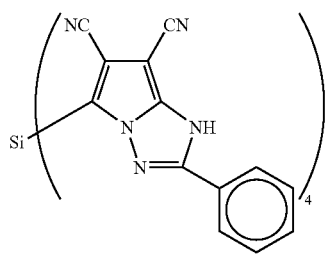
C-13
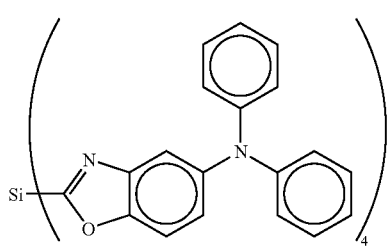
C-14
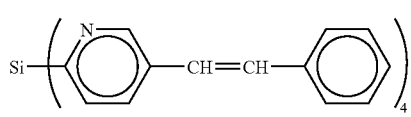
C-15
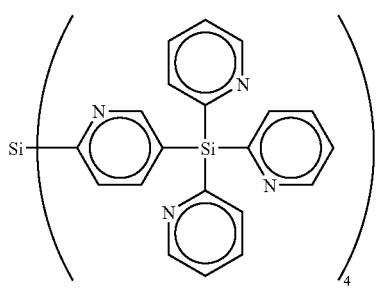
C-16
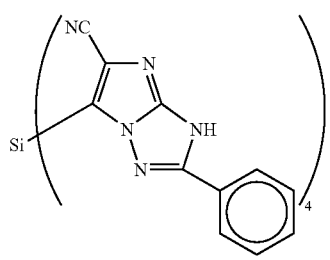
C-17
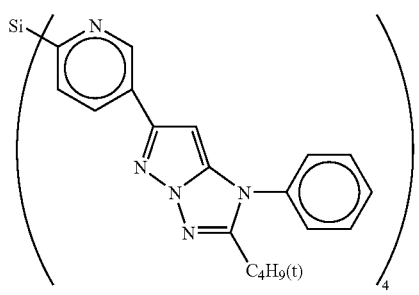
C-18
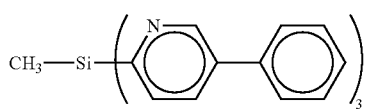

-continued
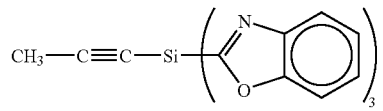 C-19
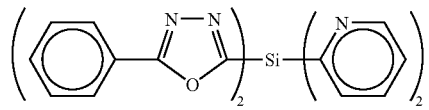 C-20
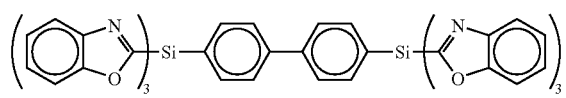 C-21
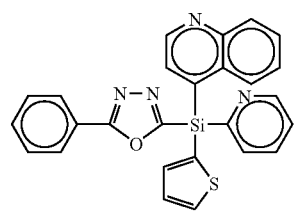 C-22
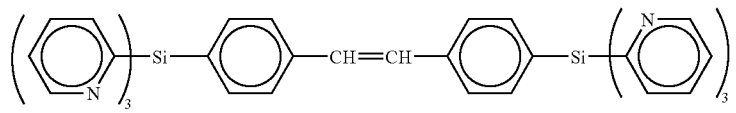 C-23
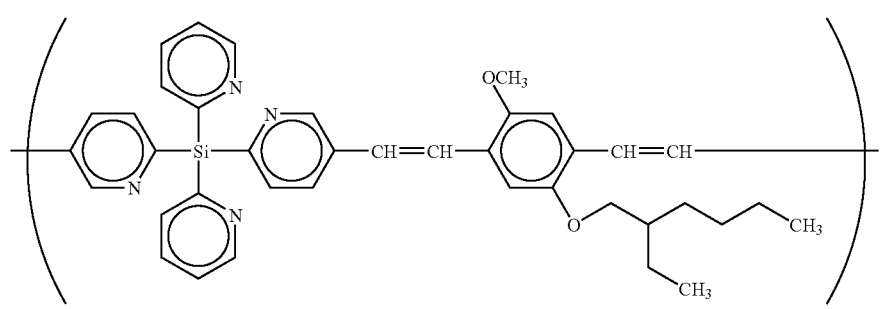 C-24

57
Weight average molecular weight: 12100
(converted into polystyrene)
58
Weight average molecular weight: 3200
(converted into polystyrene)
C-25
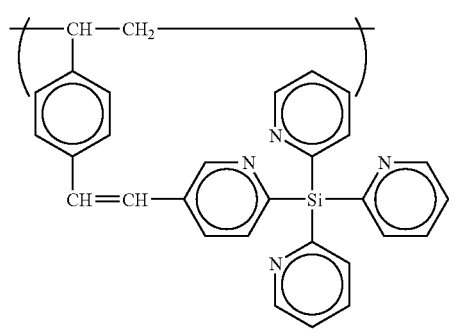
C-26
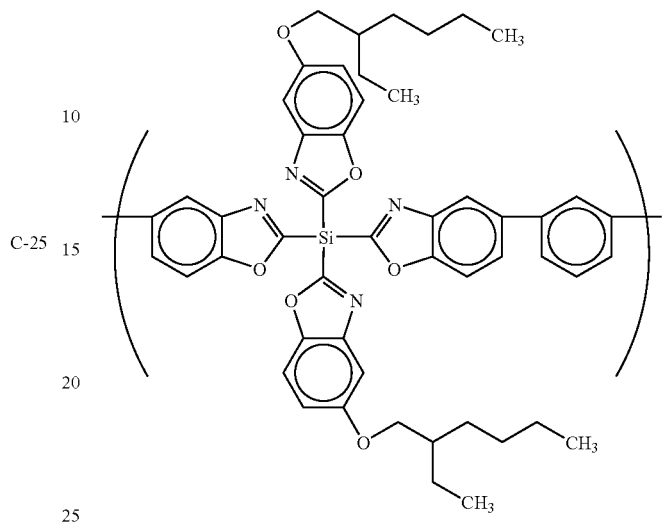
Weight average molecular weight: 4200
(converted into polystyrene)
C-27
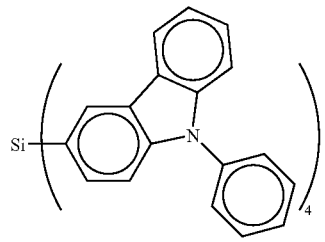
C-28
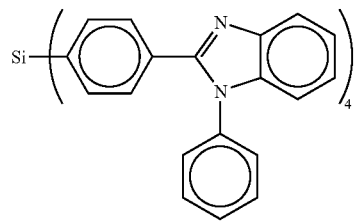
C-29
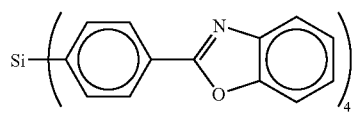
C-30
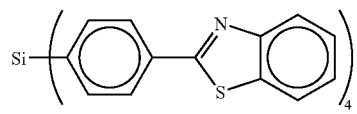
C-31
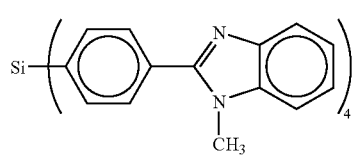
C-32
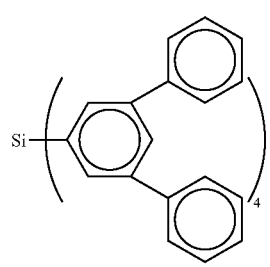

-continued
C-33
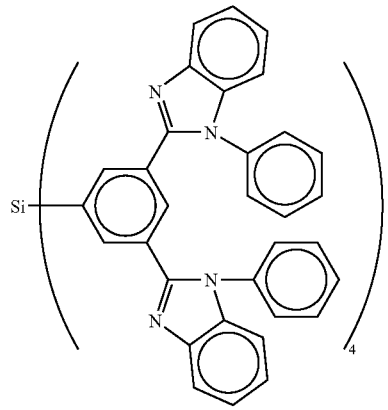
C-34
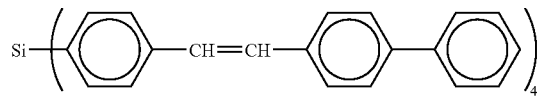
C-35
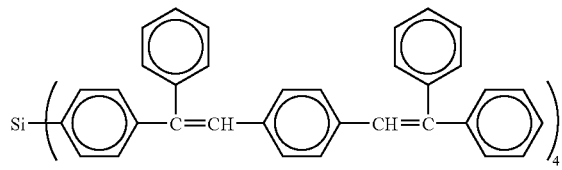
C-36
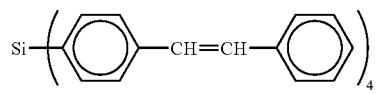
C-37
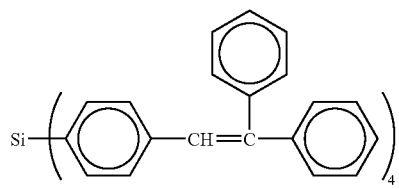
C-38
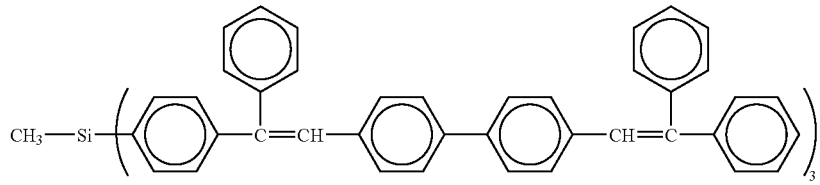
C-39
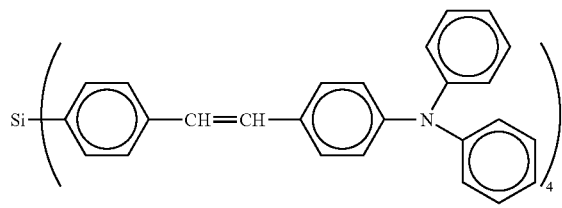
C-40
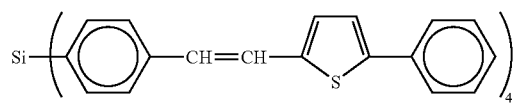
C-41
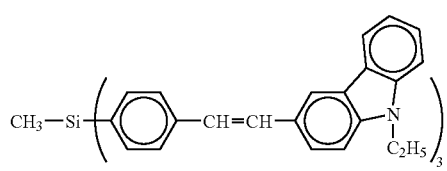
C-42
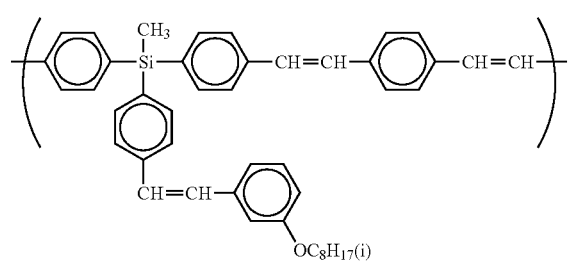
Mw = 7600
(converted into polystyrene)

-continued
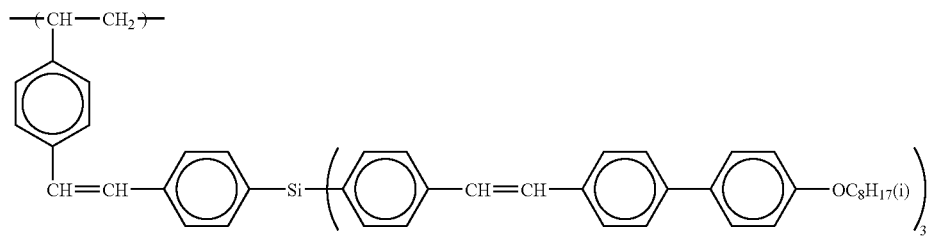
C-43
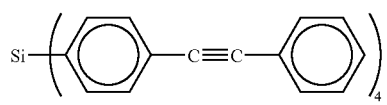
C-44
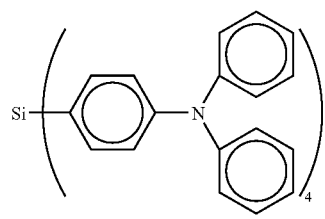
C-45
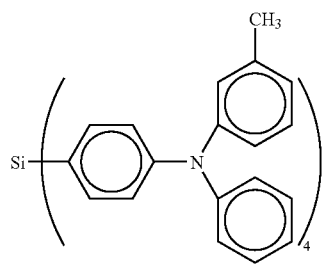
C-46
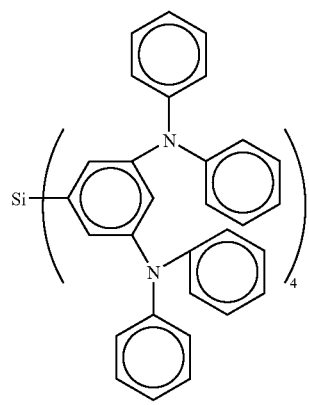
C-47
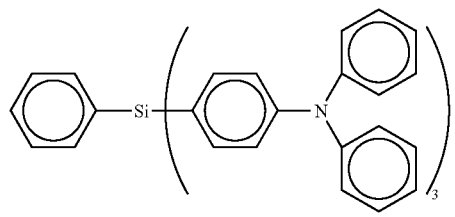
C-48
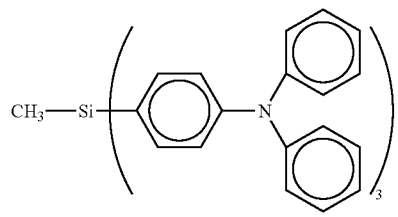
C-49
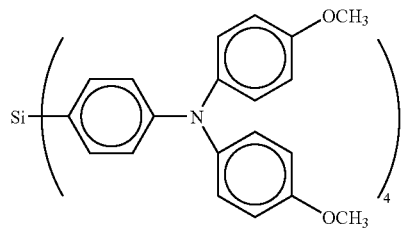
C-50
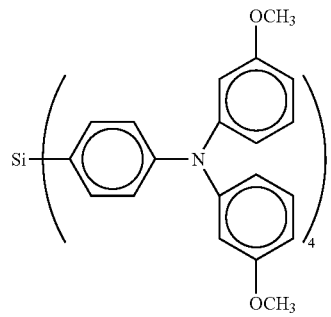
C-51

-continued
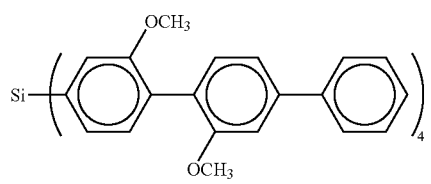
C-52
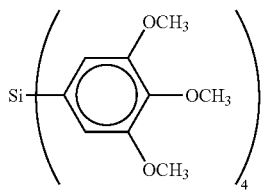
C-53
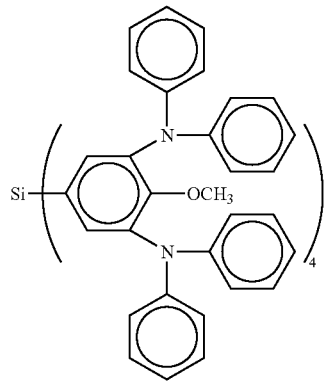
C-54
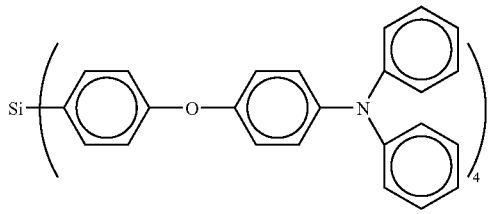
C-55
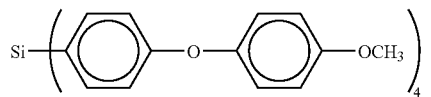
C-56
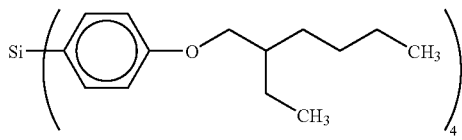
C-57
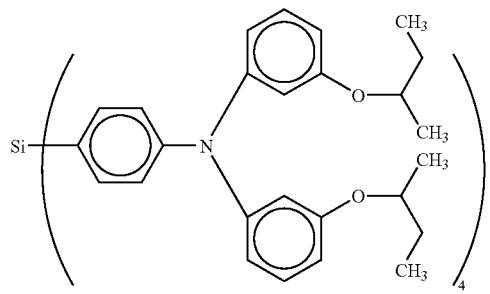
C-58
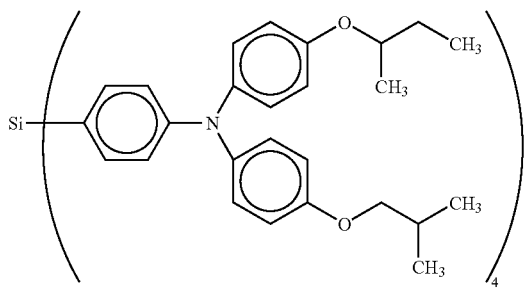
C-59
C-60
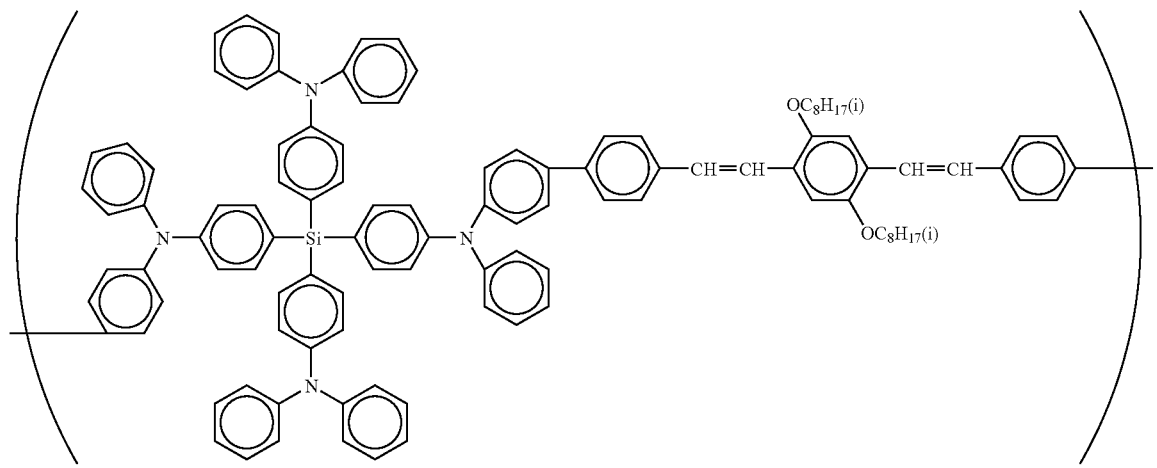
Mw = 8800
(converted into polystyrene)

-continued
C-61
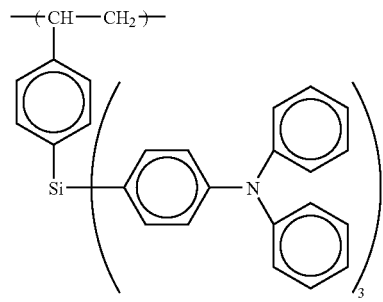
C-62
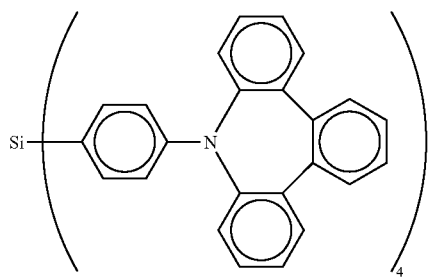
C-63
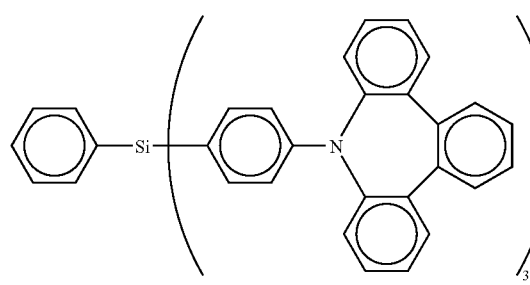
C-64
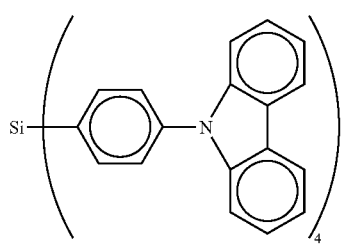
C-65
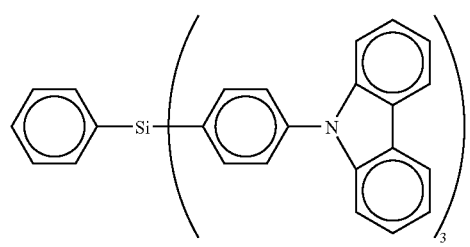
C-66
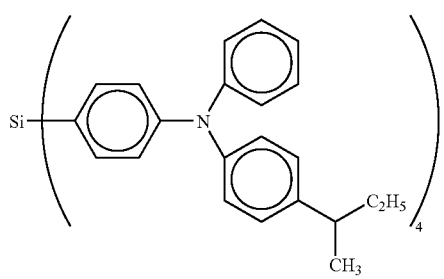
C-67
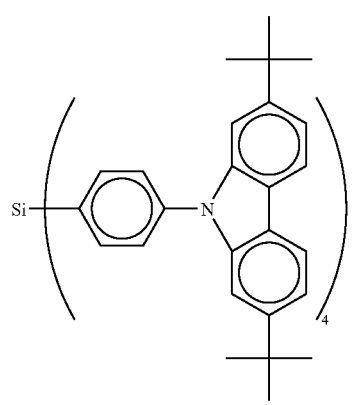
C-68
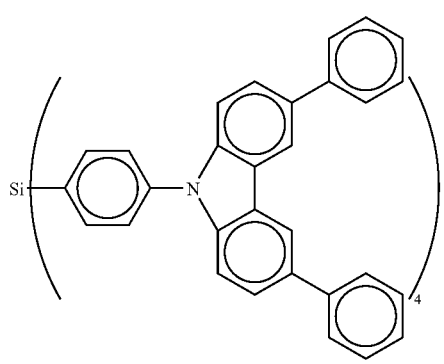

-continued
C-69
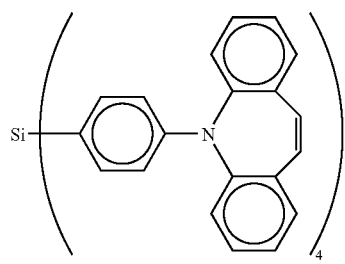
C-70
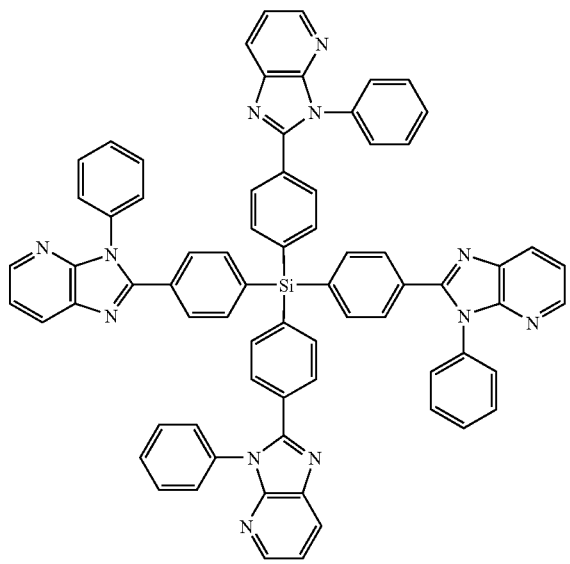
C-71
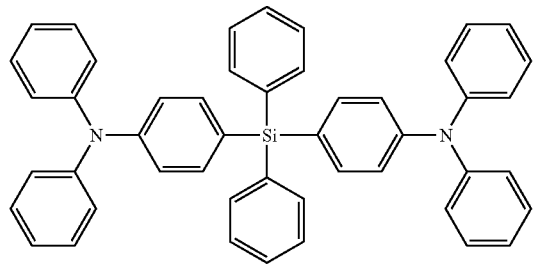
C-72
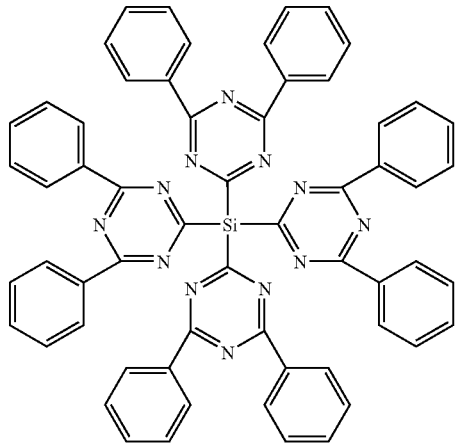
D-1
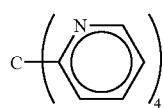
D-2
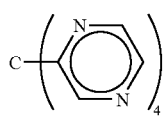
D-3
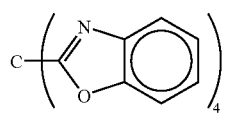
D-4
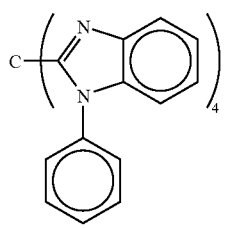
D-5
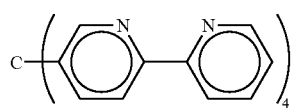
D-6
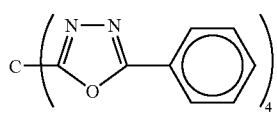

-continued
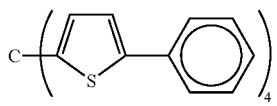
D-7
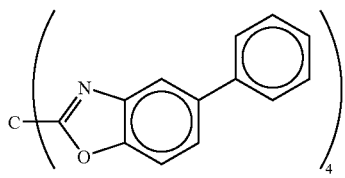
D-8
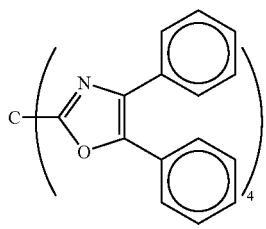
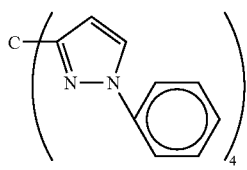
D-9
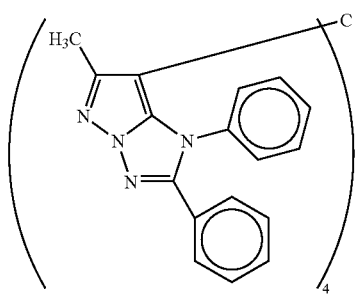
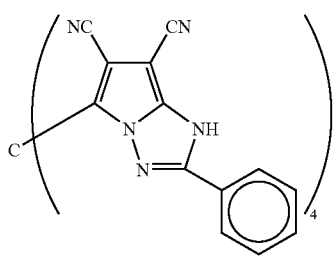
D-10
D-11
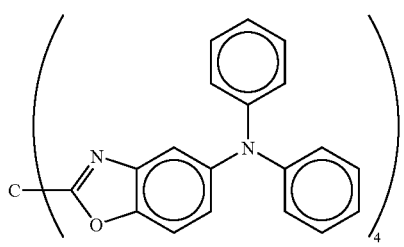
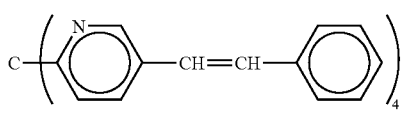
D-12
D-13
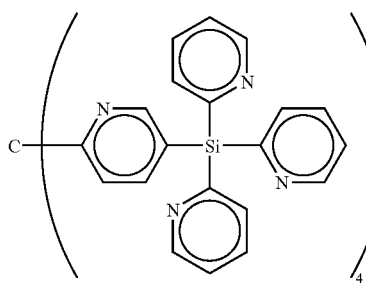
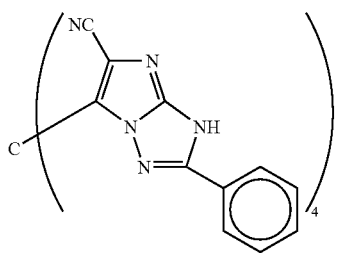
D-14
D-15
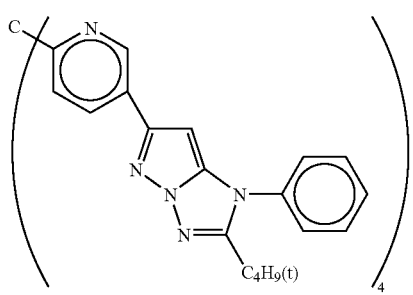
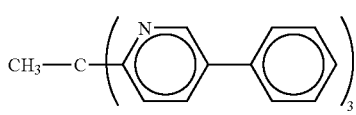
D-16
D-17
D-18

-continued
D-19 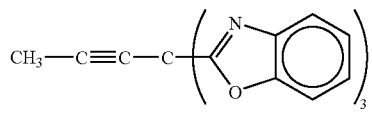
D-20 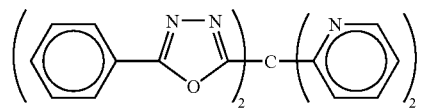
D-21 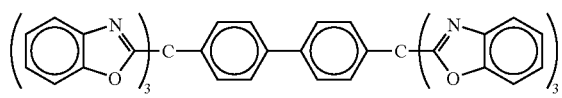
D-22 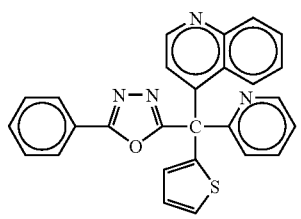
D-23 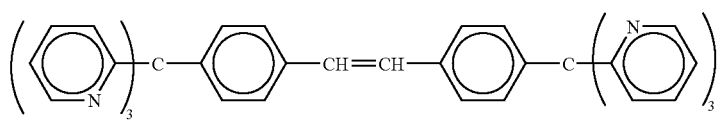
D-24 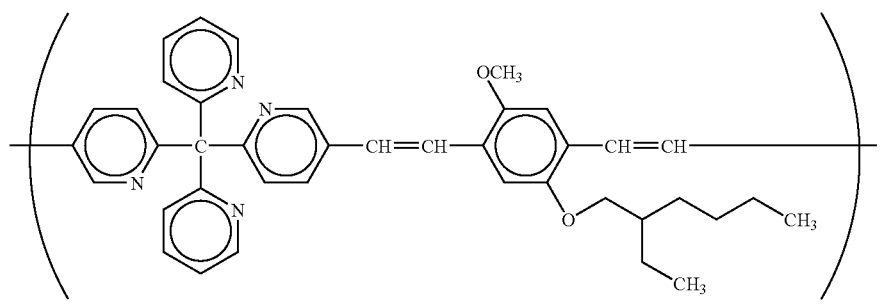
Mw = 12100
(converted into polystyrene)
D-25 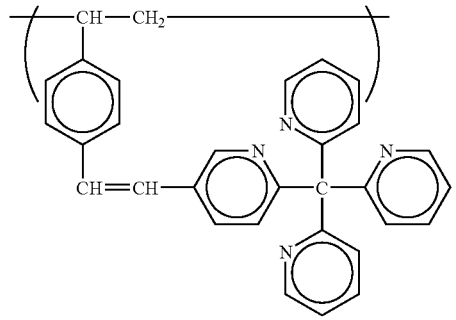
Mw = 3200
(converted into polystyrene)
D-26 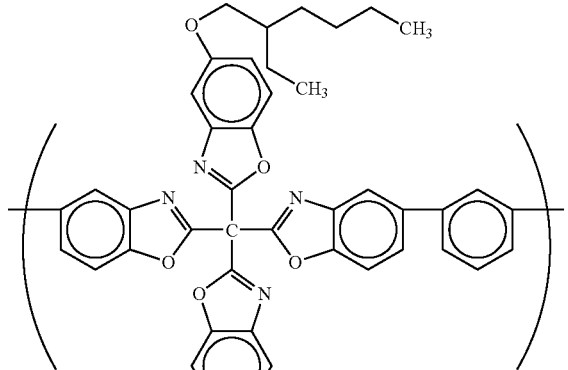
Mw = 4200
(converted into polystyrene)

-continued
D-27
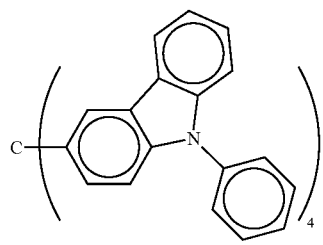
D-28
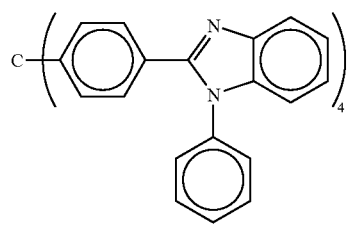
D-29
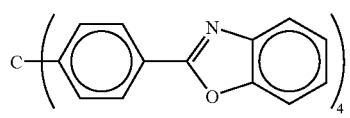
D-30
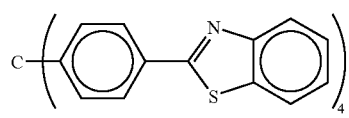
D-31
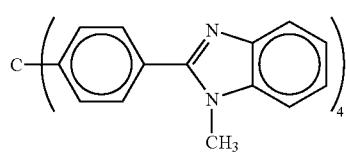
D-32
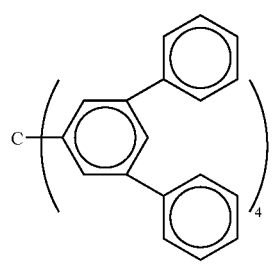
D-33
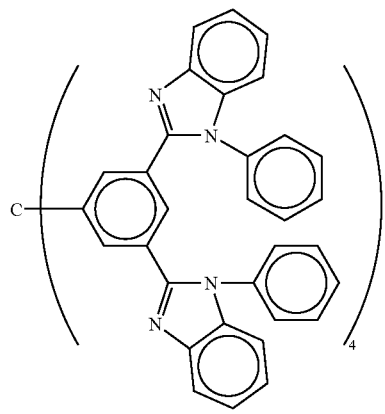
D-34
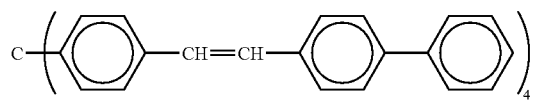
D-35
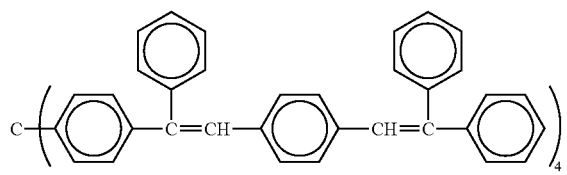
D-36
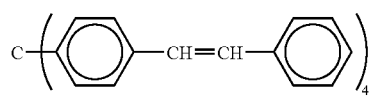
D-37
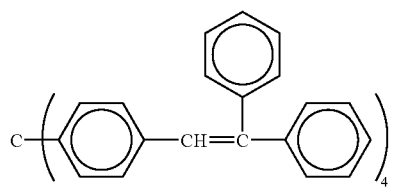

-continued
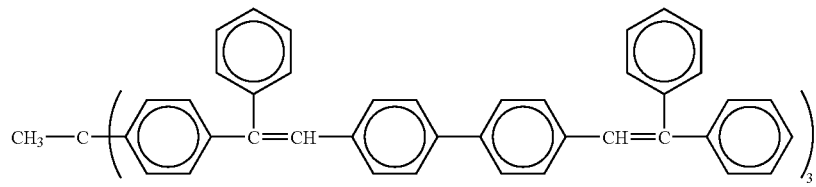
D-38
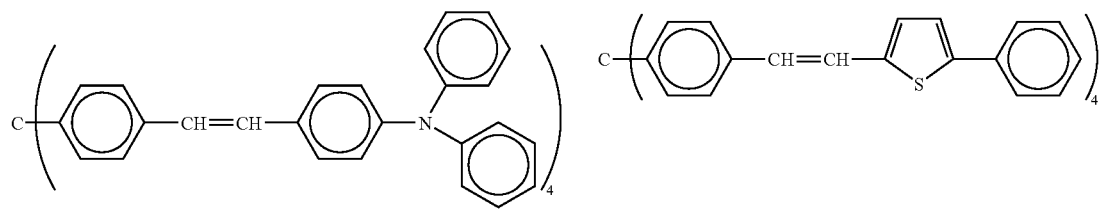
D-39
D-40
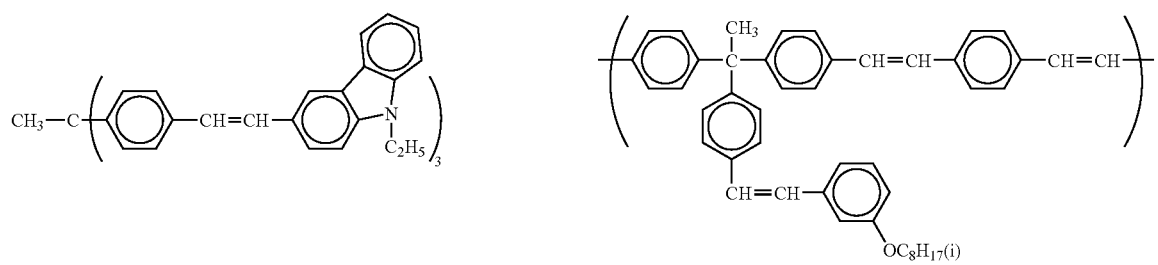
D-41
D-42
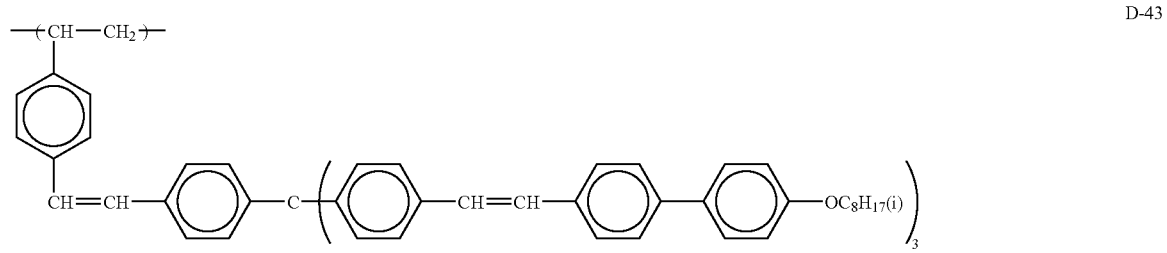
D-43
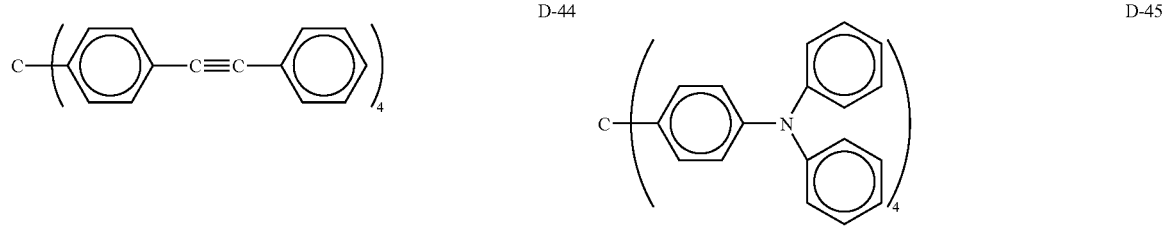
D-44
D-45

-continued
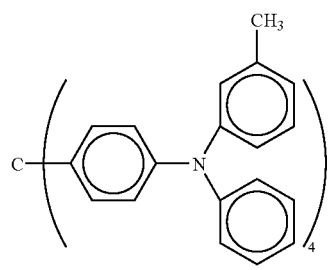
D-46
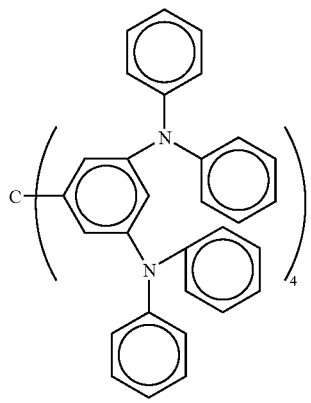
D-47
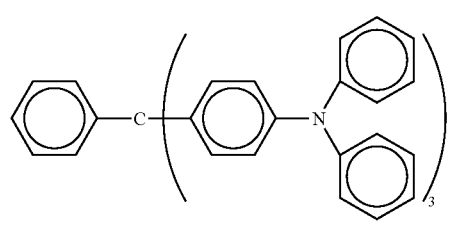
D-48
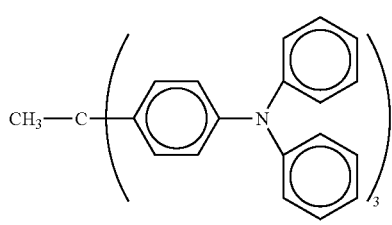
D-49
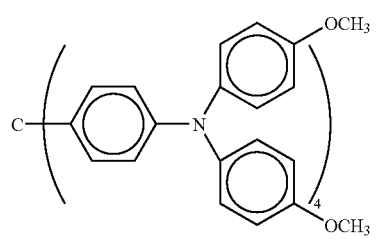
D-50
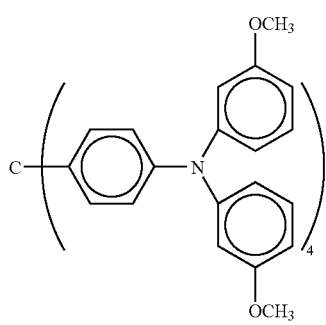
D-51
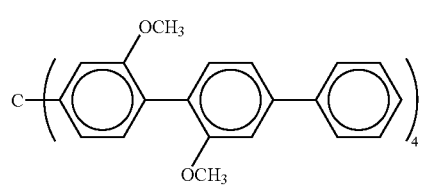
D-52
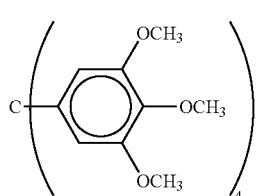
D-53
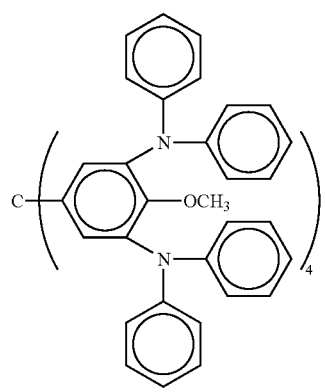
D-54
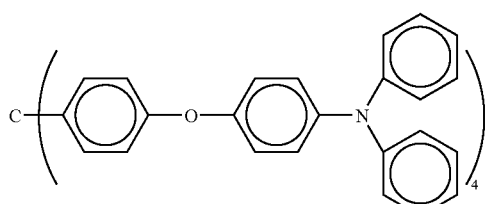
D-55

-continued
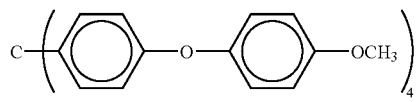
D-56
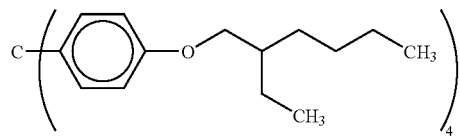
D-57
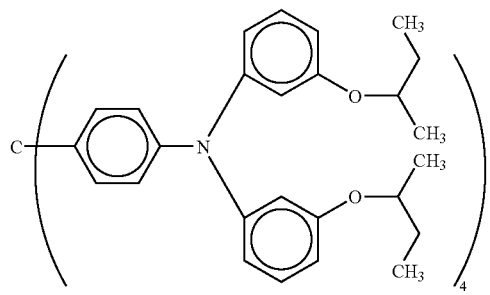
D-58
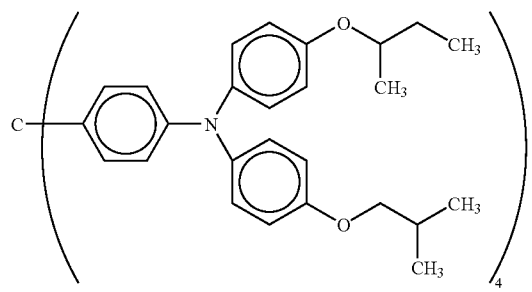
D-59
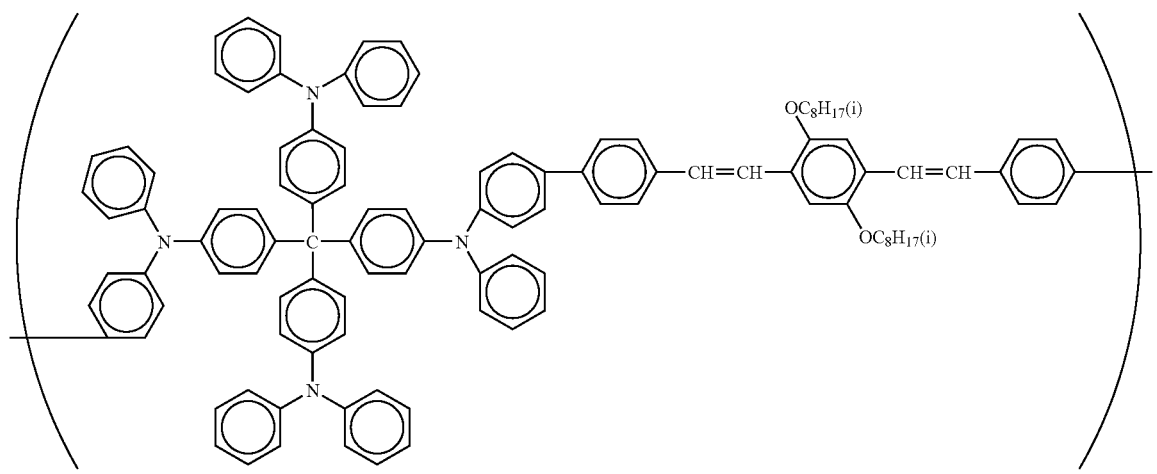
D-60
Mw = 8800
(converted into polystyrene)
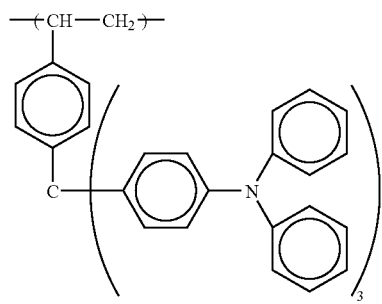
D-61
Mw = 10200
(converted into polystyrene)
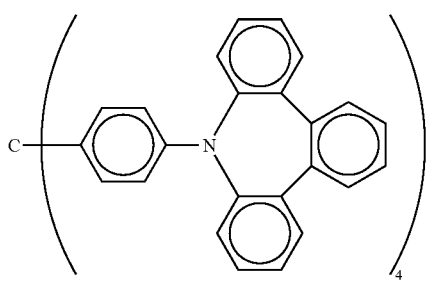
D-62

-continued
D-63
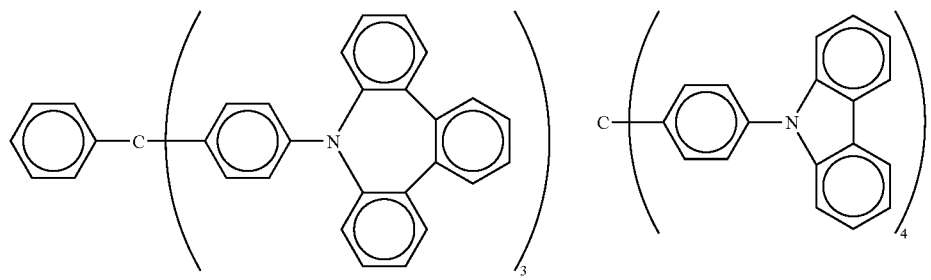
D-64
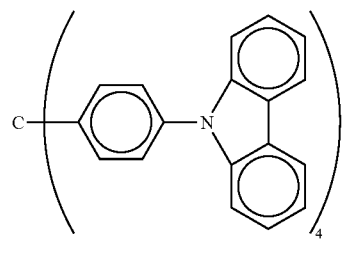
D-65
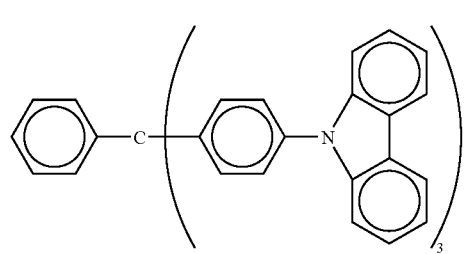
D-66
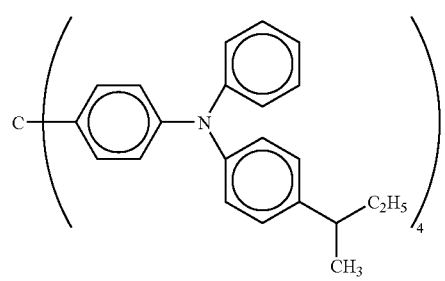
D-67
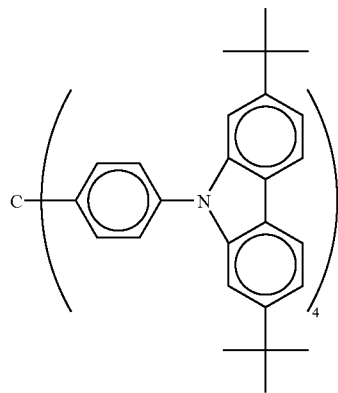
D-68
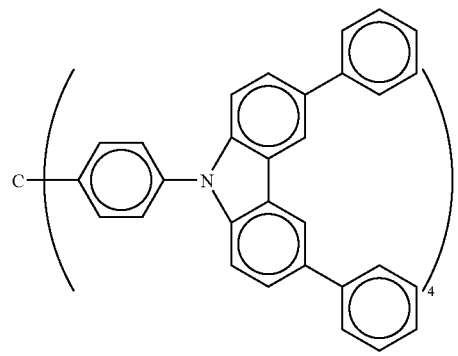
D-69
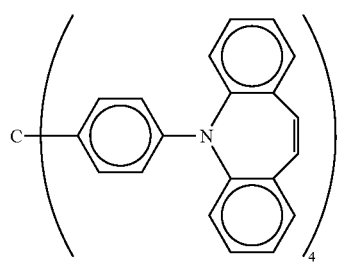
D-70
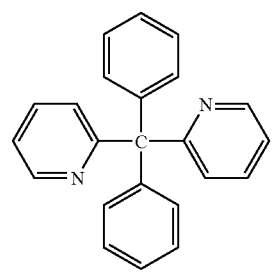

-continued
D-71
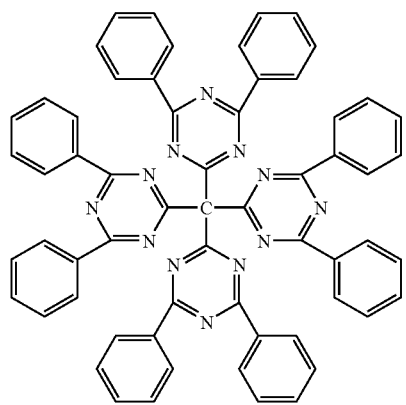
D-72
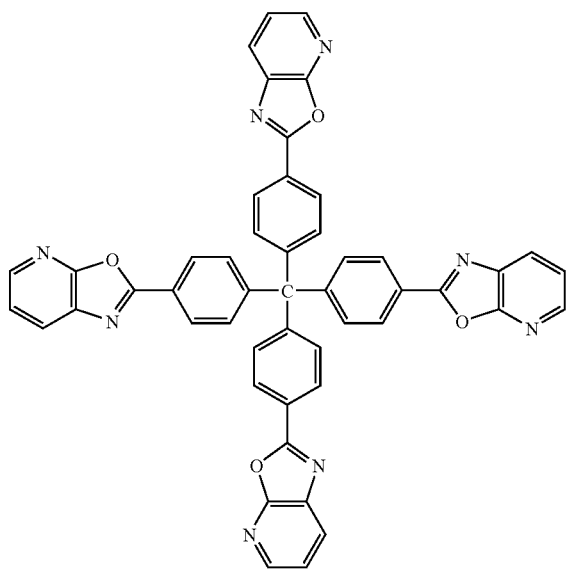
D-73
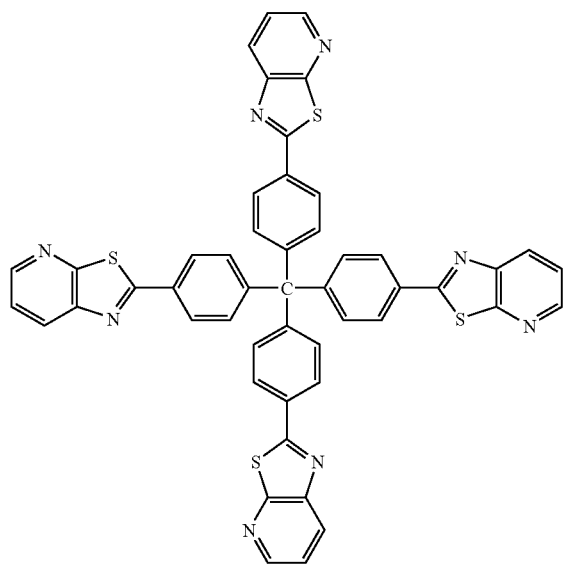
D-74
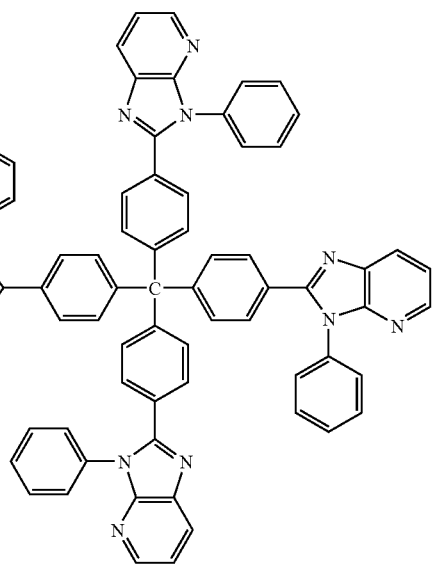

-continued
D-75
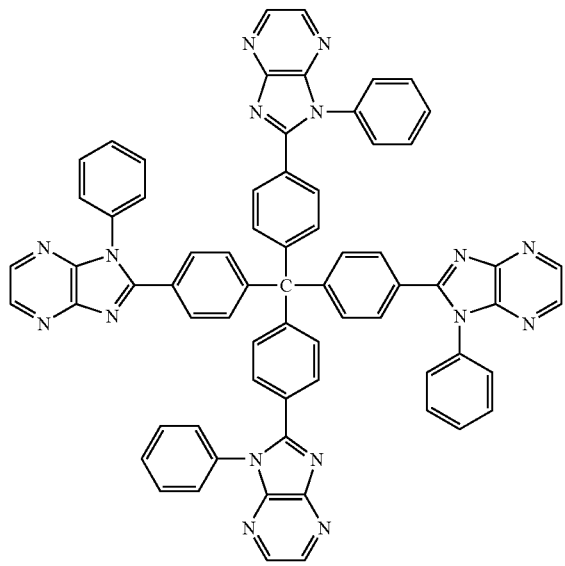
E-1
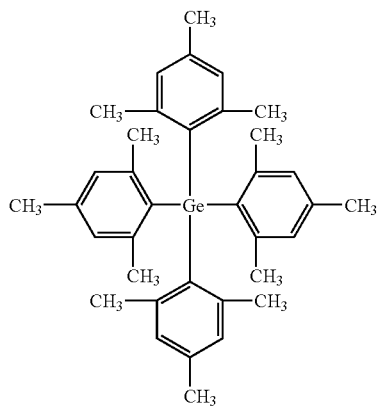
E-2
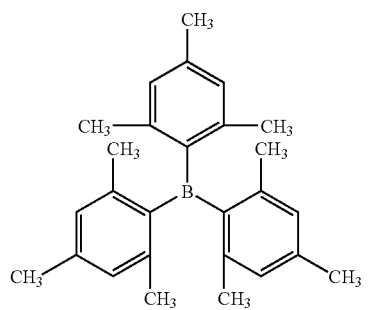
E-3
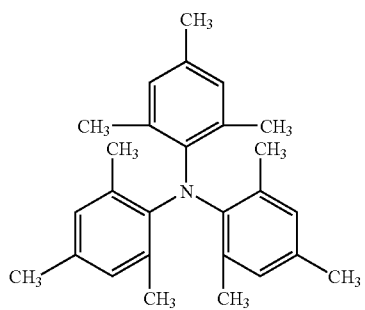
E-4
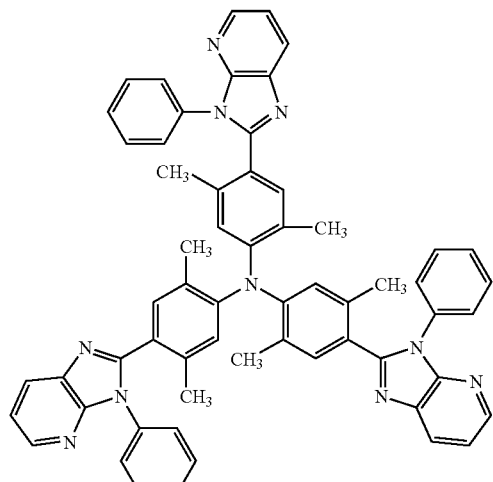
E-5
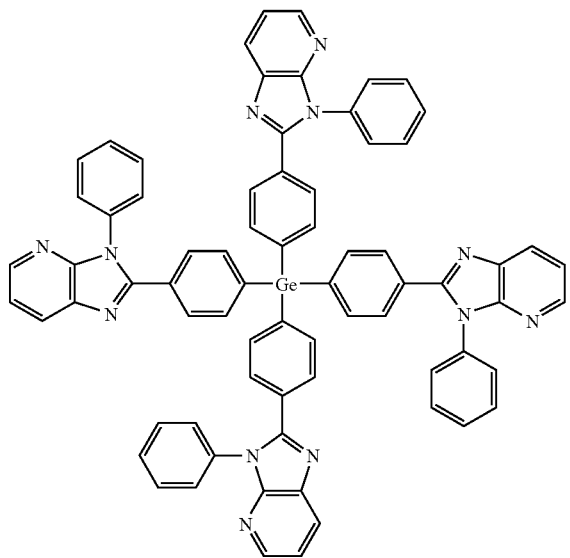

Next, synthesis examples of the exemplified compounds will be described.

SYNTHESIS EXAMPLE 1

Synthesis of Exemplified Compound A-7

3.17 g (8.0 mmol) of 1,3,5-tris(2-aminophenylamino)benzene was dissolved in 50 ml of dimethylacetoamide, and 5 ml (36 mmol) of triethylamine was added thereto under an atmosphere of nitrogen. After cooling to the temperature of 0° C. or lower, 2.0 ml (26.4 mmol) of acetylchloride was gently dropped into the mixture so as to maintain the temperature of 0° C. or lower. About one hour after the dropping was completed, the temperature was maintained at 0° C. or lower, and the temperature was gradually raised and the resulting product was stirred for 5 hours. A reaction solution was poured into 300 ml of water and a solid matter thus deposited was filtered out and washed with water. The obtained solid matter, 1 g of p-toluene sulfonic acid monohydrate, and 100 ml of xylene were heat-refluxed for about 10 hours. The solvent was removed under a reduced pressure, and thereafter, a condensate thus obtained was purified with silica gel column chromatography (eluent: chloroform/methanol=100/1 (vol/vol)), and then recrystallized with ethylacetate, thereby obtaining 0.24 g of the exemplified compound A-7 (0.51 mmol) (yield: 6.4%).

SYNTHESIS EXAMPLE 2

Synthesis of Exemplified Compound A-19

3.69 g (20 mmol) of cyanuric chloride, 8.72 g (66 mmol) of 2-methylbenzimidazole, 41.6 g (180 mmol) of rubidium carbonate, 0.135 g (0.6 mmol) of palladium acetate, 0.44 ml (1.8 mmol) of tri-tert-butylphosphine, and 70 ml of o-xylene were mixed and heated under an atmosphere of nitrogen at 120° C. for 6 hours. After cooling to room temperature, a solid matter was filtered out, and washed with chloroform. An organic layer thus formed was washed with water, and thereafter, dried with magnesium sulfuric anhydride, and the solvent was removed under a reduced pressure. The condensate was purified with silica gel column chromatography (eluent: chloroform/methanol=100/1 (vol/vol)), and thereafter, recrystallized with ethyl acetate to obtain 2.5 g (5.32 mmol) of the exemplified compound A-19 (yield: 27%).

The aforementioned luminescent material contains at least one compound having a light emission maximum wavelength from an exciton in the blue region. The light emission in the blue region is derived from a transition from the minimum exciton triplet energy ($T_1$) to the ground state. Examples of the light emitting material include transition metal complexes. Among these complexes, iridium complexes, osmium complexes and platinum complexes are preferable in the point that these complexes have a high phosphorescence quantum yield and further improve the external quantum efficiency of the light emitting element. Iridium complexes and platinum complexes are more preferable and orthometalated iridium complexes are most preferable.

Examples of preferred transition metal complexes include compounds described in Japanese Patent Application Nos. 11-370353, 2000-287177, 2000-28178, 2000-299495, 2000-398907, 2001-33684, and 2001-45476.

As specific examples of the light emitting material, the following compounds (exemplified compounds K-1 to K-9) are given; however, light emitting materials used in the present invention are not limited to these examples.

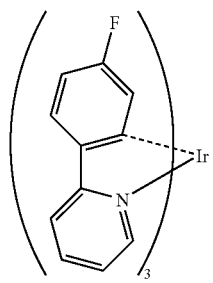

(K-1)

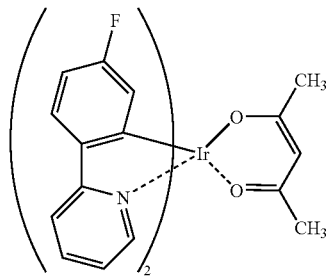

(K-2)

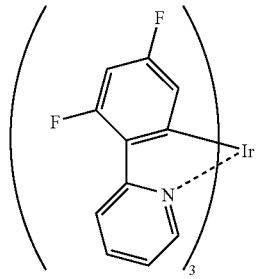

(K-3)

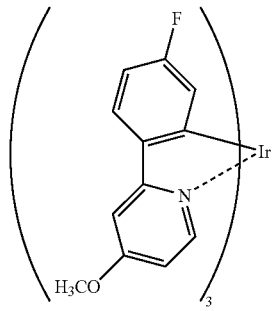

(K-4)

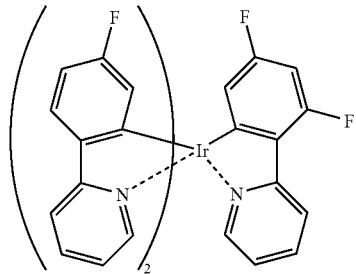

(K-5)

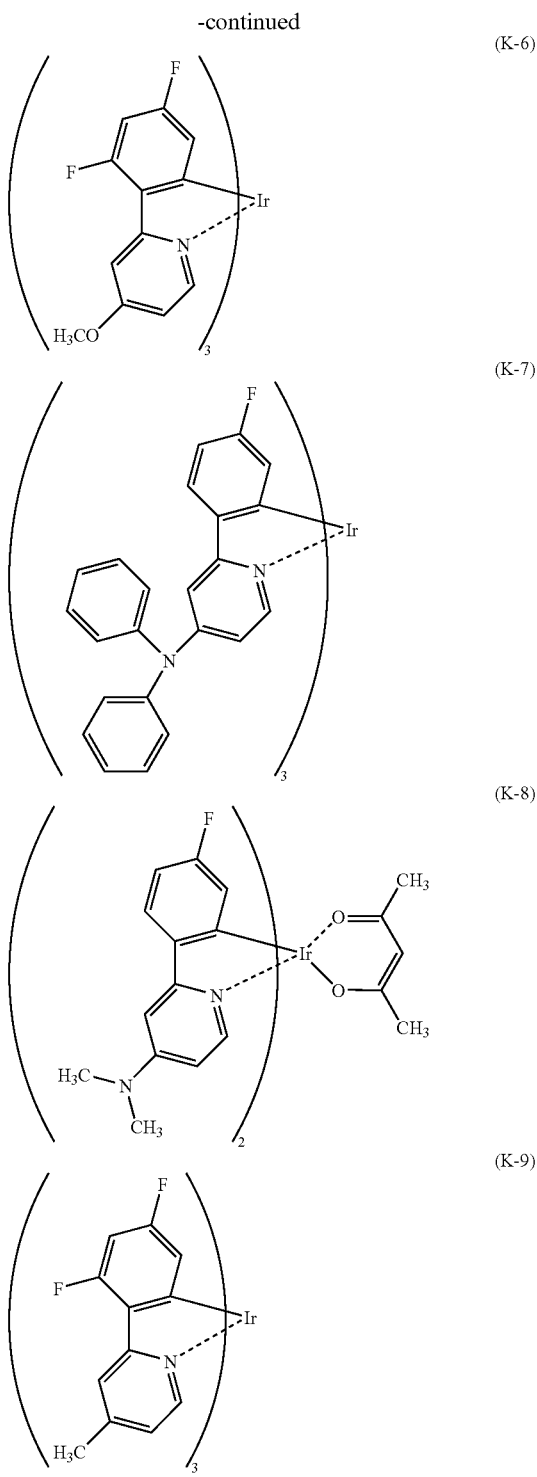

The aforementioned host material provides a field for the recombination of injected holes and electrons and also has the ability to transfer the energy of an exciton generated by the recombination to the guest. Given as examples of the host material are materials having a carbazole skeleton, materials having a diarylamine skeleton, materials having a pyridine skeleton, materials having a pyrazine skeleton, materials having a triazine skeleton and materials having an arylsilane skeleton.

In the light emitting element of the present invention, the light emitting layer may be formed by doping the host material with the light emitting material. For example, the light emitting layer may be formed by co-depositing the light emitting material and the host material. Moreover, the light emitting layer may be formed by utilizing a vacuum deposition method, LB method, ink jet method, printing method, transfer method or coating method (e.g., a spin coating method, casting method, dip coating method, or the like). The use of the aforementioned coating method is advantageous in reducing production costs. However, the coating method conventionally poses the problem that a light emitting element utilizing the above coating method is inferior in emission illuminance and luminance efficiency to those produced by a deposition method or the like. In the light emitting element of the present invention, when the layer disposed adjacent to the light emitting layer is formed of an organic material satisfying the above requirements, the luminance efficiency is improved. Therefore, a light emitting element having good luminance efficiency can be provided at low cost by producing this light emitting element utilizing the coating method.

In the coating method, a coating solution, in which the light emitting material is dissolved in a solvent, is prepared and the coating solution is applied to a desired position to form the light emitting layer. A resin may be dissolved or dispersed in the solvent together with the light emitting material to prepare the coating solution. Given as examples of the resin are polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethyl cellulose, polyvinyl acetate, ABS resins, polyurethane, melamine resins, unsaturated polyester resins, alkyd resins, epoxy resins, silicone resins, and the like.

A film thickness of the light emitting layer is generally preferably 1 nm to 5 μm, more preferably 5 nm to 1 μm and still more preferably 10 nm to 500 nm, though no particular limitation is imposed on the thickness.

In the light emitting layer, the weight ratio of the light emitting material to the host material is generally from 0.1% by weight to 20% by weight, preferably from 0.5% by weight to 15% by weight, and more preferably from 1.0% by weight to 10% by weight.

Materials used for the hole injecting layer and hole transporting layer have the ability to inject holes from an anode and to transport holes, respectively. These materials preferably have the ability to block electrons injected from a cathode in addition to the above abilities.

Specific examples of the hole transporting material and hole injecting material include carbazole derivatives, imidazole derivatives, triazole derivatives, oxazole derivatives, oxadiazole derivatives, polyarylalkane derivatives, pyrazoline derivatives, pyrazolone derivatives, phenylenediamine derivatives, arylamine derivatives, amino substituted calcon derivatives, styrylanthracene derivatives, fluorenone derivatives, hydrazone derivatives, stilbene derivatives, silazane derivatives, aromatic tertiary amine compounds, styrylamine derivatives, aromatic dimethylidyne derivatives, porphyrin derivatives, polysilane derivatives, poly(N-vinylcarbazole) derivatives, aniline type copolymers, thiophene oligomers, electroconductive polymers and oligomers such as polythiophene, organic silane derivatives and organic phosphine derivatives.

The hole injecting layer and hole transporting layer may have either a monolayer structure comprising one or two types selected from the above materials or a multilayer structure comprising plural layers having the same compositions or different compositions.

In a case where the hole transporting layer or the hole injecting layer is disposed adjacent to the light emitting layer, the $T_1$ level of the hole transporting material or hole injecting material is preferably higher than the $T_1$ level of the light emitting material. The $T_1$ level of the hole transporting material or hole injecting material is preferably more than 1.05 times and more preferably more than 1.1 times the $T_1$ level of the light emitting material. The $T_1$ level of the hole transporting material or hole injecting material is preferably from 68 kcal/mol (284.9 kJ/mol) to 90 kcal/mol (377.1 kJ/mol), more preferably from 69 kcal/mol (289.1 kJ/mol) to 85 kcal/mol (356.2 kJ/mol) and still more preferably from 70 kcal/mol (293.3 kJ/mol) to 80 kcal/mol (335.2 kJ/mol).

In a case where the hole transporting layer or the hole injecting layer is disposed adjacent to the light emitting layer and has a multilayer structure, the $T_1$ level of each of all hole transporting materials and hole injecting materials contained in the multilayer is preferably higher than the $T_1$ level of the light emitting material.

Examples of a method of forming the hole injecting layer and the hole transporting layer include a vacuum deposition method, LB method, ink jet method, printing method, coating method (e.g., a spin coating method, casting method, dip coating method and the like), and transfer method similarly to the method of forming the light emitting layer. When a coating solution to be used for the coating method is prepared, a resin may be used. Examples of the resin include the same resins that are exemplified as being usable for the preparation of the coating solution used in the formation of the light emitting layer.

A film thickness of each of the hole injecting layer and the hole transporting layer is preferably 1 nm to 5 μm, more preferably 5 nm to 1 μm and still more preferably 10 nm to 500 nm in general, though there is no particular limitation to the thickness.

Materials used for the electron injecting layer and the electron transporting layer have the ability to inject electrons from a cathode and to transport electrons, respectively. These materials preferably have the ability to block holes injected from an anode in addition to the above abilities.

Specific examples of the electron injecting material and electron transporting material include various metal complexes represented by metal complexes of imidazole derivatives, triazole derivatives, triazine derivatives, oxazole derivatives, oxadiazole derivatives, fluorenone derivatives, anthraquinodimethane derivatives, anthrone derivatives, diphenylquinone derivatives, thiopyranedioxide derivatives, carbodiimide derivatives, fluorenylidenemethane derivatives, distyrylpyrazine derivatives, cyclic tetracarboxylic acid of aromatic compound such as perylene and naphthalene, phthalocyanine derivatives or 8-quinolinol derivatives and by metal complexes containing metal phthalocyanine, benzoxazole or benzothiazole as a ligand and organosilane derivatives. The electron injecting layer and electron transporting layer may have either a monolayer structure comprising one or two types selected from the above materials or a multilayer structure comprising plural layers having the same compositions or different compositions.

In a case where the electron transporting layer or the electron injecting layer is disposed adjacent to the light emitting layer, the $T_1$ level of the electron transporting material or electron injecting material is preferably higher than the $T_1$ level of the light emitting material. The $T_1$ level of the electron transporting material or electron injecting material is preferably more than 1.05 times and more preferably more than 1.1 times the $T_1$ level of the light emitting material. The $T_1$ level of the electron transporting material or electron injecting material is preferably from 68 kcal/mol (284.9 kJ/mol) to 90 kcal/mol (377.1 kJ/mol), more preferably from 69 kcal/mol (289.1 kJ/mol) to 85 kcal/mol (356.2 kJ/mol) and still more preferably from 70 kcal/mol (293.3 kJ/mol) to 80 kcal/mol (335.2 kJ/mol).

In a case where the electron transporting layer or the electron injecting layer is disposed adjacent to the light emitting layer and has a multilayer structure, the $T_1$ level of each of all electron transporting materials and electron injecting materials contained in the multilayer is preferably higher than the $T_1$ level of the light emitting material.

Examples of a method of forming the electron injecting layer and the electron transporting layer include a vacuum deposition method, LB method, ink jet method, printing method, coating method (e.g., a spin coating method, casting method, dip coating method and the like), and transfer method similarly to the method of forming the light emitting layer. When a coating solution to be used for the coating method is prepared, a resin may be used. Examples of the resin include the same resins that are exemplified as being usable for the preparation of the coating solution used in the formation of the light emitting layer.

A film thickness of each of the electron injecting layer and the electron transporting layer is preferably 1 nm to 5 μm, more preferably 5 nm to 1 μm and still more preferably 10 nm to 500 nm in general, though there is no particular limitation to the thickness.

Materials for the protective layer may be those having the ability to prevent the intrusion of a material, such as water and oxygen promoting elemental deterioration, into the element. Specific examples of such a material include metals such as In, Sn, Pb, Au, Cu, Ag, Al, Ti and Ni, metal oxides such as MgO, SiO, $SiO_2$, $Al2O_3$, GeO, NiO, CaO, BaO, $Fe_2O_3$, $Y_2O_3$ and $TiO_2$, nitrides such as $SiN_x$ and $SiN_xO_y$, metal fluorides such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, copolymers of chlorotrifluoroethylene and dichlorodifluoroethylene, copolymers obtained by copolymerizing tetrafluoroethylene and a monomer mixture containing at least one comonomer, fluorine-containing copolymers having a cyclic structure on a copolymer principal chain, water-absorbable materials having an absorption coefficient of 1% or more and moisture proof materials having an absorption coefficient of 0.1% or less.

No particular limitation is imposed on a method of forming the protective layer. As the method, for example, a vacuum deposition method, sputtering method, reactive sputtering method, MBE (molecular beam epitaxy) method, cluster ion beam method, ion plating method, plasma polymerization method (high frequency excitation ion plating method), plasma CVD method, laser CVD method, thermal CVD method, gas source CVD method, coating method, ink jet method, printing method, and transfer method may be applied.

Materials constituting the anode serves to supply holes to the hole injecting layer, hole transporting layer and light emitting layer. As the material, a metal, alloy, metal oxide, electroconductive compound or a mixture of these materials may be used. Preferable materials are those having a working function of 4 eV or more. Specific examples of these materials include conductive metal oxides such as tin oxide, zinc oxide, indium oxide, indium tin oxide (ITO), metals such as gold, silver, chromium and nickel, mixtures or laminates of these metals and conductive metal oxides, inorganic conductive materials such as copper iodide and copper sulfide, organic conductive materials such as polyaniline, polythiophene and polypyrrole and laminates of these materials and ITO. Among these materials, conductive metal oxides are preferable and ITO is particularly preferable in view of productivity, high conductivity and transparency.

Although a film thickness of the anode may be selected optionally according to the type of material, it is in a range preferably from 10 nm to 5 µm, more preferably from 50 nm to 1 µm and still more preferably from 100 nm to 500 nm in general.

As the anode, an electrode obtained by forming a layer on soda lime glass, non-alkali glass and a transparent resin substrate is usually used. When glass is used as the substrate, non-alkali glass is preferably used as the glass material to decrease the elution of ions from the glass. Also, when soda lime glass is used, glass which is coated with silica as a barrier is preferably used. Although no particular limitation is imposed on the thickness of the substrate as far as it is enough to maintain the mechanical strength, a substrate having a thickness of generally 0.2 mm or more and preferably 0.7 mm or more is used when glass is used. For the formation of the anode, various methods are used according to the type of material. In a case of, for example, ITO, a film is formed using a method such as an electron beam method, sputtering method, resistance heating deposition method, chemical reaction method (sol-gel method) and method of applying a dispersion of ITO.

The driving voltage for the light emitting element can be reduced and the luminance efficiency can be raised by performing treatments such as washing and other treatments of the anode. For example, in a case of ITO, UV-ozone treatment and plasma treatment are effective.

A material constituting the cathode serves to supply electrons to the electron injecting layer, electron transporting layer, light emitting layer and the like and is selected in consideration of adhesion to the layers, such as the electron injecting layer, electron transporting layer and light emitting layer, disposed adjacent thereto, ionizing potential and stability. As the material of the cathode, a metal, alloy, metal oxide, electroconductive compound or mixture of these materials may be used. Specific examples include alkali metals (e.g., Li, Na, K, Cs and the like) or fluorides or oxides of these compounds, alkali earth metals (e.g., Mg and Ca) or fluorides or oxides of these compounds, gold, silver, lead, aluminum, sodium-potassium alloys or mixtures of this alloy and other metal, lithium-aluminum alloys or mixtures of this alloy and other metal, magnesium-silver alloys or mixtures of this alloy and other metal and rare earth metals such as indium and ytterbium. Materials having a working function of 4 eV or less are preferable and aluminum, lithium-aluminum alloys or mixtures of this alloy and other metal and magnesium-silver alloys or mixtures of this alloy and other metal are more preferable.

Although a film thickness of the cathode may be optionally selected, the cathode has a film thickness ranging preferably from 10 nm to 5 µm, more preferably from 50 nm to 1 µm and more preferably 100 nm to 1 µm in general.

The cathode is formed using a method such as an electron beam method, sputtering method, resistance heating deposition method and coating method. A metal can be deposited singly and two or more metal components may be deposited simultaneously. Moreover, plural metals may be deposited at the same time to form an alloy electrode. Also, an alloy prepared in advance may be deposited.

It is preferable that the sheet resistance of each of the anode and the cathode be lower and preferably several hundreds Ω/□ or less.

The light emitting element of the present invention may be served to applications in wide fields such as display elements, displays, back-up lights, electrophotographs, illumination light sources, recording light sources, reading light sources, beacons, signboards, interiors, and optical communication devices.

EXAMPLES

The present invention will be explained in more detail by way of examples, which, however, are not intended to be limiting of the present invention.

Example 1

An ITO substrate which was washed was placed in an evaporating apparatus and α-NPD(N,N'-diphenyl-N,N'-di(α-naphthyl)-benzidine) was deposited on the substrate in a thickness of 50 nm. CBP (biscarbazolylbenzidine) and the exemplified compound K-1 were co-deposited thereon in a ratio of 17:1 in a thickness of 36 nm. The exemplified compound B-40 was further deposited thereon in a thickness of 24 nm. A patterned mask (the emission area was designed to be 4 mm×5 mm) was placed on the organic thin film to co-deposit magnesium/silver (10:1) in a thickness of 250 nm. Thereafter, silver was deposited in a thickness of 300 nm to produce a light emitting element.

Example 2

A light emitting element was produced in the same manner as in Example 1 except that the exemplified compound A-10 was used in place of CBP in the manufacturing of the light emitting element of Example 1.

Example 3

A light emitting element was produced in the same manner as in Example 1 except that TPD(N,N'-diphenyl-N,N'-di(m-tolyl)-benzidine) was used in place of α-NPD in the manufacturing of the light emitting element of Example 1.

Example 4

A light emitting element was produced in the same manner as in Example 2 except that TPD was used in place of α-NPD in the manufacturing of the light emitting element of Example 2.

Example 5

A light emitting element was produced in the same manner as in Example 4 except that the exemplified compound D-46 was used in place of the exemplified compound A-10 in the manufacturing of the light emitting element of Example 4.

Example 6

A light emitting element was produced in the same manner as in Example 4 except that the exemplified compound C-71 was used in place of the exemplified compound A-10 in the manufacturing of the light emitting element of Example 4.

Example 7

A light emitting element was produced in the same manner as in Example 3 except that the exemplified compound K-3 was used in place of the exemplified compound K-1 in the manufacturing of the light emitting element of Example 3.

Example 8

A light emitting element was produced in the same manner as in Example 4 except that the exemplified compound K-3 was used in place of the exemplified compound K-1 in the manufacturing of the light emitting element of Example 4.

Example 9

A light emitting element was produced in such a manner that in the manufacturing of the light emitting element of Example 4, the exemplified compound A-19 was used in place of the exemplified compound B-40 to form an organic thin film, and a pattern mask (the emission area was designed to be 4 mm×5 mm) was placed on the organic thin film to deposit lithium fluoride in a thickness of 3 nm, and thereafter, aluminum was deposited in a thickness of 400 nm.

Example 10

A light emitting element was produced in the same manner as in Example 9 except that the exemplified compound K-3 was used in place of the exemplified compound K-1 in the manufacturing of the light emitting element of Example 9.

Comparative Example 1

A light emitting element was produced in the same manner as in Example 1 except that TPD was used in place of CBP in the manufacturing of the light emitting element of Example 1.

Comparative Example 2

A light emitting element was produced in the same manner as in Comparative Example 1 except that TPD was used in place of α-NPD and the exemplified compound K-3 was used in place of the exemplified example K-1 in the manufacturing of the light emitting element of Comparative Example 1.

Respective constitutional formulae of α-NPD, CBP, and TPD used in Examples and Comparative Examples are shown below.

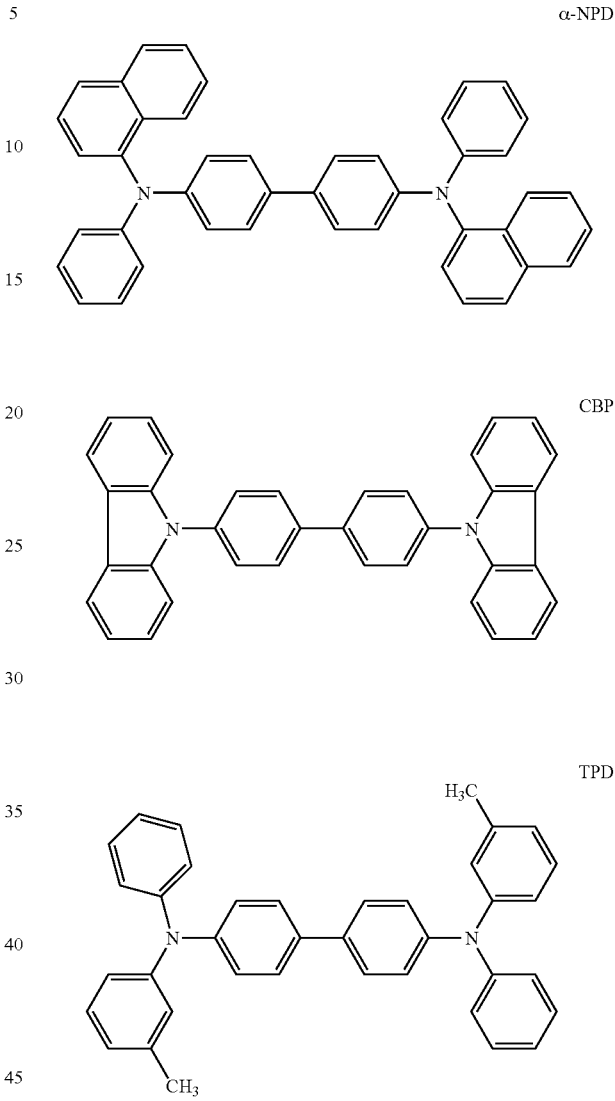

The minimum excitation triplet energy level $T_1$ of each of CBP, exemplified compounds A-10, D-46, and C-71, TPD, α-NPD, exemplified compounds K-1, K-3, B-40, and A-19, which were used in Examples and Comparative Examples was measured. Specifically, the phosphorescence spectrum of each material was measured (10 μmol/l EPA (diethyl ether: isopentane:isopropyl alcohol=5:5:2 (volume ratio)) solution, 77K, quartz cell, FLUOROLOGII manufactured by SPEX) to determine the $T_1$ level from the beginning of the wavelength on the short wavelength side of the phosphorescence spectrum.

A fixed d.c. voltage was applied to each of the light emitting elements obtained in Examples and Comparative Examples by using Source Measure Unit 2400 manufactured by Toyo Technica, making each element emit light to measure the luminance by using a luminance meter BM-8 manufactured by Topcon and the light emission wavelength and CIE chromaticity coordinate by using a Spectrum Analizer PMA-11 manufactured by Hamamatsu Photonics.

The results of each measurement are shown in Table 1 below.

TABLE 1

| Light emitting Element | Hole transporting material | T₁ (kcal/mol) | Host | T₁ (kcal/mol) | Light emitting material | T₁ (kcal/mol) | Electron transporting material | T₁ (kcal/mol) | Light emission wavelength (nm) | External quantum efficiency (%) |
|---|---|---|---|---|---|---|---|---|---|---|
| Example 1 | α-NPD | 50 | CBP | 66 | K-1 | 63 | B-40 | 66 | 486 | 5.8 |
| Example 2 | α-NPD | 50 | A-10 | 71 | K-1 | 63 | B-40 | 66 | 487 | 14.5 |
| Example 3 | TPD | 58 | CBP | 66 | K-1 | 63 | B-40 | 66 | 486 | 10.9 |
| Example 4 | TPD | 58 | A-10 | 71 | K-1 | 63 | B-40 | 66 | 486 | 16.5 |
| Example 5 | TPD | 58 | D-46 | 69 | K-1 | 63 | B-40 | 66 | 486 | 9.6 |
| Example 6 | TPD | 58 | C-71 | 70 | K-1 | 63 | B-40 | 66 | 487 | 8.9 |
| Example 7 | TPD | 58 | CBP | 66 | K-3 | 64 | B-40 | 66 | 474 | 9.7 |
| Example 8 | TPD | 58 | A-10 | 71 | K-3 | 64 | B-40 | 66 | 473 | 10.0 |
| Example 9 | TPD | 58 | A-10 | 71 | K-1 | 63 | A-19 | 74 | 485 | 19.1 |
| Example 10 | TPD | 58 | A-10 | 71 | K-3 | 64 | A-19 | 74 | 473 | 12.9 |
| Comparative Example 1 | α-NPD | 50 | TPD | 58 | K-1 | 63 | B-40 | 66 | 485 | 0.1 |
| Comparative Example 2 | TPD | 58 | TPD | 58 | K-3 | 64 | B-40 | 66 | — | 0 |

As is clear from the results shown in Table 1, it is found that the light emitting element in which the $T_1$ level of the host material is higher than the $T_1$ level of the light emitting material could emit light with high efficiency. Further, it was also found that when the $T_1$ level of the layer adjacent to the light emitting layer is made higher than the $T_1$ level of the light emitting material, emission of light with higher efficiency becomes possible. Particularly, in a case of the light emitting material which emitted in the blue region, emission with higher efficiency can be attained when the $T_1$ level of the host is higher than 70 kcal/mol (293.3 kJ/mol).

Similarly, also in applying the coating method to produce the light emitting element, the $T_1$ level of the material used to form the layer containing the light emitting material and/or the layer adjacent to the light emitting layer is made higher than the $T_1$ level of the light emitting material. This makes it possible to produce a light emitting element which can emit light with high efficiency. Also, the $T_1$ level of the material used to form the layer containing the light emitting material and/or the layer adjacent to the light emitting layer is made higher than 70 kcal/mol (293.3 kJ/mol) or more. This makes it possible to produce a light emitting element which can emit light with higher efficiency.

Example 11

A washed ITO substrate was placed in an evaporating apparatus and TPD was deposited on the substrate in a thickness of 50 nm. CBP (biscarbazolylbenzidine) and the compound R-1 were co-deposited thereon in a ratio of 1:17 in a thickness of 30 nm. The exemplified compound A-10 and exemplified compound K-3 were further co-deposited thereon in a ratio of 1:17 in a thickness of 2 nm, and the exemplified compound A-19 was still further deposited thereon in a thickness of 36 nm. A patterned mask (the emission area was designed to be 4 mm×5 mm) was placed on the organic thin film to deposit lithium fluoride in a thickness of 3 nm. Thereafter, aluminum was deposited in a thickness of 400 nm to produce a light emitting element.

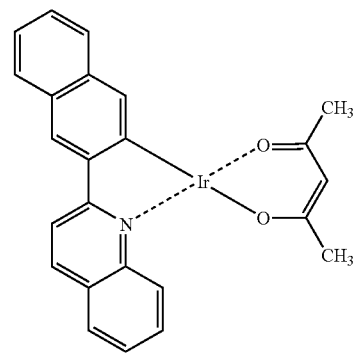

Compound R-1

A fixed d.c. voltage was applied to the light emitting element obtained in Example 11 by using Source Measure Unit 2400 manufactured by Toyo Technica, making each element emit light to measure the illuminance by using a luminance meter BM-8 manufactured by Topcon and the light emission wavelength and CIE chromaticity coordinate by using a Spectrum Analizer PMA-11 manufactured by Hamamatsu Photonics. As a result, white light emission having chromaticity coordinates (x,y)=(0.35, 0.33) was obtained, the maximum luminance was 75000 cd/m² and the external quantum efficiency was 15.4%.

From the results of Example 11, the light emitting element using the compounds of the present invention can emit light with a high efficiency exceeding 15% even in a white light emitting element having conventionally emitted light with lower efficiency, and a light emitting element which can emit light of white having excellent color purity can be produced.

What is claimed is:

1. A light emitting element comprising at least a light emitting layer containing a light emitting material and a host material and having a peak emission maximum wavelength of 500 nm or less measured under a fixed d.c. voltage wherein the minimum excitation triplet energy level of said host material is higher than the minimum excitation triplet energy level of said light emitting material, and wherein the peak emission maximum wavelength of 500 nm or less is derived from a transition from the minimum excitation triplet energy of at least one of the components of the light emitting layer to the ground state of said at least one of the components of the light emitting layer, wherein the peak emission maximum wavelength is the maximum for at least one of the components of the light emitting layer, and wherein the minimum excitation triplet energy level of said host material is from 68 kcal/mol to 90 kcal/mol, and wherein the light emitting material is an orthometallated iridium complex.

2. A light emitting element according to claim 1, further comprising a layer which is disposed adjacent to said light emitting layer and contains an organic material, wherein the minimum excitation triplet energy level of said organic material is higher than the minimum excitation triplet energy level of each of materials which constitute said light emitting layer.

3. A light emitting element according to claim 2, wherein the minimum excitation triplet energy level of said organic material contained in the layer which is disposed adjacent to the light emitting layer is from 1.05 times to 1.38 times the minimum excitation triplet energy level of each of the materials which constitute said light emitting layer.

4. A light emitting element according to claim 2, wherein the minimum excitation triplet energy level of said organic material contained in the layer which is disposed adjacent to the light emitting layer is from 68 kcal/mol to 90 kcal/mol.

5. A light emitting element according to claim 2, wherein said organic material contained in the layer which is disposed adjacent to said light emitting layer is a compound represented by the following formula (II):

$$L^2\text{-}(Q^2)n^2 \qquad \text{Formula (II)}$$

wherein $L^2$ represents a bivalent or more linking group; $Q^2$ represents an aromatic hydrocarbon ring or an aromatic hetero ring; and $n^2$ represents a number of 2 or more, plural $Q^2$ may be the same or may be different from each other.

6. A light emitting element according to claim 2, wherein the layer adjacent to the light emitting layer is selected from the group consisting of a hole injecting layer, a hole transporting layer, an electron injecting layer, an electron transporting layer, a hole blocking layer, and an electron blocking layer.

7. A light emitting element according to claim 1, wherein said host material is a compound represented by the following formula (I):

$$L^1\text{-}(Q^1)n^1 \qquad \text{Formula (I)}$$

wherein $L^1$ represents a bivalent or more linking group; $Q^1$ represents an aromatic hydrocarbon ring or an aromatic hetero ring; and $n^1$ represents a number of 2 or more, plural $Q^1$ may be the same or may be different from each other.

8. A light emitting element according to claim 1, wherein the light emitting layer is held between a pair of electrodes.

9. A light emitting element according to claim 1, wherein the peak emission maximum wavelength λmax is measured under a fixed d.c. voltage is from 390 to 495 nm.

10. The light emitting element according to claim 1, wherein the light emitting layer comprises 0.1% by weight to 20% by weight of the light emitting material with respect to a weight of the host material.

11. A light emitting element according to claim 1, wherein the light emitting layer has a thickness from 1 nm to 5 μm.

12. A light emitting element according to claim 1, wherein the host material includes a structure selected from the group consisting of a carbazole, a diarylamine, a pyridine, a pyrazine, a triazine and an arylsilane.

13. A light emitting element according to claim 1, wherein the light emitting layer comprising the host material doped with the light emitting material is formed by vapor codeposition.

14. A light emitting element according to claim 1, wherein the light emitting layer is formed by a method selected from the group consisting of a resistance heating vapor deposition method, an electron beam method, a sputtering method, a molecular accumulation method, a coating method, an ink-jet method, a printing method and an LB method.

15. A light emitting element comprising at least a light emitting layer containing a light emitting material and a host material and having a peak emission maximum wavelength of 500 nm or less measured under a fixed d.c. voltage wherein the minimum excitation triplet energy level of said host material is higher than the minimum excitation triplet energy level of said light emitting material, and wherein the peak emission maximum wavelength of 500 nm or less is derived from a transition from the minimum excitation triplet energy of at least one of the components of the light emitting layer to the ground state of said at least one of the components of the light emitting layer, wherein the peak emission maximum wavelength is the maximum for at least one of the components of the light emitting layer, and wherein the minimum excitation triplet energy level of said host material is from 68 kcal/mol to 90 kcal/mol, and, wherein an external quantum efficiency of the light emitting element measured under a fixed d.c. voltage is 5% to about 20%.

16. A light emitting element according to claim 15, further comprising a layer which is disposed adjacent to said light emitting layer and contains an organic material, wherein the minimum excitation triplet energy level of said organic material is higher than the minimum excitation triplet energy level of each of materials which constitute said light emitting layer.

17. A light emitting element according to claim 16, wherein the minimum excitation triplet energy level of said organic material contained in the layer which is disposed adjacent to the light emitting layer is from 1.05 times to 1.38 times the minimum excitation triplet energy level of each of the materials which constitute said light emitting layer.

18. A light emitting element according to claim 16, wherein the minimum excitation triplet energy level of said organic material contained in the layer which is disposed adjacent to the light emitting layer is from 68 kcal/mol to 90 kcal/mol.

19. A light emitting element according to claim 16, wherein said organic material contained in the layer which is disposed adjacent to said light emitting layer is a compound represented by the following formula (II):

$$L^2\text{-}(Q^2)n^2 \qquad \text{Formula (II)}$$

wherein $L^2$ represents a bivalent or more linking group; $Q^2$ represents an aromatic hydrocarbon ring or an aromatic hetero ring; and $n^2$ represents a number of 2 or more, plural $Q^2$ may be the same or may be different from each other.

20. A light emitting element according to claim 15, wherein said host material is a compound represented by the following formula (I):

$$L^1\text{-}(Q^1)n^1 \qquad \text{Formula (I)}$$

wherein $L^1$ represents a bivalent or more linking group; $Q^1$ represents an aromatic hydrocarbon ring or an aromatic hetero ring; and $n^1$ represents a number of 2 or more, plural $Q^1$ may be the same or may be different from each other.

21. A light emitting element according to claim 15, wherein the light emitting layer is held between a pair of electrodes.

22. A light emitting element according to claim 15, wherein the peak emission maximum wavelength λmax measured under a fixed d.c. voltage is from 390 to 495 nm.

23. A light emitting element comprising at least a light emitting layer containing a light emitting material and a host material and having a peak emission maximum wavelength of 500 nm or less measured under a fixed d.c. voltage wherein the minimum excitation triplet energy level of said host material is higher than the minimum excitation triplet energy level of said light emitting material, and wherein the peak emission maximum wavelength of 500 nm or less is derived from a transition from the minimum excitation triplet energy of at least one of the components of the light emitting layer to the ground state of said at least one of the components of the light emitting layer, wherein the peak emission maximum wavelength is the maximum for at least one of the components of the light emitting layer, and wherein the light emitting material is an orthometallated iridium complex.

24. A light emitting element according to claim 23, further comprising a layer which is disposed adjacent to said light emitting layer and contains an organic material, wherein the minimum excitation triplet energy level of said organic material is higher than the minimum excitation triplet energy level of each of materials which constitute said light emitting layer.

25. A light emitting element according to claim 24, wherein the minimum excitation triplet energy level of said organic material contained in the layer which is disposed adjacent to the light emitting layer is from 1.05 times to 1.38 times the minimum excitation triplet energy level of each of the materials which constitute said light emitting layer.

26. A light emitting element according to claim 24, wherein the minimum excitation triplet energy level of said organic material contained in the layer which is disposed adjacent to the light emitting layer is from 68 kcal/mol to 90 kcal/mol.

27. A light emitting element according to claim 24, wherein said organic material contained in the layer which is disposed adjacent to said light emitting layer is a compound represented by the following formula (II):

$$L^2\text{-}(Q^2)n^2 \qquad \text{Formula (II)}$$

wherein $L^2$ represents a bivalent or more linking group; $Q^2$ represents an aromatic hydrocarbon ring or an aromatic hetero ring; and $n^2$ represents a number of 2 or more, plural $Q^2$ may be the same or may be different from each other.

28. A light emitting element according to claim 24, wherein the layer adjacent to the light emitting layer is selected from the group consisting of a hole injecting layer, a hole transporting layer, an electron injecting layer, an electron transporting layer, a hole blocking layer, and an electron blocking layer.

29. A light emitting element according to claim 23, wherein said host material is a compound represented by the following formula (I):

$$L^1\text{-}(Q^2)n^1 \qquad \text{Formula (I)}$$

wherein $L^1$ represents a bivalent or more linking group; $Q^1$ represents an aromatic hydrocarbon ring or an aromatic hetero ring; and $n^1$ represents a number of 2 or more, plural $Q^1$ may be the same or may be different from each other.

30. A light emitting element according to claim 23, wherein the light emitting layer is held between a pair of electrodes.

31. A light emitting element according to claim 23, wherein the peak emission maximum wavelength λmax measured under a fixed d.c. voltage is from 390 to 495 nm.

32. A light emitting element according to claim 23, wherein the light emitting layer comprises 0.1% by weight to 20% by weight of the light emitting material with respect to a weight of the host material.

33. A light emitting element according to claim 23, wherein the light emitting layer has a thickness from 1 nm to 5 μm.

34. A light emitting element according to claim 23, wherein the host material includes a structure selected from the group consisting of a carbazole, a diarylamine, a pyridine, a pyrazine, a triazine and an arylsilane.

35. A light emitting element according to claim 23, wherein the light emitting layer comprising the host material doped with the light emitting material is formed by vapor codeposition.

36. A light emitting element according to claim 23, wherein the light emitting layer is formed by a method selected from the group consisting of a resistance heating vapor deposition method, an electron beam method, a sputtering method, a molecular accumulation method, a coating method, an ink-jet method, a printing method and an LB method.

37. A light emitting element comprising at least a light emitting layer containing a light emitting material and a host material and having a peak emission maximum wavelength of 500 nm or less measured under a fixed d.c. voltage wherein the minimum excitation triplet energy level of said host material is higher than the minimum excitation triplet energy level of said light emitting material, and wherein the peak emission maximum wavelength of 500 nm or less is derived from a transition from the minimum excitation triplet energy of at least one of the components of the light emitting layer to the ground state of said at least one of the components of the light emitting layer, wherein the peak emission maximum wavelength is the maximum for at least one of the components of the light emitting layer, and wherein the light emitting material is selected from the group consisting of an iridium complex, an osmium complex, and a platinum complex, wherein an external quantum efficiency of the light emitting element measured under a fixed d.c. voltage is 5% to about 20%.

38. A light emitting element according to claim 37, further comprising a layer which is disposed adjacent to said light emitting layer and contains an organic material, wherein the minimum excitation triplet energy level of said organic material is higher than the minimum excitation triplet energy level of each of materials which constitute said light emitting layer.

39. A light emitting element according to claim 38, wherein the minimum excitation triplet energy level of said organic material contained in the layer which is disposed adjacent to the light emitting layer is from 1.05 times to 1.38 times the minimum excitation triplet energy level of each of the materials which constitute said light emitting layer.

40. A light emitting element according to claim 38, wherein the minimum excitation triplet energy level of said organic material contained in the layer which is disposed adjacent to the light emitting layer is from 68 kcal/mol to 90 kcal/mol.

41. A light emitting element according to claim 38, wherein said organic material contained in the layer which is disposed adjacent to said light emitting layer is a compound represented by the following formula (II):

$$L^2\text{-}(Q^2)n^2 \qquad \text{Formula (II)}$$

wherein $L^2$ represents a bivalent or more linking group; $Q^2$ represents an aromatic hydrocarbon ring or an aromatic hetero ring; and $n^2$ represents a number of 2 or more, plural $Q^2$ may be the same or may be different from each other.

42. A light emitting element according to claim 38, wherein the layer adjacent to the light emitting layer is selected from the group consisting of a hole injecting layer, a hole transporting layer, an electron injecting layer, an electron transporting layer, a hole blocking layer, and an electron blocking layer.

43. A light emitting element according to claim 36, wherein said host material is a compound represented by the following formula (I):

$$L^1\text{-}(Q^2)n^1 \qquad \text{Formula (I)}$$

wherein $L^1$ represents a bivalent or more linking group; $Q^1$ represents an aromatic hydrocarbon ring or an aromatic hetero ring; and $n^1$ represents a number of 2 or more, plural $Q^1$ may be the same or may be different from each other.

44. A light emitting element according to claim 37, wherein the light emitting layer is held between a pair of electrodes.

45. A light emitting element according to claim 37, wherein the peak emission maximum wavelength λmax measured under a fixed d.c. voltage is from 390 to 495 nm.

46. The light emitting element according to claim 37, wherein the light emitting layer comprises 0.1% by weight to 20% by weight of the light emitting material with respect to a weight of the host material.

47. A light emitting element according to claim 37, wherein the light emitting layer has a thickness from 1 nm to 5 μm.

48. A light emitting element according to claim 37, wherein the light emitting material is an orthometallated iridium complex.

49. A light emitting element according to claim 37, wherein the host material includes a structure selected from the group consisting of a carbazole, a diarylamine, a pyridine, a pyrazine, a triazine and an arylsilane.

50. A light emitting element according to claim 37, wherein the light emitting layer comprising the host material doped with the light emitting material is formed by vapor codeposition.

51. A light emitting element according to claim 37, wherein the light emitting layer is formed by a method selected from the group consisting of a resistance heating vapor deposition method, an electron beam method, a sputtering method, a molecular accumulation method, a coating method, an ink-jet method, a printing method and an LB method.

52. A light emitting element according to claim 37, wherein the minimum excitation triplet energy level of said host material is from 68 kcal/mol to 90 kcal/mol.

* * * * *